(12) United States Patent
Sakabe et al.

(10) Patent No.: US 9,130,379 B2
(45) Date of Patent: Sep. 8, 2015

(54) INTEGRATED CIRCUIT FOR CONTROLLING BATTERY CELL AND VEHICLE POWER SUPPLY SYSTEM

(75) Inventors: Kei Sakabe, Hitachi (JP); Akihiko Emori, Hitachi (JP); Akihiko Kudo, Hitachinaka (JP); Kenji Kubo, Hitachi (JP); Youhei Kawahara, Hitachi (JP); Mutsumi Kikuchi, Mito (JP); Tatsumi Yamauchi, Hitachiota (JP)

(73) Assignees: Hitachi, Ltd., Tokyo (JP); Hitachi Automotive Systems, Ltd., Hitachinaka-shi (JP)

( * ) Notice: Subject to any disclaimer, the term of this patent is extended or adjusted under 35 U.S.C. 154(b) by 1000 days.

(21) Appl. No.: 12/238,122

(22) Filed: Sep. 25, 2008

(65) Prior Publication Data

US 2009/0087722 A1 Apr. 2, 2009

(30) Foreign Application Priority Data

Sep. 28, 2007 (JP) .................. 2007-253668

(51) Int. Cl.
*H01M 2/34* (2006.01)
*H01M 10/48* (2006.01)
(Continued)

(52) U.S. Cl.
CPC ............ *H02J 7/0021* (2013.01); *B60L 3/0046* (2013.01); *B60L 11/1861* (2013.01); *B60L 11/1866* (2013.01); *B60L 11/1879* (2013.01); *H02J 7/0022* (2013.01); *B60L 2240/545* (2013.01); *B60L 2240/547* (2013.01);
(Continued)

(58) Field of Classification Search
CPC ....... H01M 2/34; H01M 10/48; H02J 7/0047; G01R 19/16542; G01R 31/3658
USPC ..................... 429/96–347, 61; 320/116–165; 324/429, 433, 434
See application file for complete search history.

(56) References Cited

U.S. PATENT DOCUMENTS 5,705,914 A 1/1998 Morita
6,499,114 B1 12/2002 Almstead et al.
(Continued)

FOREIGN PATENT DOCUMENTS

JP 5-101228 A 4/1993
JP 9-159701 A 6/1997
(Continued)

OTHER PUBLICATIONS

Chinese Office Action dated Jan. 19, 2011 with English translation (twenty (20) pages).
(Continued)

*Primary Examiner* — Kenneth Douyette
*Assistant Examiner* — James Lee
(74) *Attorney, Agent, or Firm* — Crowell & Moring LLP

(57) ABSTRACT

A vehicle power supply system comprises a battery module that includes a plurality of battery cells, battery cell control devices and a signal transmission path through which signals are transmitted. The battery cell control devices comprises a voltage measurement circuit that measures terminal voltages at the battery cells, an abnormality diagnosis circuit that diagnoses an abnormality in the battery cell control device, a timing control circuit that outputs a signal for instructing measurement phase and a signal for instructing diagnosis phase, and a communication circuit that outputs a signal indicating the terminal voltage and a signal based upon a diagnosis result by the abnormality diagnosis circuit.

36 Claims, 29 Drawing Sheets

(51) Int. Cl.
*H02J 7/00* (2006.01)
*B60L 3/00* (2006.01)
*B60L 11/18* (2006.01)
*G01R 31/36* (2006.01)
*G01R 35/00* (2006.01)

(52) U.S. Cl.
CPC ........ *B60L 2240/549* (2013.01); *G01R 31/362* (2013.01); *G01R 31/3648* (2013.01); *G01R 31/3658* (2013.01); *G01R 35/00* (2013.01); *Y02T 10/7005* (2013.01); *Y02T 10/7011* (2013.01); *Y02T 10/7044* (2013.01); *Y02T 10/7055* (2013.01); *Y02T 10/7061* (2013.01); *Y02T 90/16* (2013.01)

(56) References Cited

U.S. PATENT DOCUMENTS

| | | | |
|---|---|---|---|
| 7,301,296 | B1 | 11/2007 | Discenzo |
| 2002/0017895 | A1 | 2/2002 | Kawashima |
| 2003/0015995 | A1 | 1/2003 | Tamura et al. |
| 2003/0044689 | A1* | 3/2003 | Miyazaki et al. ............ 429/320 |
| 2003/0058667 | A1* | 3/2003 | Suzuki et al. ................ 363/59 |
| 2005/0242667 | A1 | 11/2005 | Emori et al. |
| 2005/0242776 | A1 | 11/2005 | Emori et al. |
| 2006/0082343 | A1* | 4/2006 | Sobue et al. ................. 320/119 |
| 2006/0103351 | A1 | 5/2006 | Tanigawa et al. |
| 2006/0208693 | A1* | 9/2006 | Emori et al. ................. 320/106 |
| 2007/0120530 | A1* | 5/2007 | Nozaki ........................ 320/130 |
| 2009/0039830 | A1 | 2/2009 | Pellenc |
| 2009/0087722 | A1 | 4/2009 | Sakabe et al. |
| 2009/0224769 | A1 | 9/2009 | Emori et al. |
| 2009/0237033 | A1* | 9/2009 | Kanzaki et al. ............. 320/134 |

FOREIGN PATENT DOCUMENTS

| | | | | |
|---|---|---|---|---|
| JP | 11-183532 | A | 7/1999 | |
| JP | 2000-166117 | A | 6/2000 | |
| JP | 2001-178008 | A | 6/2001 | |
| JP | 2002-199510 | A | 7/2002 | |
| JP | 2002-281681 | A | 9/2002 | |
| JP | 2003-32907 | A | 1/2003 | |
| JP | 2003-84015 | A | 3/2003 | |
| JP | 2003-92840 | A | 3/2003 | |
| JP | 2003-304646 | A | 10/2003 | |
| JP | 2003-346916 | A | 12/2003 | |
| JP | 2005-318750 | A | 11/2005 | |
| JP | 2005-318751 | A | 11/2005 | |
| JP | 2006-64639 | A | 3/2006 | |
| JP | 2006-149068 | A | 6/2006 | |
| JP | 2006-292516 | A | 10/2006 | |
| JP | 2007-513594 | A | 5/2007 | |
| JP | WO 2007/139102 | A1 * | 6/2007 | ........... H02J 7/00 |
| JP | 5250230 | B2 | 7/2013 | |

OTHER PUBLICATIONS

European Office Action dated Aug. 31, 2011 (Five (5) pages).
Extended European Search Report dated Feb. 27, 2012 (ten (10) pages).
Japanese Office Action with English Translation dated Jan. 15, 2013 (seven (7) pages).
Japanese Office Action dated Oct. 2, 2012 including English-language translation (Seven (7) pages).
Japanese Office Action dated Apr. 1, 2014, with English translation (seven (7) pages).
Japanese Office Action dated Jun. 9, 2015 (three (3) pages).

* cited by examiner

FIG. 30

INTEGRATED CIRCUIT FOR CONTROLLING BATTERY CELL AND VEHICLE POWER SUPPLY SYSTEM

INCORPORATION BY REFERENCE

The disclosure of the following priority application is herein incorporated by reference:
Japanese Patent Application No. 2007-253668 filed Sep. 28, 2007

BACKGROUND OF THE INVENTION

1. Field of the Invention

The present invention relates to an integrated circuit for controlling battery cell and a vehicle power supply system that uses the integrated circuit.

2. Description of Related Art

There are vehicle power supply systems known in the related art that include an inverter connected to a rotating electrical machine and a multi-series battery control system.

A drive system for a vehicle rotating electrical machine is provided with a secondary battery for supplying DC power and an inverter device that converts the DC power supplied from the secondary battery to three-phase AC power. The three-phase AC power is supplied to the rotating electrical machine installed in the vehicle. A three-phase AC rotating electrical machine generally includes a function as an electric motor and a function as a power generator. If a three-phase AC rotating electrical machine is operated as a power generator such as in regenerative braking operation, the three-phase AC power generated by the rotating electrical machine is converted to DC power by the inverter device. The DC power is supplied to the secondary battery. The generated power is stored in the secondary battery.

A lithium battery module is suitable for a secondary battery because a large amount of power can be stored in a small-sized module. A lithium battery module includes numerous serially connected lithium battery cells. It is desirable to individually detect the state of charge of each of the lithium battery cells and to manage it so as not to be in an over-charged state. It is to be noted that the state of charge will be abbreviated as the SOC below. It is desirable to manage charge/discharge of each of the lithium battery cells, for instance, so as not to be in an over-discharged state: Keeping an over-discharged state may cause excessive heat.

There is a vehicle power supply system including a lithium battery disclosed in, for instance, Japanese Laid Open Patent Publication No. 2005-318751.

The terminal voltage of each of the lithium battery cells is detected so as to prevent each of the lithium battery cells from being over-charged. Thus, each of the lithium battery cells is monitored. Since a vehicle power supply may be used for long periods under conditions with constant vibrations and severe temperature changes, it is desired to pay sufficient attention to reliability.

SUMMARY OF THE INVENTION

An object of the present invention is to provide a vehicle power supply system assuring a high level of reliability.

The object described above is achieved in the present invention by providing a vehicle power supply system comprising a battery module that is constituted with a plurality of serially connected battery cell groups each include a plurality of serially connected battery cells, a plurality of battery cell control devices each disposed in correspondence to the plurality of battery cell groups, and a signal transmission path through which signals that are input to or output from the plurality of battery cell control devices are transmitted. Each of the plurality of battery cell control devices comprises a voltage measurement circuit that measures terminal voltages at the individual battery cells in the corresponding battery cell group, an abnormality diagnosis circuit that diagnoses an abnormality in the battery cell control device, a timing control circuit that outputs a signal for instructing measurement phase during which the terminal voltage is measured, and, in synchronization with output of the measurement phase instruction signal, outputs a signal for instructing diagnosis phase during which diagnosis is executed by the abnormality diagnosis circuit, and a communication circuit that outputs a signal indicating the terminal voltage measured by the voltage measurement circuit and a signal based upon a diagnosis result by the abnormality diagnosis circuit, to the signal transmission path. The abnormality diagnosis circuit diagnoses an abnormality in the battery cell control device in synchronization with the terminal voltage measurement based upon the diagnosis phase instruction signal. As a result, reliability of the integrated circuits is improved, and accordingly, reliability of the vehicle power supply system is improved.

Another vehicle power supply system according to the present invention comprises a battery module that is constituted with a plurality of serially connected battery cell groups each include a plurality of serially connected battery cells, a plurality of battery cell control devices each disposed in correspondence to the plurality of battery cell groups, and a signal transmission path through which signals that are input to or output from the plurality of battery cell control devices are transmitted. Each of the plurality of battery cell control devices comprises a voltage measurement circuit that measures terminal voltages at the individual battery cells in the corresponding battery cell group, a comparator circuit that compares a terminal voltage value output from the voltage measurement circuit with a voltage threshold value used for diagnosis of over-charge/over-discharge of the battery cells, a diagnosis result output circuit that outputs a signal indicating diagnosis result corresponding to the over-charge/over-discharge if a diagnosis result based upon a comparison result by the comparator circuit indicates the over-charge/over-discharge, a comparison value generating circuit that generates a comparison value which is used for an abnormality diagnosis in the battery cell control device and which is in a known magnitude relationship to a predetermined input value that is input to the comparator circuit, and a communication circuit that outputs a signal indicating the terminal voltage measured by the voltage measurement circuit and an abnormality signal based upon the diagnosis result signal to the signal transmission path. Each of the plurality of battery cell control devices compares an input value that is input to the comparator circuit with the comparison value via the comparator circuit, and, if the comparison result is different from the known magnitude relationship, judges that an abnormality has occurred in the battery cell control device and outputs the diagnosis result signal corresponding to the abnormality in the battery cell control device from the diagnosis result output circuit.

Another vehicle power supply system according to the present invention comprises a battery module that is constituted with a plurality of serially connected battery cell groups each include a plurality of serially connected battery cells, a plurality of battery cell control devices each disposed in correspondence to the plurality of battery cell groups, and a signal transmission path through which signals that are input to or output from the plurality of battery cell control devices are transmitted. Each of the plurality of battery cell control devices comprises a voltage measurement circuit that measures terminal voltages at the individual battery cells in the corresponding battery cell group, a comparator circuit that compares a terminal voltage value output from the voltage measurement circuit with a voltage threshold value used for diagnosis of over-charge/over-discharge of the battery cells, a diagnosis result output circuit that outputs a diagnosis result signal corresponding to the over-charge/over-discharge if a diagnosis result based upon a comparison result by the comparator circuit indicates the over-charge/over-discharge, a comparison value generating circuit that generates a comparison value which is used for an abnormality diagnosis in the battery cell control device and which is in a known magnitude relationship to a predetermined input value that is input to the comparator circuit, a communication circuit that outputs a signal indicating the terminal voltage measured by the voltage measurement circuit and an abnormality signal based upon the diagnosis result signal to the signal transmission path, and a timing control circuit that outputs a signal for instructing measurement phase during which the terminal voltage is measured, and, in synchronization with output of the measurement phase instruction signal, outputs a signal for instructing diagnosis phase during which an abnormality diagnosis is executed in the battery cell control device. Each of the plurality of battery cell control devices executes a first diagnosis for diagnosing an abnormality in the battery cell control device in synchronization with the terminal voltage measurement based upon the diagnosis phase instruction signal and a second diagnosis for diagnosing an abnormality in the battery cell control device based upon whether or not a comparison result of an input value that is input to the comparator circuit with the comparison value via the comparator circuit is different from the known magnitude relationship, and, if there is an abnormality in the battery cell control device, outputs the diagnosis result signal corresponding to the abnormality in the battery cell control device from the diagnosis result output circuit and outputs the abnormality signal based upon the output diagnosis result signal from the communication circuit to the signal transmission path.

Another vehicle power supply system according to the present invention comprises a lithium battery module that is constituted with a plurality of serially connected lithium battery groups each include a plurality of serially connected lithium battery cells, a plurality of integrated circuits each disposed in correspondence to the plurality of lithium battery groups, and a signal transmission path through which signals that are input to or output from the plurality of integrated circuits are transmitted. Each of the plurality of integrated circuits comprises a selection circuit that selects a terminal voltage of measurement target from terminal voltages at individual lithium battery cells in a corresponding lithium battery group, an analog/digital converter that converts the terminal voltage having been output from the selection circuit from an analog value to a digital value, a digital comparator circuit that compares the digital value indicating the terminal voltage that has been output from the analog/digital converter with a voltage threshold value used for diagnosis of over-charge/over-discharge, a communication circuit that transmits a signal indicating an abnormality through the signal transmission path based upon a comparison result by the digital comparator circuit, a voltage generating circuit that generates a predetermined voltage, and a digital generating circuit that generates a digital value which is in a known magnitude relationship to the predetermined voltage. Each of the plurality of integrated circuits selects the predetermined voltage generated by the voltage generating circuit via the selection circuit, converts the predetermined voltage from an analog value to a digital value via the analog/digital converter, compares the digital value that has been output from the analog/digital converter with the digital value that has been output from the digital generating circuit via the digital comparator circuit, and, if the comparison result is different from the known magnitude relationship, transmits the abnormality signal from the communication circuit to the signal transmission path.

Another vehicle power supply system according to the present invention comprises a lithium battery module that is constituted with a plurality of serially connected lithium battery groups each include a plurality of serially connected lithium battery cells, a plurality of integrated circuits each of which is disposed in correspondence to the plurality of lithium battery groups and in each of which a plurality of circuits are integrated including a selection circuit, an analog/digital converter, a communication circuit, a diagnosis circuit, and a voltage generating circuit, and a signal transmission path through which signals that are input to or output from the plurality of integrated circuits are transmitted. Each of the plurality of integrated circuits selects via the selection circuit a terminal voltage from terminal voltages input from individual lithium battery cells in a corresponding lithium battery group, converts an analog value of the selected terminal voltage to a digital value via the analog/digital converter, and transmits the converted digital value of the terminal voltage from the communication circuit to the signal transmission path. Furthermore, each of the plurality of integrated circuits selects via the selection circuit a predetermined voltage output from the voltage generating circuit, converts an analog value of the selected predetermined voltage to a digital value via the analog/digital converter, diagnoses whether or not an abnormality has occurred in the integrated circuits via the diagnosis circuit based upon the converted digital value of the predetermined voltage, and, if the diagnosis result indicates an abnormal state, transmits a signal indicating an abnormality from the communication circuit to the signal transmission path.

Another vehicle power supply system according to the present invention comprises a lithium battery module that is constituted with a plurality of serially connected lithium battery groups each include a plurality of serially connected lithium battery cells, a plurality of integrated circuits each of which is disposed in correspondence to the plurality of lithium battery groups and in each of which a plurality of circuits are integrated including a selection circuit, an analog/digital converter, a serial communication circuit, a one-bit communication circuit, a diagnosis circuit, and a voltage generating circuit, and a plurality of signal transmission paths through which signals that are input to or output from the plurality of integrated circuits are transmitted. Each of the plurality of integrated circuits selects via the selection circuit a terminal voltage from terminal voltages input from individual lithium battery cells in a corresponding lithium battery group, converts an analog value of the selected terminal voltage to a digital value via the analog/digital converter, and transmits the converted digital value of the terminal voltage from the serial communication circuit to one of the signal transmission paths. Furthermore, each of the plurality of integrated circuits selects via the selection circuit a predetermined voltage output from the voltage generating circuit, converts an analog value of the selected predetermined voltage to a digital value via the analog/digital converter, diagnoses whether or not an abnormality has occurred in the integrated circuits via the diagnosis circuit based upon the converted digital value of the predetermined voltage, and, if the diagnosis result indicates an abnormal state, transmits a one-bit signal indicating an abnormality from the one-bit communication circuit to another one of the signal transmission paths.

Another vehicle power supply system according to the present invention comprises a lithium battery module that is constituted with a plurality of serially connected lithium battery groups each include a plurality of serially connected lithium battery cells, a plurality of integrated circuits each disposed in correspondence to the plurality of lithium battery groups, and a plurality of signal transmission paths through which signals that are input to or output from the plurality of integrated circuits are transmitted. Each of the plurality of integrated circuits comprises a selection circuit that selects a terminal voltage of measurement target from terminal voltages at individual lithium battery cells in a corresponding lithium battery group, an analog/digital converter that converts the terminal voltage having been output from the selection circuit from an analog value to a digital value, a digital comparator circuit that compares the digital value indicating the terminal voltage that has been output from the analog/digital converter with a voltage threshold value used for diagnosis of over-charge/over-discharge, a communication circuit that transmits the digital value of the terminal voltage and a signal indicating an abnormality, a voltage generating circuit that generates a predetermined voltage, and a digital generating circuit that generates a digital value which is in a known magnitude relationship to the predetermined voltage. The communication circuit includes a serial transmission terminal and a one-bit signal transmission terminal. The serial transmission terminals are serially connected by electrically connecting a transmission side of a serial transmission terminal at one of the serially connected integrated circuits to a reception side of a serial transmission terminal at another one of the serially connected integrated circuits through one of the signal transmission paths. The one-bit signal transmission terminals are serially connected by electrically connecting a transmission side of a one-bit signal transmission terminal at one of the serially connected integrated circuits to a reception side of a one-bit signal transmission terminal at another one of the serially connected integrated circuits through another one of the signal transmission paths. Each of the plurality of integrated circuits selects a predetermined voltage generated by the voltage generating circuit via the selection circuit, converts an analog value of the predetermined voltage to a digital value via the analog/digital converter, compares the digital value that has been output from the analog/digital converter with the digital value that has been output from the digital generating circuit via the digital comparator circuit, and, if the comparison result is different from the known magnitude relationship, transmits the abnormality signal from the communication circuit to another one of the signal transmission paths via the one-bit signal transmission terminal. The abnormality signal transmitted from one of the plurality of integrated circuits is transmitted to another integrated circuit via the signal transmission path and input to the integrated circuit via a reception side of a one-bit signal transmission terminal of the integrated circuit.

An integrated circuit for controlling battery cell according to the present invention that is an integrated circuit electrically connected to a plurality of battery cells serially connected and disposed to measure terminal voltages at the individual battery cells comprises a plurality of voltage receiving terminals through which terminal voltages at the individual battery cells are taken in, a voltage measurement circuit that measures terminal voltages at the individual battery cells taken in through the plurality of voltage receiving terminals, a timing control circuit that outputs a signal for instructing measurement phase during which the terminal voltage is measured and, in synchronization with output of the measurement phase instruction signal, outputs a signal for instructing diagnosis phase during which an abnormality diagnosis is executed, an abnormality diagnosis circuit that diagnoses an abnormality in the integrated circuit in synchronization with the terminal voltage measurement based upon the diagnosis phase instruction signal, a communication circuit that transmits a signal indicating the terminal voltage measured by the voltage measurement circuit and a signal based upon a diagnosis result by the abnormality diagnosis circuit, and a signal terminal that is electrically connected to the communication circuit so as to transmit/receive a signal.

Another integrated circuit for controlling battery cell according to the present invention that is an integrated circuit electrically connected to a plurality of battery cells serially connected and disposed to measure terminal voltages at the individual battery cells comprises a plurality of voltage receiving terminals through which terminal voltages at the individual battery cells are taken in, a voltage measurement circuit that measures terminal voltages at the individual battery cells taken in through the plurality of voltage receiving terminals, a comparator circuit that compares a terminal voltage value output from the voltage measurement circuit with a voltage threshold value used for diagnosis of over-charge/over-discharge of the battery cells, a diagnosis result output circuit that outputs a signal indicating diagnosis result corresponding to the over-charge/over-discharge if a diagnosis result based upon a comparison result by the comparator circuit indicates the over-charge/over-discharge, a comparison value generating circuit that generates a comparison value which is used for abnormality diagnosis in integrated circuits and which is in a known magnitude relationship to a predetermined input value that is input to the comparator circuit, a communication circuit that outputs a signal indicating the terminal voltage measured by the voltage measurement circuit and an abnormality signal based upon the diagnosis result signal, and a signal terminal that is electrically connected to the communication circuit so as to transmit/receive a signal. The integrated circuit for controlling battery cell compares an input value that is input to the comparator circuit with the comparison value via the comparator circuit, and, if the comparison result is different from the known magnitude relationship, judges that an abnormality has occurred in the integrated circuit and outputs the diagnosis result signal corresponding to the abnormality in the integrated circuit from the diagnosis result output circuit.

Another integrated circuit for controlling battery cell according to the present invention that is an integrated circuit electrically connected to a plurality of battery cells serially connected and disposed to measure terminal voltages at the individual battery cells comprises a plurality of voltage receiving terminals through which terminal voltages at the individual battery cells are taken in, a voltage measurement circuit that measures terminal voltages at the individual battery cells taken in through the plurality of voltage receiving terminals, a comparator circuit that compares a terminal voltage value output from the voltage measurement circuit with a voltage threshold value used for diagnosis of over-charge/over-discharge of the battery cells, a diagnosis result output circuit that outputs a signal indicating diagnosis result corresponding to the over-charge/over-discharge if a diagnosis result based upon a comparison result by the comparator circuit indicates the over-charge/over-discharge, a comparison value generating circuit that generates a comparison value which is used for an abnormality diagnosis in the integrated circuits and which is in a known magnitude relationship to a predetermined input value that is input to the comparator circuit, a communication circuit that outputs a signal indicating the terminal voltage measured by the voltage measurement circuit and an abnormality signal based upon the diagnosis result signal to the signal transmission path, a timing control circuit that outputs a signal for instructing measurement phase during which the terminal voltage is measured, and, in synchronization with output of the measurement phase instruction signal, outputs a signal for instructing diagnosis phase during which an abnormality diagnosis is executed in integrated circuits, and a signal terminal that is electrically connected to the communication circuit so as to transmit/receive a signal. The integrated circuit for controlling battery cell executes a first diagnosis for diagnosing an abnormality in the integrated circuit in synchronization with measurement of the terminal voltage based upon the diagnosis phase instruction signal and a second diagnosis for diagnosing an abnormality in the integrated circuit based upon whether or not a comparison result of an input value that is input to the comparator circuit with the comparison value via the comparator circuit is different from the known magnitude relationship, and, if there is an abnormality in the integrated circuit, outputs the diagnosis result signal corresponding to the abnormality in the integrated circuit from the diagnosis result output circuit and outputs the abnormality signal based upon the output diagnosis result signal from the communication circuit through the transmission terminal.

Another integrated circuit for controlling battery cell according to the present invention that is an integrated circuit electrically connected to a plurality of lithium battery cells serially connected and disposed to measure terminal voltages at the individual lithium battery cells comprises a plurality of voltage receiving terminals, a signal transmission/reception terminal, a selection circuit, an analog/digital converter, a communication circuit, a diagnosis circuit, and a voltage generating circuit. The integrated circuit for controlling battery cell is configured to select via the selection circuit a terminal voltage from terminal voltages input from the individual lithium battery cells via the plurality of voltage receiving terminals, to convert an analog value of the selected terminal voltage to a digital value via the analog/digital converter, and to transmit the converted digital value of the terminal voltage from the communication circuit via the signal transmission terminal. In addition, the integrated circuit for controlling battery cell selects via the selection circuit a predetermined voltage output from the voltage generating circuit, converts an analog value of the selected predetermined voltage to a digital value via the analog/digital converter, diagnoses whether or not an abnormality has occurred in the integrated circuit via the diagnosis circuit based upon the converted digital value of the predetermined voltage, and, if the diagnosis result indicates an abnormal state, transmits a signal indicating an abnormality from the communication circuit via the signal transmission terminal.

Another integrated circuit for controlling battery cell according to the present invention that is an integrated circuit electrically connected to a plurality of lithium battery cells serially connected and disposed to measure terminal voltages at the individual lithium battery cells comprises a plurality of voltage receiving terminals, a plurality of signal transmission/reception terminals, a selection circuit, an analog/digital converter, a serial communication circuit, a one-bit communication circuit, a diagnosis circuit, and a voltage generating circuit. The integrated circuit for controlling battery cell is configured to select via the selection circuit a terminal voltage from terminal voltages input from the individual lithium battery cells via the plurality of voltage receiving terminals, to convert an analog value of the selected terminal voltage to a digital value via the analog/digital converter, and to transmit the converted digital value of the terminal voltage from the serial communication circuit via one of the plurality of signal transmission terminals. In addition, the integrated circuit for controlling battery cell selects via the selection circuit a predetermined voltage output from the voltage generating circuit, converts an analog value of the selected predetermined voltage to a digital value via the analog/digital converter, diagnoses whether or not an abnormality has occurred in the integrated circuit via the diagnosis circuit based upon the converted digital value of the predetermined voltage, and, if the diagnosis result indicates an abnormal state, transmit a signal indicating an abnormality from the one-bit communication circuit via another one of the plurality of the signal transmission terminals.

Another integrated circuit for controlling battery cell according to the present invention that is an integrated circuit electrically connected to a plurality of lithium battery cells serially connected and disposed to measure terminal voltages at the individual lithium battery cells comprises a plurality of voltage receiving terminals, a signal transmission/reception terminal, a selection circuit, an analog/digital converter, a communication circuit, a diagnosis circuit, a digital comparator circuit, and a digital value output circuit. The integrated circuit for controlling battery cell is configured to select via the selection circuit a terminal voltage from terminal voltages input from the individual lithium battery cells via the plurality of voltage receiving terminals, to convert an analog value of the selected terminal voltage to a digital value via the analog/digital converter, and to transmit the converted digital value of the terminal voltage from the communication circuit via the signal transmission terminal. In addition, the integrated circuit for controlling battery cell outputs from the digital value output circuit a first digital value and a second digital value which is in a predetermined magnitude relationship to the first digital value, compares the first and second digital values via the digital comparator circuit, diagnoses whether or not an abnormality has occurred in the integrated circuit via the diagnosis circuit based upon whether or not the comparison result is in the predetermined magnitude relationship, and, if the diagnosis result indicates an abnormal state, transmits a signal indicating an abnormality from the communication circuit via the signal transmission terminal.

BRIEF DESCRIPTION OF THE DRAWINGS

FIG. 30 shows a signal OFF period set via the discharge control circuit to give priority to the balancing switch control.

DESCRIPTION OF PREFERRED EMBODIMENTS

The following is an explanation of an embodiment of the vehicle power supply system according to the present invention, given in reference to drawings. The embodiment of the present invention described below assures a high level of safety in a drive system for a vehicle rotating electrical machine, in a DC power supply system, in a DC power supply cell controller or in integrated circuits used in a DC power supply cell controller.

In the structure adopted in the embodiment, a stage circuit within each integrated circuit cyclically generates a stage signal, the measurement target battery cell terminal voltage is selected in sequence based upon the stage signal, the selected terminal voltage is converted to a digital signal via an analog/digital converter and the digital signal is used as a measurement value. The integrated circuit also has a battery cell diagnosis function that is engaged to execute diagnosis for the target battery cell based upon the digital signal indicating the measurement results in response to the stage signal originating from the stage circuit. As described above, following the measurement of the terminal voltage at the battery cell, which is executed cyclically, the diagnosis for battery cell over-charge or the like is executed in succession based upon the digital signal indicating the measurement results. Since the target battery cell is selected cyclically in a predetermined order, the terminal voltage at the selected battery cell is measured and the over-charge diagnosis or the like is executed in sequence by linking with the measurement operation, an abnormality can be diagnosed quickly based upon the measurement value. Furthermore, since the measurement and the diagnosis are executed at each integrated circuit over predetermined cycles, the diagnosis for all the battery cells constituting the battery module can be executed in a short period of time, assuring a high level of reliability.

In the embodiment, a selection circuit selects a specific voltage generated inside each integrated circuit independently of the terminal voltage measurement and conversion results obtained by converting the selected voltage through the analog/digital converter, are compared with the threshold value to determine whether or not the conversion results and the threshold value sustain a known relationship. If an abnormality occurs in the selection circuit or the analog/digital converter, the known relationship will no longer be sustained. Namely, the internal diagnosis for the integrated circuit can be executed based upon the relationship.

Through the embodiment described below, the following issues are effectively addressed as well as the issues described earlier.

(Explanation of the Cell Controller)

Figure 1:
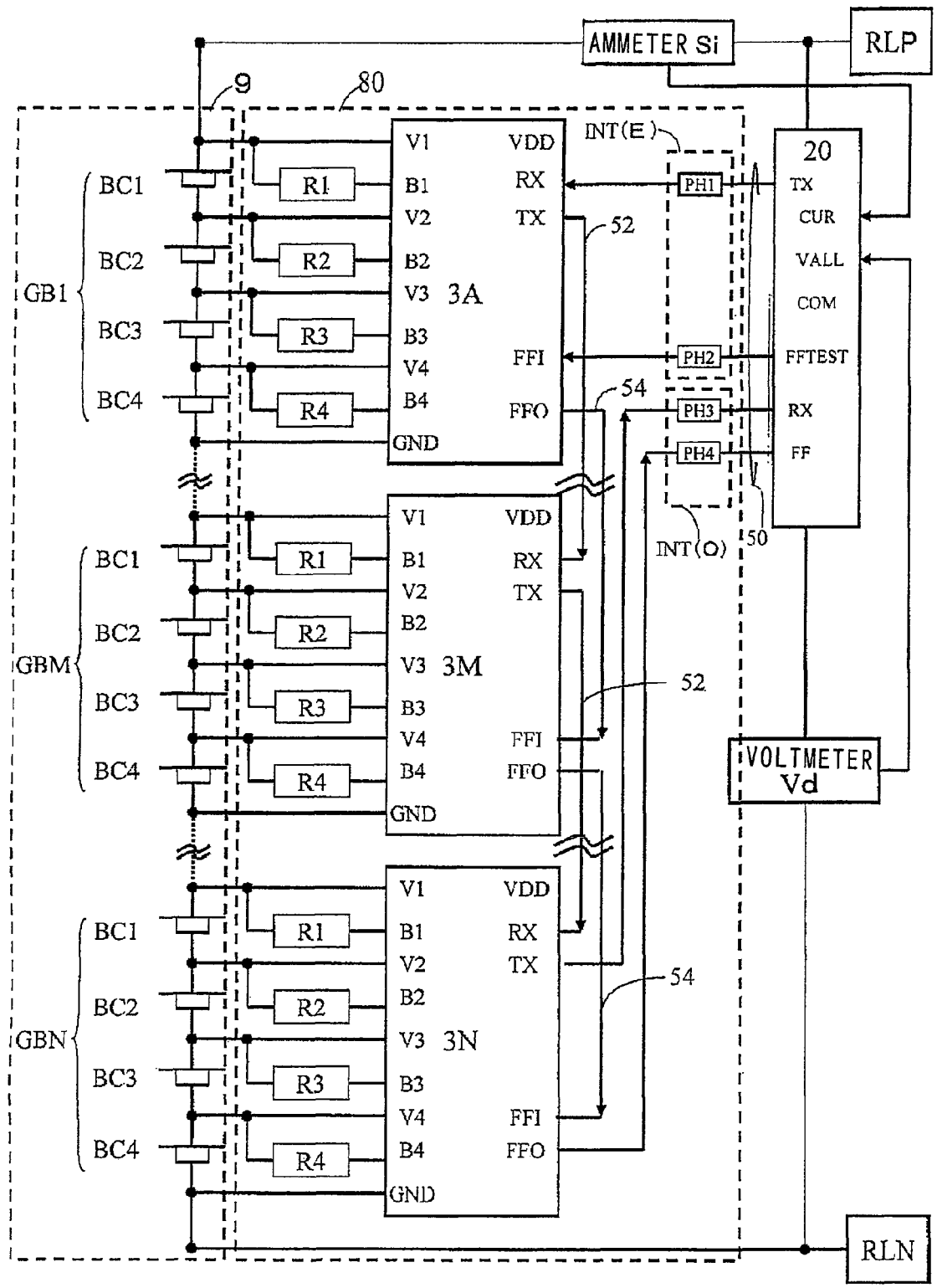
FIG. 1 is a diagram showing the structures adopted in the battery module and the cell controller in the vehicle power supply system achieved in an embodiment of the present invention.

FIG. 1 shows a battery module 9 and a cell controller (hereafter may be simply referred to as a C/C) 80 in a vehicle battery system used to drive a vehicle rotating electrical machine.

The battery module 9 includes a plurality of battery cell groups GB1, ..., GBM, ... and GBN. The battery cell groups each include a plurality of serially connected battery cells BC1~BC4. In other words, the battery module 9 includes a plurality of serially connected battery cells. The battery unit in the embodiment includes numerous battery cells, e.g., several tens of battery cells or even several hundred battery cells. The battery cells in the embodiment are each constituted with a lithium ion battery.

The terminal voltage at each lithium battery cell changes dependant on the state of charge at the battery cell. For instance, the terminal voltage at a given battery cell may be approximately 3.3 V in a discharged state corresponding to an SOC of approximately 30% and it may be approximately 3.8 V in a charged state corresponding to an SOC of approximately 70%. However, in an over-discharged state, in which the battery cell has been discharged beyond its normal operating range, the terminal voltage may fall to 2.5 V or less, whereas in an over-charged state, in which the battery cell has been charged beyond its normal operating range, the terminal voltage may be 4.2 V or higher. The SOC of each of the plurality of serially connected battery cells BC1~BC4 can be ascertained by individually measuring the terminal voltages.

In the embodiment, each battery cell group is constituted with four to six battery cells BC1~BC4, so as to facilitate the measurement of the terminal voltages at the individual battery cells BC1~BC12. In the example presented in FIG. 1, each battery cell group is made up with four battery cells. Namely, the group BG1, GBM and GBN are each constituted with battery cells BC1~BC4. While there are battery cell groups each made up with battery cells are present between the group BG1 and the group GBM and between the group GBM and the group GBN, these battery cell groups assume structures similar to those of the groups GB1, . . . , GBM, . . . and GBN and for purposes of simplification, FIG. 1 does not include an illustration of the other battery cell groups.

The cell controller 80 includes integrated circuits 3A, . . . , 3M, . . . and 3N, each provided in correspondence to one of the groups GB1, . . . , GBM, . . . and GBN constituting the battery module 9. The integrated circuits each include voltage detection terminals via which the terminal voltages at the individual battery cells are detected. The voltage detection terminals V1 through GND at each integrated circuit are connected to the positive poles and the negative poles of the individual battery cells constituting the corresponding battery cell group. The integrated circuit further includes transmission/reception terminals used for signal transmission. The transmission/reception terminals at the individual integrated circuits are serially connected as explained later and are connected to a battery controller 20 through a signal transmission path. This structural feature is to be described in detail below.

The cell controller 80 includes a plurality of integrated circuits, e.g., several integrated circuits or several tens of integrated circuits, each provided in correspondence to a specific battery cell group. FIG. 1 shows the integrated circuits (hereafter may be simply referred to as ICs) 3A, . . . , 3M, . . . and 3N. While integrated circuits assuming structures similar to those of the integrated circuits 3A, 3M and 3N are present between integrated circuits 3A and 3M and between the integrated circuits 3M and 3N. For purposes of simplification, FIG. 1 does not include an illustration of the other integrated circuits.

The integrated circuits 3A, . . . , 3M, . . . and 3N respectively detect the voltages at the battery cells BC1~BC4 constituting the corresponding battery cell groups GB1, . . . , GBM, . . . and GBN. In addition, in order to achieve uniformity with regard to the states of charge (SOCs) of the battery cells constituting all the battery cell groups, the integrated circuits 3A, . . . , 3M, . . . and 3N each assume a structure whereby SOC adjustment resistors R1~R4 to be used to individually adjust the SOCs at the battery cells BC1~BC4 are connected in parallel with the corresponding battery cells via switch elements. The switch elements are to be described in detail in reference to FIG. 2.

The integrated circuits 3A, . . . , 3M, . . . and 3N have a function of detecting an abnormal state occurring at any of the battery cells BC1~BC4 constituting the corresponding battery cell groups GB1, . . . , GBM, . . . and GBN. The integrated circuits adopt structures identical to one another and each includes (1) a terminal voltage measurement circuit, (2) an SOC adjustment circuit and (3) an abnormal state detection circuit, for the corresponding battery cells. The term "abnormal state" is used in the description of the embodiment to refer to an over-charge or an over-discharge of a battery cell, an abnormal rise in the battery cell temperature or the like.

Signals are exchanged between the integrated circuits 3A, . . . , 3M, . . . and 3N and the higher-order battery controller 20 through a communication harness 50. The battery controller 20, grounded (GND) at the potential assumed at the vehicle chassis, operates at a low potential of 12 V or less. The integrated circuits 3A, . . . , 3M, . . . and 3N are held at varying potentials, since the potentials at the battery cells constituting the corresponding groups are different and thus operate at different potentials. As described earlier, the terminal voltage at a given battery cell changes based upon its SOC and thus, the potential at each group relative to the minimum potential of the battery module 9 changes in correspondence to the states of charge SOCs. Since the integrated circuits 3A, . . . , 3M, . . . and 3N each detect the terminal voltages of the battery cells constituting the corresponding battery cell group in the battery module 9 or each executes discharge control or the like to adjust the states of charge SOCs at the battery cells constituting the corresponding group, the voltage difference applied to the integrated circuit can be reduced by adjusting the reference potential of the integrated circuit based upon the potential of the corresponding group. A lesser extent of variance among voltages applied to the integrated circuits is advantageous in that a very high level of voltage withstanding performance does not need to be rigorously pursued with regard to the integrated circuits and in that better safety and better reliability are assured. Accordingly, the reference voltage for each integrated circuit is adjusted based upon the potential at the corresponding group in the embodiment. By connecting the GND terminal assuming the reference potential for the integrated circuit to a battery cell in the corresponding group, the reference potential of the integrated circuit can be altered based upon the potential of the corresponding group. In the embodiment, a terminal of the battery cell assuming the lowest potential in the group is connected to the GND terminal of the integrated circuit.

In addition, in order to allow each integrated circuit to initially generate a reference voltage and a drive voltage to be used to engage the internal circuits disposed therein a V1 terminal of the integrated circuit is connected to a positive-pole terminal of the battery cell assuming the highest potential in the corresponding group and the GND terminal of the integrated circuit is connected to a negative-pole terminal of the battery cell assuming the lowest potential in the group. The integrated circuits structured as described above is engaged in operation as a voltage representing the difference between the highest potential and the lowest potential in the corresponding group is supplied thereto.

The relationship among the potentials manifesting in the power supply system for the battery controller 20 and the relationship among the potentials manifesting in the power supply system for the cell controller 80 are different from each other and the values of the voltages generated therein also differ greatly. Accordingly, the communication harness 50 connected to the battery controller 20 needs to be electrically insulated from transmission paths 52 and 54 through which the transmission/reception terminals of the individual integrated circuits 3A, . . . , 3M, . . . and 3N are serially connected. Such electrical insulation is assured via insulating circuits disposed on the entry sides and the exit sides of the transmission paths 52 and 54 constituted with the integrated circuits.

The insulating circuit disposed on the entry side of the transmission paths 52 and 54 is indicated as an entry-side interface INT(E), whereas the insulating circuit disposed on the exit side is indicated as an exit-side interface INT(O). The interfaces INT(E) and INT(O) each include a circuit via which an electrical signal is first converted to a light signal and then the light signal is converted back to an electrical signal. Information is transmitted via this circuit. As a result, the electrical circuit of the battery controller 20 and the electrical circuit of the cell controller 80 remain electrically insulated from each other. The entry-side interface INT(E) includes photocouplers PH 1 and PH2. The photocoupler PH 1 is disposed between a transmission terminal TX of the battery controller 20 and a reception terminal RX of the integrated circuit 3A on the high potential side. The photocoupler PH 2 is disposed between a transmission terminal FF-TEST of the battery controller 20 and a reception terminal FFI of the integrated circuit 3A. Via the photocouplers PH 1 and PH 2 in the entry-side interface INT(E), the transmission terminals TX and FF-TEST of the battery controller 20 remain electrically insulated from the reception terminals RX and FFI at the integrated circuit 3A and vice versa.

Likewise, photocouplers PH3 and PH4 constituting the exit-side interface INT (O) are disposed between reception terminals at the battery controller 20 and the low-potential-side integrated circuit 3N, so as to sustain the reception terminals at the battery controller 20 and the transmission terminals at the integrated circuit 3N in a state of electrical insulation from each other. More specifically, the photocoupler PH 3 is disposed between the transmission terminal TX of the integrated circuit 3N and the reception terminal RX of the battery controller 20, whereas the photocoupler PH4 is disposed between the transmission terminal FFO of the integrated circuit 3N and the reception terminal FF of the battery controller 20.

A signal transmitted from the transmission terminal TX of the battery controller 20 travels through the integrated circuits 3A, . . . , 3M, . . . and 3N along the looped communication path and is received at the reception terminal RX. Namely, the signal transmitted from the transmission terminal TX of the battery controller 20 is received at the reception terminal RX of the integrated circuit 3A via the photocoupler PH 1 in the entry-side interface INT(E), is transmitted from the transmission terminal TX of the integrated circuit 3A, is received at the reception terminal RX of the integrated circuit 3M, is transmitted from the transmission terminal TX of the integrated circuit 3M, is received at the reception terminal RX of the integrated circuit 3N, is transmitted from the transmission terminal TX of the integrated circuit 3N and is finally received at the reception terminal RX of the battery controller 20 via the photocoupler PH 3 in the exit-side interface INT(O). Serial communication is executed via this looped communication path. It is to be noted that measurement values indicating the terminal voltage at each battery cell, the temperature at the battery cell and the like are received at the battery controller 20 through the serial communication. In addition, the integrated circuits 3A through 3N are each configured so as to automatically enter a wake-up state upon receiving a command via the transmission path. Namely, as a communication command 292, to be detailed later, is transmitted from the battery controller 20, the integrated circuits 3A through 3N each shift from a sleep state into an operating state.

The integrated circuits 3A through 3N each executes an abnormality diagnosis and transmits a one-bit signal via the following transmission path in the event of an abnormality. The integrated circuits 3A through 3N each transmits an abnormality signal from the transmission terminal FFO if it is determined that an abnormality has occurred in the integrated circuit itself or if a signal indicating an abnormality, transmitted from the preceding integrated circuit is received at the reception terminal FFI. If, on the other hand, a signal indicating an abnormality, which has already been received at the reception terminal FFI, disappears or if an abnormal decision having been made with regard to the subject integrated circuit is switched to a normal decision, the abnormality signal to be transmitted from the transmission terminal FFO disappears. The abnormality signal used in the embodiment is a one-bit signal. While the battery controller 20 does not transmit an abnormality signal to the integrated circuits, it transmits a test signal, i.e., a dummy abnormality signal to be used in diagnosis of the abnormality signal transmission path for the correct operating state, from a terminal FF-TEST of the battery controller 20. Next, the transmission path is described.

The test signal, i.e., the dummy abnormality signal, is transmitted from the transmission terminal FFTEST of the battery controller 20 to the reception terminal FFI of the integrated circuit 3A via the photocoupler PH 2 in the entry-side interface INT(E). In response to the signal, a signal indicating an abnormality (hereafter referred to as an abnormality signal) is transmitted from the transmission terminal FFO of the integrated circuit 3A to the reception terminal FFI of the next integrated circuit, . . . and is transmitted to the reception terminal FFI of the integrated circuit 3M. The abnormality signal, transmitted in sequence as described above, is ultimately transmitted to the reception terminal FF of the battery controller 20 via the photocoupler PH 4 in the exit-side interface INT(O) from the transmission terminal FFO of integrated circuit 3N. As long as the transmission path is working normally, the dummy abnormality signal transmitted from the battery controller 20 returns to the reception terminal FF of the battery controller 20 via the communication path. The communication path diagnosis can be thus executed as the dummy abnormality signal is transmitted and received at the battery controller 20, as described above, ensuring an improvement in the system reliability. In addition, as explained earlier, an integrated circuit transmits an abnormality signal to the succeeding integrated circuit upon detecting an abnormal state so as to report the abnormal state quickly to the battery controller 20 without requiring the battery controller 20 to issue a transmission request. As a result, the optimal action for correcting the abnormality can be taken promptly.

While the signals are invariably passed on from the integrated circuit 3A corresponding to the high potential group in the battery module 9 toward the integrated circuit 3N corresponding to the low potential group in the battery module 9 in the description provided above, this transmission sequence simply represents an example. For instance, a signal may instead be transmitted from the battery controller 20 to the integrated circuit 3N corresponding to the low potential group in the battery module 9, then transmitted to the individual integrated circuits (including the integrated circuit 3M) corresponding to higher potential groups in sequence and transmitted to the battery controller 20 via the interface INT from the integrated circuit 3A corresponding to the highest potential group.

In the DC power supply system shown in FIG. 1, DC power is supplied to a load such as the inverter via a positive pole-side relay RLP and a negative pole-side relay RLN. The battery controller 20 or the inverter executes open/close control of the relays RLP and RLN as an abnormality is detected by an integrated circuit.

The battery controller 20 receives the output from an ammeter Si, detects the electrical current supplied from the overall battery module 9 to the inverter and also detects the DC voltage applied to the inverter from the battery module 9 based upon the output from a voltmeter Vd.

(Integrated Circuits)

Figure 2:
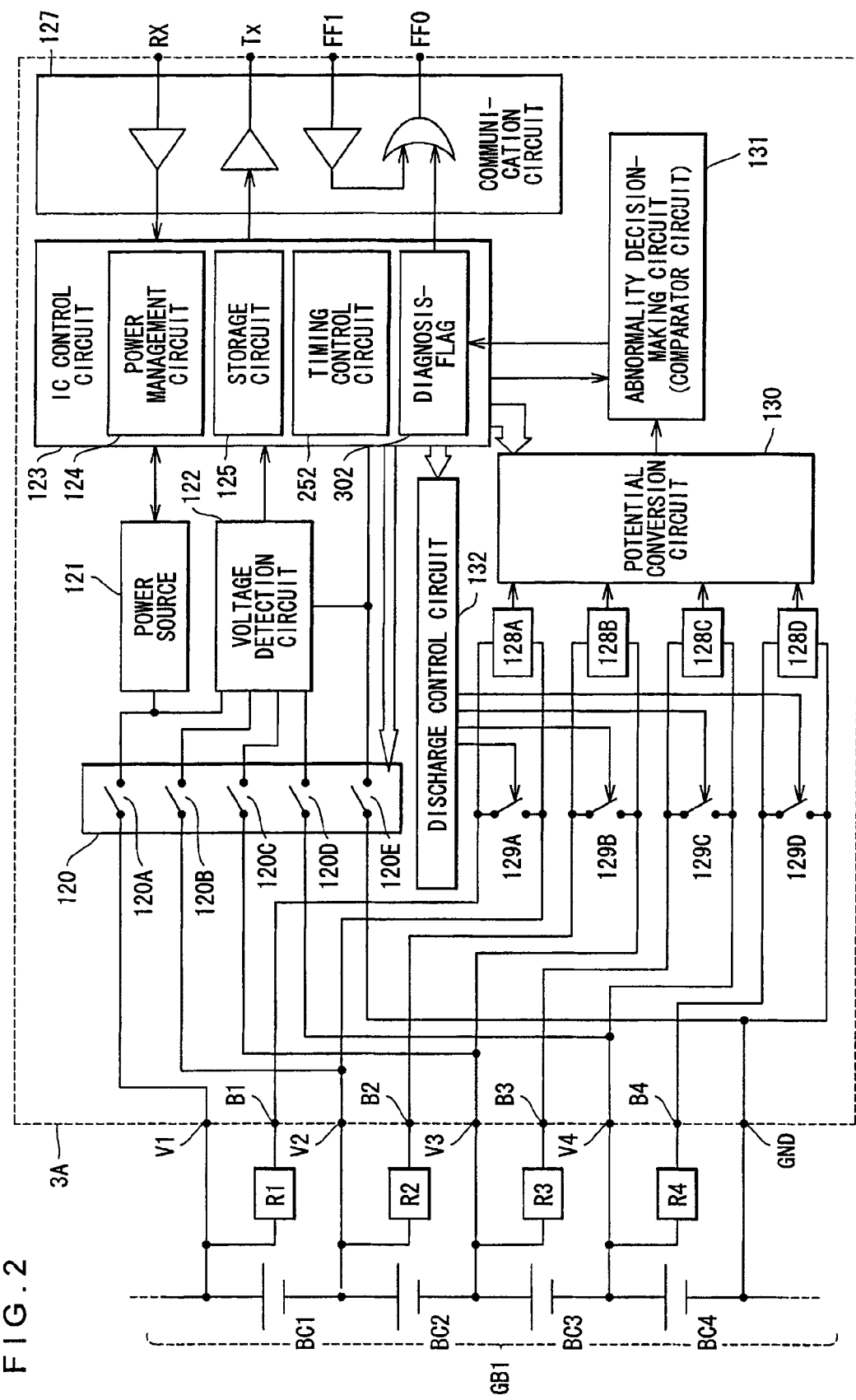
FIG. 2 is a block diagram showing an integrated circuit structure that may be adopted in the vehicle power supply system according to the present invention.

FIG. 2 is a block diagram of an electronic circuit representing an example of the integrated circuit 3A. As explained earlier, the integrated circuits 3A, . . . , 3M, . . . and 3N adopt structures identical to one another. In other words, the integrated circuits other than the integrated circuit 3A, too, may assume the structure shown in FIG. 2. The integrated circuit 3A in FIG. 2 is connected to the battery cells BC1~BC4 in the group GB1 in the battery module 9 corresponding to the particular integrated circuit. The integrated circuits other than the integrated circuit 3A, too, are connected to the corresponding groups in the battery module 9 and are engaged in similar operation. It is to be noted that while the integrated circuit 3A and the resistors R1~R4 are all disposed in the cell controller 80 as shown in FIG. 1, FIG. 2 does not include an illustration of the cell controller 80.

Input-side terminals of the integrated circuit 3A are connected to the battery cells BC1~BC4 constituting the group GB1. The positive-pole terminal of the battery cell BC1 is connected to a selection circuit 200 via the input terminal V1. The selection circuit 200, which may be constituted with, for instance, a multiplexer, includes switches 120A, 120BB, 120C, 120D and 120E. One of the terminals of the switch 120A is connected to the input terminal V1, whereas the other terminal of the switch 120A is connected to a power source circuit 121 and a voltage detection circuit 122 constituted with an analog/digital converter. The negative-pole terminal of the battery cell BC1, which is also the positive-pole terminal of the battery cell B2, is connected to one of the terminals of the switch 120B in the selection circuit 120 via the input terminal V2. The other terminal of the switch 120B is connected to the voltage detection circuit 122. The negative-pole terminal of the battery cell BC2, which is also the positive-pole terminal of the battery cell B3, is connected to one of the terminals of the switch 120C in the selection circuit 120 via the input terminal V3. The other terminal of the switch 120C is connected to the voltage detection circuit 122. The negative-pole terminal of the battery cell BC3, which is also the positive-pole terminal of the battery cell BC4, is connected to one of the terminals of the switch 120D in the selection circuit 120 via the input terminal V4. The other terminal of the switch 120D is connected to the voltage detection circuit 122.

The negative-pole terminal of the battery cell BC4 is connected to the GND terminal at the integrated circuit and is ultimately connected to one of the terminals of the switch 120E in the selection circuit 120 via the GND terminal. The other terminal of the switch 120E is connected to the voltage detection circuit 122.

The power source circuit 121, which may be constituted with, for instance, a DC/DC converter, converts power from the individual battery cells BC1~BC4 to predetermined constant voltages. These voltages are supplied to the various circuits within the integrated circuit 3A to be used as drive power or supplied to a comparator circuit where it is used as a comparison reference voltage when judging the current state.

The voltage detection circuit 122 includes a circuit that converts the terminal voltage at each of the battery cells BC1~BC4 to a digital value. The terminal voltages having been converted to digital values are provided to an IC control circuit 123 where they are held in an internal storage circuit 125. These voltage values are used in the diagnosis and the like and are also transmitted to the battery controller 20 shown in FIG. 1 from a communication circuit 127.

The IC control circuit 123, equipped with an arithmetic operation function, includes the storage circuit 125, a power management circuit 124 and a timing control circuit 252 that cyclically detects various voltages and executes a state diagnosis. In the storage circuit 125, which may be constituted with, for instance, a register circuit, the terminal voltages at the battery cells BC1~BC4 detected by the voltage detection circuit 122 are stored in correspondence to the individual battery cells BC1~BC4. In addition, other detection values are held in the storage circuit 125 at predetermined addresses so that they can be read out as necessary. The power management circuit 124 assumes a structure that enables it to manage the state of the power source circuit 121.

The communication circuit 127 is connected to the IC control circuit 123 and thus, the IC control circuit 123 is able to receive a signal originating from an external sender outside the integrated circuit 3A via the communication circuit 127. For instance, the communication command originating from the battery controller 20 can be received at the RX terminal via the photocoupler PH 1 in the entry-side interface INT(E). The communication command is then transferred from the communication circuit 127 to the IC control circuit 123, and is decoded at the IC control circuit 125, which then executes processing corresponding to the contents of the communication command. Such a communication command may be a communication command requesting the measurement values indicating the terminal voltages at the battery cells BC1~BC4, a communication command requesting a discharge operation to be executed in order to adjust the SOCs at the individual battery cells BC1~BC4, a communication command (wake-up) for starting operation of the integrated circuit 3A, a communication command (sleep) for stopping operation of the integrated circuit 3A or a communication command requesting address setting.

As shown in FIG. 2, the positive-pole terminal of the battery cell BC1 is connected to a terminal B1 of the integrated circuit 3A via the resistor R1. A balancing switch 129A is disposed between the terminal B1 and the terminal V2. An operating state detection circuit 128A that detects the operating state of the balancing switch 129A is connected in parallel to the balancing switch 129A. A discharge control circuit 132 executes open/close control for the balancing switch 129A. Likewise, the positive-pole terminal of the battery cell BC2 is connected to a terminal B2 via the resistor R2 and a balancing switch 129B is disposed between the terminal B2 and the terminal V3. An operating state detection circuit 128B that detects the operating state of the balancing switch 129B is connected in parallel to the balancing switch 129B. A discharge control circuit 132 executes open/close control for the balancing switch 129B.

The positive-pole terminal of the battery cell BC3 is connected to a terminal B3 via the resistor R3 and a balancing switch 129C is disposed between the terminal B3 and the terminal V4. An operating state detection circuit 128C that detects the operating state of the balancing switch 129C is connected in parallel to the balancing switch 129C. The discharge control circuit 132 executes open/close control for the balancing switch 129C. The positive-pole terminal of the battery cell BC4 is connected to a terminal B4 via the resistor R4 and a balancing switch 129D is disposed between the terminal B4 and the terminal GND. An operating state detection circuit 128D that detects the operating state of the balancing switch 129D is connected in parallel to the balancing switch 129D. The discharge control circuit 132 executes open/close control for the balancing switch 129D.

The operating state detection circuits 128A~128D repeatedly detect the voltages at the two terminals at the respective balancing switches 129A~129D over predetermined cycles so as to determine whether or not the balancing switches 129A~129D are in a normal state. The SOCs of the battery cells BC1~BC4 are adjusted via the balancing switches 129A~129D respectively. This means that if an abnormality occurs at any of these switches, the SOC of the corresponding battery cell cannot be controlled, giving rise to an over-charge or an over-discharged state in the particular battery cell. Any one of the balancing switches 129A-129D may be detected to be in an abnormal state if, for instance, the voltage between the terminals at the balancing switch, which should be in a continuous state, matches the terminal voltage at the corresponding battery cell. Under such circumstances, the balancing switch has failed to enter the continuous state in response to a control signal. Also, if the voltage between the terminals at a given balancing switch, which should be in an open state, indicates a value lower than that of the terminal voltage at the corresponding battery cell, the particular balancing switch can be assumed to be continuous regardless of the control signal. The switch operating state detection circuits 128A~128D may be voltage detection circuits each constituted with a differential amplifier or the like. The terminal voltages are compared with a predetermined voltage used for purposes of making the decision described above at an abnormality decision-making circuit 131 to be detailed later.

Via the balancing switches 129A-129D, which may each be constituted with, for instance, a MOSFET, the power having accumulated in the corresponding battery cells BC1~BC4 is discharged. An electrical load such as an inverter is connected to the battery module 9 constituted with numerous serially connected battery cells and an electrical current is supplied to the electrical load from the entire assembly of serially connected battery cells. In addition, the battery module 9 is charged with an electrical current supplied from the electrical load to all the battery cells connected in series. If the serially connected battery cells assume varying states of charge (SOCs), the current supplied to the electrical load is regulated in correspondence to the state of the battery cell at the most advanced stage of discharge among the battery cells. The current supplied from the electrical load, on the other hand, is regulated in correspondence to the state of the battery cell at the most advanced stage of charge among the battery cells.

The balancing switch 129 connected to any battery cell assuming an SOC exceeding the average state among the numerous serially connected battery cells is set in a continuous state so as to supply a discharge current via the serially connected registers. As a result, the states of charge of the serially connected battery cells are controlled toward equalization. An alternative method whereby the battery cell in the most advanced stage of discharge is assigned as a reference cell and the discharge time for a given battery cell is determined based upon the difference relative to the SOC of the reference cell may be adopted. There are various other methods that may be adopted for SOC adjustment. The SOC of each battery cell can be determined through arithmetic operation executed based upon the terminal voltage at the battery cell. There is a correlation between the SOC of the battery cell and the terminal voltage at the battery cell and, accordingly, by controlling the balancing switches 129 so as to equalize the terminal voltages at the battery cells, the SOCs of the battery cells can be substantially equalized.

The voltage between the source and the drain at the FET constituting each balancing switch, detected via the corresponding operating state detection circuit among the operating state detection circuits 128A-128D, is output to a potential conversion circuit 130. Different potentials are set between the sources and the drains at the individual FETs relative to the reference potential at the integrated circuit 3A, and for this reason, accurate judgment cannot be made by comparing the initial voltage values. Accordingly, the potentials are adjusted at the potential conversion circuit 130 before undergoing abnormality decision-making at the abnormality decision-making circuit 131. The potential conversion circuit 130 also has a function of selecting the diagnosis target balancing switch 129 based upon a control signal provided from the IC control circuit 123. The voltage at the selected balancing switch 129 is provided to the abnormality decision-making circuit 131. Based upon a control signal provided from the IC control circuit 123, the abnormality decision-making circuit 131 compares the voltage measured between the terminals at the diagnosis target balancing switch 129, indicated in the signal from the potential conversion circuit 130, with a decision-making voltage and makes a decision as to whether or not an abnormality has occurred at the target balancing switch among the balancing switches 129A1~129D.

A command signal for setting the balancing switch 129, corresponding to the battery cell to be discharged, in a continuous state is transmitted from the IC control circuit 123 to the discharge control circuit 132. Based upon this command signal, the discharge control circuit 132 outputs a signal equivalent to a gate voltage at which the balancing switches 129A-129D constituted with MOSFETs as explained earlier, enter the continuous state. The IC control circuit 123, upon receiving through communication a discharge time command indicating the discharge time corresponding to the specific battery cell from the battery controller 20 in FIG. 1, executes the discharge operation described above.

The abnormality decision-making circuit 131 detects whether or not an abnormality has occurred at any of the balancing switches 129A~129D.

The IC control circuit 123 outputs an abnormality signal indicating that an abnormality has occurred at any of the balancing switches 129A~129D from the one-bit transmission terminal FFO of the communication circuit 127 and the abnormality signal is subsequently transmitted to the battery controller 20 via the communication circuits 127 at the other integrated circuits. In addition, the IC control circuit 123 transmits information indicating that an abnormality has occurred at a balancing switch among the balancing switches 129A~129D and information enabling identification of the abnormal balancing switch to the battery controller 20 via the transmission terminal TX at the communication circuit 127.

(Communication Means)

Figure 3:
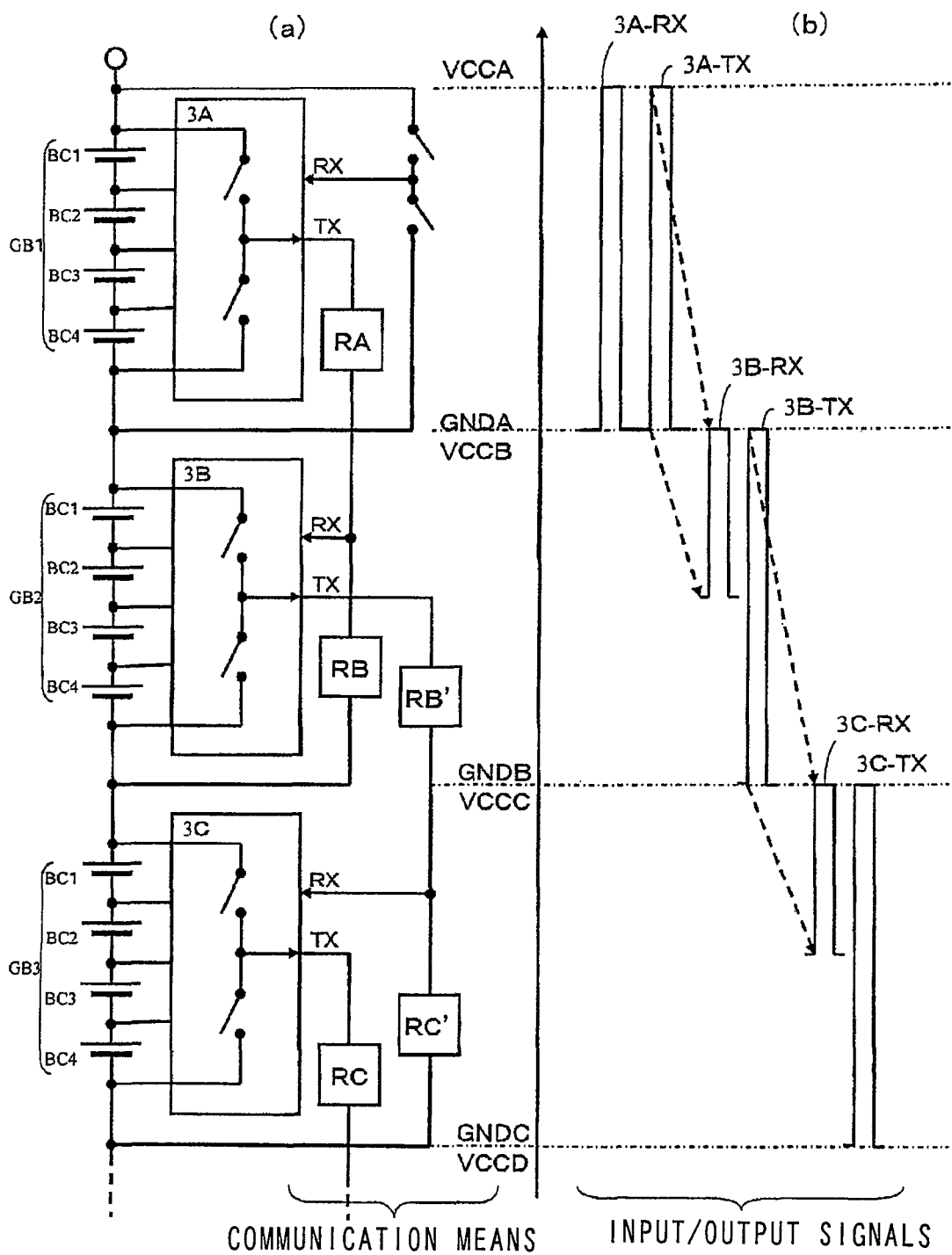
FIG. 3 illustrates the communication command transmission/reception method adopted in the integrated circuits in the embodiment.

FIG. 3 illustrates a method that may be adopted to transmit and receive communication commands at the individual integrated circuits 3A, . . . , 3M, . . . and 3N. In the part of FIG. 3 indicated with (a), a signal 3A-RX received at the terminal RX of the integrated circuit 3A, a signal 3A-TX transmitted from the terminal TX of the integrated circuit 3A, a signal 3B-RX received at the terminal RX of the succeeding integrated circuit 3B, a signal 38-TX transmitted from the terminal TX of the integrated circuit 3B, a signal 3C-RX received at the terminal RX of the succeeding integrated circuit 3C and a signal 3C-TX transmitted from the terminal TX of the integrated circuit 3C, are shown.

The signal 3A-TX transmitted from the terminal TX of the integrated circuit 3A is split between a resistor RA within the integrated circuit 3A and a resistor RB within the integrated circuit 3B, and thus the signal 3B-RX is generated. The signal 3B-TX transmitted from the terminal TX of the integrated circuit 3B is split between a resistor RB' within the integrated circuit 3B and a resistor RC within the integrated circuit 3C, and thus the signal 3C-RX is generated. The subsequent transmission signals are likewise each split via the individual resistors within the integrated circuits connected in series along the communication path, thereby determining the potential of the corresponding reception signal.

In the part of FIG. 3 indicated with (b), the potential levels of the signals 3A-RX, 3A-TX, 3B-RX, 3B-TX, 3C-RX and 3C-TX are shown.

As indicated in the figure, in a downstream-side group the voltage threshold value is set to a level matching half the total of the sum of voltages at the four battery cells and the sum of voltages at the two battery cells. If the signal from the terminal TX of the integrated circuit 3A is judged with a threshold value similar to that of the integrated circuit 3A in reference to voltages at battery cells controlled by the integrated circuit 3B, the low level of the signal will equal the half of the total voltage at the integrated circuit 3B, which is bound to lead to problems. Such problematic situation can be avoided by setting the threshold values as described above. It is to be noted that while the explanation is given above by assuming that the signals are transmitted from the higher potential-side toward the lower potential-side, signals may instead be transmitted from the lower potential-side toward the higher potential-side by shifting the signal levels through splitting via resistors in a similar manner.

(Diagnosis and Management: (1) Overview of Operation Schedule)

Figure 4:
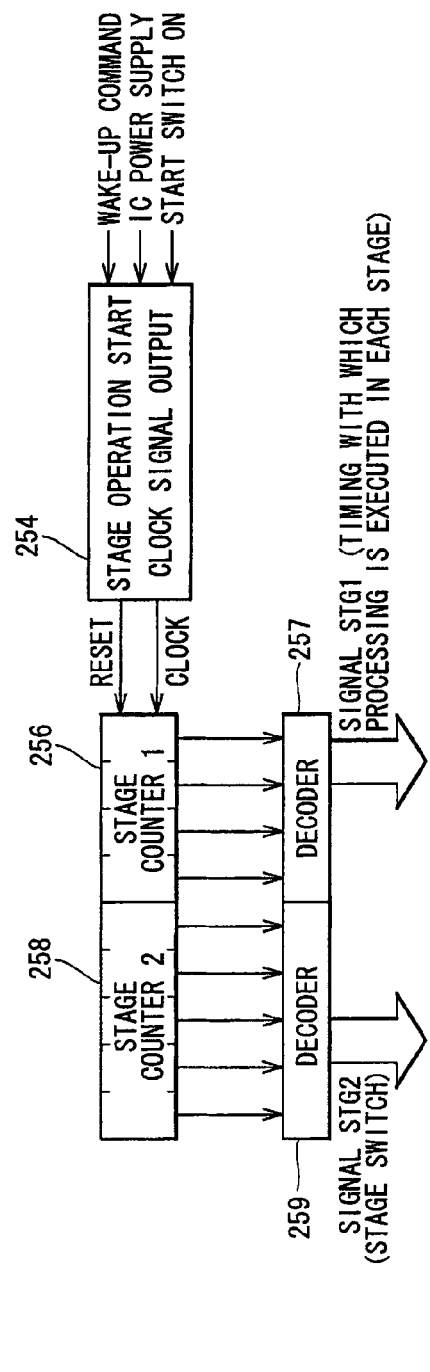
FIG. 4 illustrates an example of timing with which the measurement operation may be executed.

FIG. 4 illustrates the timing with which the measurement operation is executed. The integrated circuit 3A in FIG. 2 has a function of executing a diagnosis operation together with a measurement operation. It repeatedly executes measurement with the operational timing shown in FIG. 4 and also executes the diagnosis synchronously with the measurement. It is to be noted that while the groups GB1~GBN constituting the battery module 9 each include four battery cells in the embodiment illustrated in FIGS. 1 and 2, the integrated circuits 3A~3N are each capable of handling up to six battery cells. In other words, the number of battery cells in each of the groups GB1~GBN can be increased up to six. Accordingly, the timing diagram presented in FIG. 4 indicates the timing with which the operation is executed in conjunction with six battery cells. It is to be noted that the specific number of battery cells to constitute each group should be determined based upon the overall number of battery cells, the processing speed with which the measurement and the diagnosis are executed and the like.

As explained above, FIG. 4 illustrates the timing with which the diagnosis operation and the measurement operation are executed. The timing of the measurement operation, the measurement cycles and the diagnosis operation are managed by a startup circuit 254 and a stage counter unit constituted with a first stage counter 256 and a second stage counter 258. The stage counters 256 and 258 generate control signals (timing signals) to be used to manage the overall operation of the integrated circuit 3A. While the stage counters 256 and 258 are not separate entities in reality, they are shown as separate counters in the figure for ease of comprehension. The stage counter unit may be a standard counter or it may be constituted with a shift register. If the stage counter unit is constituted with shift registers, the number of stages at which individual shift registers are disposed matches the number of stages. In the embodiment, there are 10 stages.

Upon (1) receiving at the terminal RX a communication command indicating a wake-up request, transmitted through the transmission path, (2) reaching a predetermined voltage as a power source voltage from the IC power source in the integrated circuit is supplied thereto or (3) receiving a signal indicating that the vehicle starter switch (key switch) has been turned on, the startup circuit 254 outputs a reset signal to the first and second stage counters 256 and 258, thereby initializing the stage counters 256 and 258. The startup circuit also outputs a clock signal with a predetermined frequency. Namely, under the conditions described in any of (1)~(3) above, the integrated circuit 3A executes the measurement operation and the diagnosis operation. If, on the other hand, a communication command indicating a sleep request is received through the transmission path or the communication command is not received over a predetermined length of time or more, the startup circuit 254 stops outputting the clock with the timing with which the stage counters 256 and 258 resume the reset state, i.e., the initial state. As the clock output stops, the stage progress also stops and thus, the execution of the measurement operation and the diagnosis operation enters the stopped state.

Upon receiving the clock signal provided from the startup circuit 254, the first stage counter 256 outputs a count value to be used to control the processing timing with which the processing is executed within each stage. A decoder 257 generates a timing signal STG1 to be used to control the processing timing with which the processing is executed within the stage based upon the count value provided from the first stage counter 256. The count value at the second stage counter 258 corresponds to the type of each specific stage indicated in a row 260Y1 of an operation table 260 and as the count value progresses, the corresponding stage is switched from the left-hand side stage to the right-hand side stage in row 260Y1 in the operation table 260. A decoder 259 outputs a stage signal STG2 to be used to select a specific stage based upon the count value at the second stage counter 258.

In the reset state, i.e., when the first stage counter 256 and the second stage counter 258 are in the initialized state, the second stage counter 258 holds the count value to be used to identify a stage STGCal, the stage signal STG2 output from the decoder 259 is a signal for selecting the stage STGCal and the processing within the stage is executed based upon the count operation at the first stage counter 256. As the count value at the second stage counter 258 is incremented by one, the second stage counter 258 assumes a count value indicating a stage STGCV1 in the second position from the left end in row 260Y1 in the operation table 260. The stage signal STG2 output from the decoder 259 at this time indicates STGCV1. At the stage STGCV1, the measurement and the diagnosis are executed for the battery cell BC1. Likewise, as the count value at the second stage counter 258 goes up, the corresponding stage indicated in row 260Y1 in the operation table 260 is switched from the left-hand side to the right-hand side. At the stage STGCV1, the measurement and the diagnosis are executed for the battery cell BC1. At the next stage STGCV2, the measurement and the diagnosis are executed for the battery cell BC2. At the next stage STGCV3, the measurement and the diagnosis are executed for the battery cell BC3. At the next stage STGCV4, the measurement and the diagnosis are executed for the battery cell BC4. In the embodiment illustrated in FIG. 2, the groups GB1~GBN constituting the battery module 9 are each made up with four battery cells and accordingly, stages STGCV5 and STGCV6 may either remain unused or be skipped. In other words, the presence of the stages STGCV5 and STGCV6 is not relevant. This operation is to be described in detail later. Consequently, following the processing at the stage STGCV4, processing is executed at a stage STGVDD to measure and diagnose the output from the power circuit 121 within the integrated circuit. Subsequently, processing is executed at a stage STGTEM to measure and diagnose the output from a temperature sensor. The processing then shifts to a stage STG reference power to measure and diagnose the reference voltage used within the integrated circuit. Following the processing at the stage STG reference power, the count value at the second stage counter 258 resumes the initial value corresponding to the stage STGCal. Thus, the output signal STG2 output from the decoder 259 at this time is the signal for specifying the stage STGCal. As described above, based upon the count operation at the second stage counter 258, the processing at each of the stages listed in row 260Y1 in the operation table 260 is executed from left to right repeatedly. It is to be noted that if a specific value is forcibly set at the second stage counter 258, the processing is executed at the stage corresponding to the specific value. The contents of the processing executed within each stage are to be described in detail later.

(Diagnosis and Measurement: (2) Switching the Number of Battery Cells)

Figure 5:
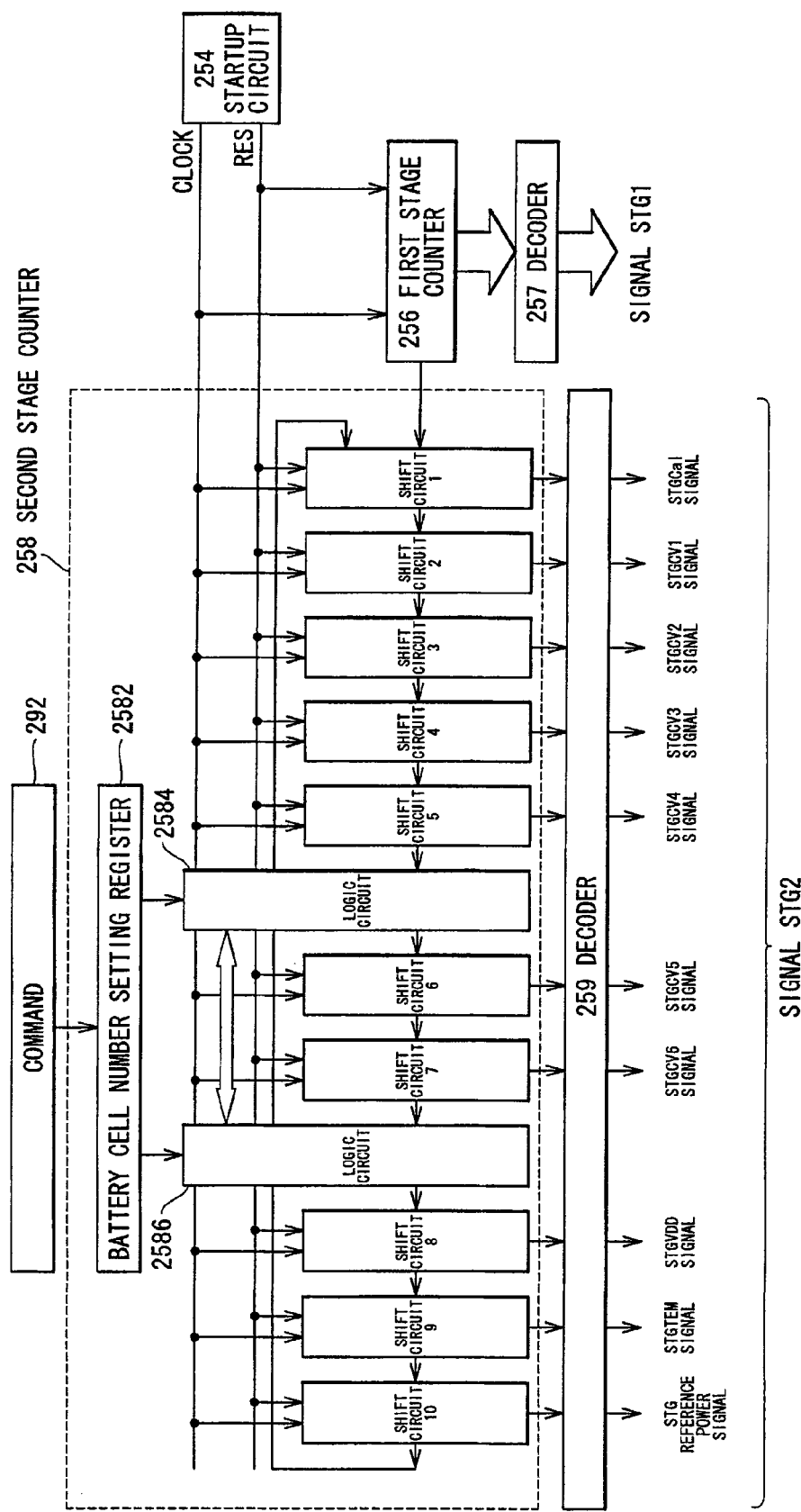
FIG. 5 illustrates a circuit via which measurement operation to be executed in correspondence to the number of battery cells, is enabled, as achieved in an embodiment.

As explained above, the contents of the diagnosis operation and the measurement operation to be executed are selected depending upon whether the number of battery cells constituting individual groups each corresponding to a specific integrated circuit is four or six. A specific example of the circuit is shown in FIG. 5. Based upon the clock signal provided from the startup circuit 254, the first stage counter 256 repeatedly executes count operation and as the count value at the first stage counter 256 becomes equal to a predetermined value, the count value at the second stage counter 258 is incremented by one.

The second stage counter 258 in the example presented in FIG. 5, is made up with 10 registers. In the initial state, a shift circuit 1 alone assumes a state 1 and all other shift circuits 2~10 assume a state 0. The decoder 259 outputs the stage signal STGCal as its output STG2. As the count value at the first stage counter 256 reaches a predetermined value, the next shift circuit 1 shifts into state 1 and the shift circuit 1 and the shift circuits 3~10 all assume state 0. The different shift circuits assume state 1 in sequence as described above. As the shift circuit 5 assumes state 1 and the shift circuits 1~4 and 6~10 assume state 0, the decoder 259 outputs the stage signal STGCV4.

When there are six battery cells constituting the corresponding battery cell group, 6 is set at a register 2582 in response to a communication command 292 provided from the outside. If, on the other hand, the corresponding battery cell group is constituted with four battery cells, 4 is set as the number of battery cells at the register 2582 in response to the communication command 292. When 6 is set at the register 2582 as the number of battery cells, the stage signal STGCV4 is output from the decoder 259 as the shift circuit 5 shifts to state 1. Subsequently, the shift circuit 6 shifts into state 1 and the stage signal STGCV5 is output. Then, the shift circuit 7 shifts into state 1 and the stage signal STGCV6 is output. After the shift circuit 7 assumes state 1 the shift circuit 8 shifts to state 1 and the decoder 259 outputs the stage signal STGVDD.

When 4 is set at the register 2582 as the number of battery cells, the shift circuits 6 and 7 are skipped and the shift circuit 8 assumes state 1 after the shift circuit 5, based upon the operation executed at a logic circuit 2584 and a logic circuit 2586. As a result, the stage signal STGCV5 and the stage signal STGCV6 corresponding to the shift circuits 6 and 7 are not output from the decoder 259 and instead, the decoder 259 outputs the stage signal STGVDD after outputting the stage signal STGCV4.

While the explanation given above is simplified by focusing on the operations executed when the number of battery cells constituting each battery cell group is four and six, logic circuits fulfilling functions identical to those of the logic circuits 2584 and 2586 are disposed between other shift circuits as well so as to output stage signals corresponding to the number of battery cells set at the register 2582 among the stage signals STGCV1~STGCV6 and skip any superfluous stage signals.

At the integrated circuits 3A~3N disposed in correspondence to the specific groups GB1~GBN, as shown in FIG. 1, the numbers of battery cells constituting the corresponding groups GB1~GBN are set. As a result, each of the integrated circuits 3A~3N is able to generate stage signals corresponding to the number of battery cells constituting the specific battery cell. This structure allows the groups GB1~GBN to be constituted with varying numbers of battery cells, which, in turn, increases the level of freedom in design and enables high-speed processing.

(Diagnosis and Measurement: (3) Measurement of Terminal Voltage at Each Battery Cell and Diagnosis for the Battery Cell)

Next, in reference to FIG. 4, details of the measurement and the diagnosis executed at each of the stages listed in row 260Y1 of the operation table 260 are explained. The measurement/diagnosis is categorized into two primary types. In one type of measurement/diagnosis, the measurement is executed by sensors and the diagnosis is executed to determine whether or not the measurement target is in an abnormal state. Its measurement schedule is indicated in a row 260Y2. In the other type of measurement/diagnosis, self-diagnosis is executed for the control device including the integrated circuit, i.e., self-diagnosis for the measurement system or the battery cell discharge control system shown in FIG. 2. Although not shown in FIG. 4, the operation table 260 should further include rows 260Y3~260Y9, where details of the self-diagnosis at the measurement system and the discharge control system would be indicated, below row 260Y2. As indicated in row 260Y2, each measurement operation session is divided into two time segments. The first half of the measurement session is indicated as RES, whereas the second half of the measurement session is indicated as "measurement." During the first time segment RES of each stage, an analog/digital converter 122A to be used for the measurement is initialized in addition to executing the diagnosis corresponding to the particular stage. In the present embodiment, the analog/digital converter 122A adopting a charge/discharge method in conjunction with a capacitor is used so as to lessen the adverse effect of noise. The electrical charge having been accumulated at the capacitor during the previous operation is discharged with the timing of the first time segment RES. During the second time segment "measurement" at each of the stages listed in row 260Y2, measurement is executed via the analog/digital converter 122A and diagnosis is executed for the measurement target based upon the measured value.

At the stage STGCal, the self-diagnosis, the details of which would be set in rows 260Y3~260Y9 (not shown) is primarily executed. In the RES mode during the first time segment at the stage STGCal, self-diagnosis is executed for the selection circuit 120 (multiplexer) as set in row 260Y6 (not shown), diagnosis is executed for a switching circuit that executes a switching operation for the selection circuit 120 and the like as set in row 260Y7 (not shown), and diagnosis of a selection signal (a selection signal used at a current value storage circuit 274 or a reference value storage circuit 278 in FIG. 6 to be detailed later) used in the digital comparison operation within the integrated circuit is executed as set in row 260Y9 (not shown). During the second time segment "measurement" at the stage STGCal, "measurement of the terminal voltage at the balancing switch 129 used to adjust the SOC of a specific battery cell" and "diagnosis for the balancing switch 129" are executed as set in row 260Y3 (not shown) and also, "diagnosis for the digital comparator circuit within the integrated circuit" is executed as set in row 260Y5 (not shown). The individual diagnosis sessions set in row 260Y7 (not shown) and the sessions set in row 260Y9 (not shown) are all executed during the first time segment and the second time segment at all the stages. However, this diagnosis cycle simply represents an example and the diagnosis may be executed over longer intervals instead of at each stage. In the diagnosis set in row 260Y8 (not shown), diagnosis is executed to determine whether or not the circuit that generates a threshold value to be used to detect an over-charged state of a battery cell is in the normal state. If an abnormality occurs at the threshold value generating circuit, accurate over-charge diagnosis cannot be executed.

At the stages STGCV1~STGCV6, the voltages at the terminals of the battery cells are measured in sequence and the diagnosis is executed based upon the values obtained through the measurement as to whether any of the battery cells may be at risk of over-charge or over-discharge. Since it is dangerous to allow the battery cells to enter an over-charged state or an over-discharged state, the over-charge/over-discharge diagnosis is executed with safety margins. When the subject battery cell group is made up with four battery cells, as shown in FIGS. 1 and 2, the stages STGCV5 and STGCV6 are skipped, as has been explained in reference to FIG. 5. At the stage STGVDD, the output voltage from the power circuit 121 is measured, whereas at the stage STGTEM, the voltage output at the thermometer is measured. At the stage STGTEM, the diagnosis session set in a row 260Y4 (not shown), i.e., the diagnosis as to whether or not the analog circuits and the analog/digital converter within the integrated circuit and the referenced voltage generating circuit are together operating in a normal state, is executed. The voltage output from the referenced voltage generating circuit assumes a known voltage value, and if the results of voltage value measurement do not indicate a value within a predetermined range, it is determined that an abnormality has occurred at one of the circuits listed above. Under such circumstances, execution of control is judged to be dangerous.

(Diagnosis and Measurement: (4) Measurement Circuit and Diagnosis Circuit)

Figure 6:
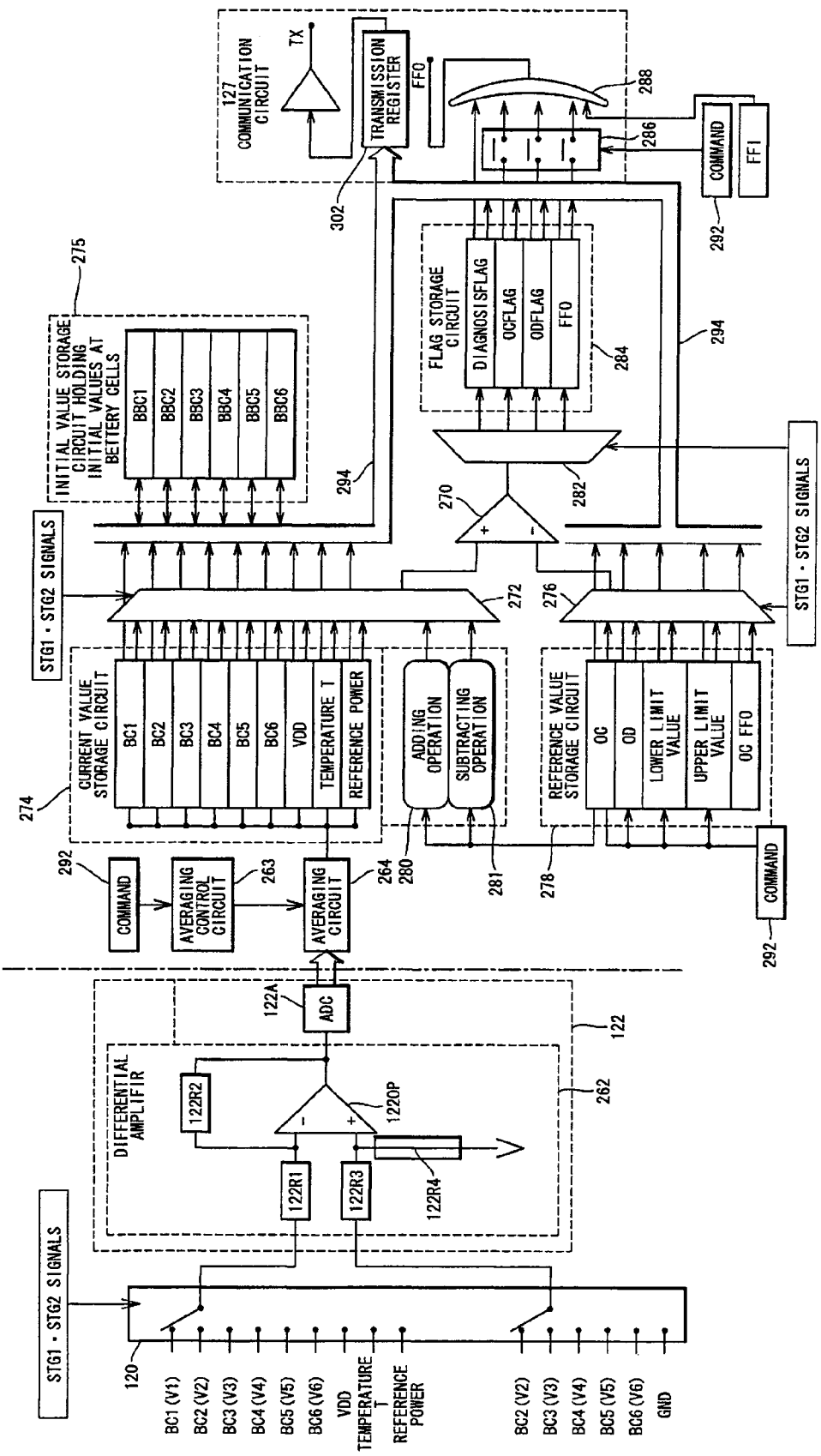
FIG. 6 illustrates a diagnosis target circuit and a circuit engaged in the diagnosis, as achieved in an embodiment.

FIG. 6 shows the measurement circuit and the diagnosis circuit. The selection circuit 120 functions as a multiplexer. The measurement operation executed in the integrated circuit 3A to measure the terminal voltages at the individual battery cells in the group GB1 in the battery module 9 is first described. Based upon the stage signal STGCV1 having been explained in reference to FIG. 4, the selection circuit 120 selects the terminals V1 and V2. As a result, the terminal voltage at the battery cell BC1 shown in FIGS. 1 and 2 is output to the voltage detection circuit 122 via the selection circuit 120.

The voltage detection circuit 122 includes a differential amplifier 262 and the analog/digital converter 122A. The differential amplifier 262 is constituted with an operational amplifier 1220P and resistors 122R1~122R4. The differential amplifier 262 has a function of adjusting potentials different from one another, i.e., a level shift function, and generates an analog output based upon the difference among the voltages at input terminals regardless of the variance in the potentials at the individual input terminals. Consequently, the influence of the potential differences manifesting at the serially connected battery cells relative to the reference potential is eliminated and an output is generated based upon the terminal voltage at the battery cell BC1. The output from the differential amplifier 262 is digitized by the analog/digital converter 122A and the digitized output is then input to an averaging circuit 264. The averaging circuit 264 determines the average value of the values indicated in the results of a predetermined number of measurements. Assuming that the average value has been determined in correspondence to the battery cell BC1, it is held at BC1 in the current value storage circuit 274. The averaging circuit 264 calculates the average value of the values obtained through a predetermined number of measurements indicated at an averaging control circuit 263 and the average value output from the averaging circuit is held at the current value storage circuit 274 mentioned earlier. If the averaging control circuit 263 indicates 1, the output from the analog/digital converter 122A is directly held at BC1 in the current value storage circuit 274 without undergoing averaging operation. If, on the other hand, the averaging control circuit 263 indicates 4, the values indicated in the results of the four measurements of the terminal voltage at the battery cell BC1 are averaged and the average value is held at BC1 in the current value storage circuit 274. While four measurements need to be executed initially at the corresponding stages shown in FIG. 4 in order to calculate the average value of the four measurement values, the averaging operation at the averaging circuit 264 can be subsequently executed following each measurement session by using the four measurement values indicated in the most recent measurement results. As explained earlier, the adverse effect of noise can be eliminated via the averaging circuit 264, which calculates the average value of a predetermined number of measurement values. The DC power from the battery module 9 shown in FIG. 1 is supplied to the inverter where it is converted to AC power. As the DC power is converted to AC power at the inverter, current on/off operation is executed at high speed, generating significant noise. The adverse effect of such noise can be reduced by the averaging circuit 264.

The digital value indicating the terminal voltage at the battery cell BC1, resulting from the digital conversion, is held at the register BC1 in the current value storage circuit 274. The measurement operation described above is executed within the period of time indicated as "measurement" at the stage STGCV1 in FIG. 4. In addition, the diagnosis operation is executed successively during the time period indicated as "measurement" at the stage STGCV1. During the diagnosis operation, over-charge diagnosis and over-discharge diagnosis are executed. The digital value indicating the terminal voltage at the battery cell BC1 is held at the register BC1 in the current value storage circuit 274. Then, based upon the stage signals STG2 and STG1, a digital multiplexer 272 reads out the terminal voltage at the battery cell BC1 from the register BC1 in the current value storage circuit 274 and transmits it to a digital comparator 270. In addition, a digital multiplexer 276 reads out an over-charge decision-making reference value OC from the reference value storage circuit 278 and transmits it to the digital comparator 270. The digital comparator 270 compares the terminal voltage at the battery cell BC1 having been read from the register BC1 with the over-charge decision-making reference value OC and if the terminal voltage at the battery cell BC1 is greater than the over-charge decision-making reference value OC, it sets a flag (diagnosis flag) indicating an abnormality at a flag storage circuit 284. It also sets a flag (OC flag). Occurrence of an actual over-charged state is rare since control is executed so as to prevent such an eventuality. However, the diagnosis is executed repeatedly in order to guarantee a required level of reliability.

Following the over-charge diagnosis, the over-discharge diagnosis is executed. The digital multiplexer 272 reads out the terminal voltage at the battery cell BC1 from the register BC1 in the current value storage circuit 274 and transmits it to the digital comparator 270. In addition, the digital multiplexer 276 reads out an over-discharge decision-making reference value OD from the reference value storage circuit 278 and transmits it to the digital comparator 270. The digital comparator 270 compares the terminal voltage at the battery cell BC1 having been read from the register BC1 with the over-discharge decision-making reference value OD and if the terminal voltage at the battery cell BC1 is less than the over-discharge decision-making reference value OD, it sets a flag (diagnosis flag) indicating an abnormality at the flag storage circuit 284 and also sets a flag (OC flag) As in the case of over-charge diagnosis, the control is executed so as to pre-empt a situation in which an over-discharged state actually occurs, such an over-discharge hardly ever manifests. However, the diagnosis is executed repeatedly in order to guarantee a required level of reliability.

The explanation provided above relates to the measurement and the diagnosis executed for the battery cell BC1 at the stage STGCV1 in FIG. 4. Likewise, the selection circuit 120 in FIG. 6 selects the terminal voltage at the battery cell BC2 and outputs the selected terminal voltage to the voltage detection circuit 122 at the next stage STGCV2. The terminal voltage is digitized at the voltage detection circuit 122, the average value is calculated at the averaging circuit 264 and the average value is held at the register BC2 in the current value storage circuit 274. The terminal voltage at the battery cell B2 read out from the register BC2 by the digital multiplexer 272 is then compared with the over-charge decision-making reference value OC and also the terminal voltage at the battery cell B2 is compared with the over-discharge decision-making reference value OD. An abnormal state is judged through the comparison of the terminal voltage with the over-charge decision-making reference value OC and the comparison of the terminal voltage with the over-discharge decision-making reference value OD. If it is judged to be an abnormal state, a flag (diagnosis flag) indicating an abnormality is set ( ) and a flag (OC flag) or a flag (OD flag) indicating the cause of the abnormality is also set in the flag storage circuit 284.

Subsequently, the terminal voltage at the battery cell BC3 is measured and the over-charge/over-discharge diagnosis is executed for the battery cell BC3 at the stage STGCV3 in FIG. 4. The terminal voltage at the battery cell BC4 is measured and the over-charge/over-discharge diagnosis is executed for the battery cell BC4 at the stage STGCV4 in FIG. 4.

(Diagnosis and Measurement: (5) Measurement of Battery Cell Terminal Voltages and Holding of Initial Data)

In the DC power supply system shown in FIG. 1, no current is supplied from the battery module 9 to the inverter in a vehicle stopped state before the driver starts driving the vehicle. Based upon the terminal voltages at the individual battery cells measured while no charge/discharge currents are flowing through the battery cells, the states of charge (SOCs) of the battery cells can be determined accurately. Accordingly, in response to a vehicle key switch operation or a communication command 292 such as a wake-up request issued from the battery controller 20, the integrated circuits in the embodiment each automatically start measurement operation. At each integrated circuit, the measurement operation and the battery cell diagnosis operation start, as has been described in reference to FIG. 6. Once the measurement has been executed the number of times held in the averaging control circuit 263, the averaging circuit 264 executes arithmetic operation to calculate the average measurement value. The results of the arithmetic operation are held in the current value storage circuit 274. The integrated circuit executes the measurement operation and the measurement result averaging operation for all the battery cells in the corresponding group independently of the other integrated circuits. The arithmetic operation results are held at the registers BC1~BC6 in the current value storage circuit 274 of the particular integrated circuit.

It is desirable to measure the terminal voltages at the individual battery cells while no charge/discharge currents flow through the battery cells, in order to ensure that the state of charge (SOC) at each battery cell is subsequently ascertained accurately. As described above, each integrated circuit starts the measurement operation on its own so as to measure the terminal voltages at all the battery cells corresponding to the particular integrated circuit before the current supply from the battery module 9 to the inverter starts and these terminal voltage measurement values are held at the registers BC1~BC6 in the current value storage circuit 274. Since each measurement value held at the current value storage circuit 274 is subsequently overwritten with a value indicating new measurement results, the measurement results obtained prior to the current supply start are transferred from the registers BC1~BC6 in the current value storage circuit 274 to registers BBC1~BBC6 in the initial value storage circuit 275 to be held therein. Since the measurement values obtained before starting the current supply from the battery module 9 to the inverter are held at the initial value storage device 275 as described above, high priority diagnosis processing can be executed ahead by relegating processing such as calculation of the SOCs to a later step. Once the high priority processing is executed and the current supply from the battery module 9 to the inverter starts, the SOCs of the individual battery cells are determined through arithmetic calculation based upon the measurement values held in the initial value storage circuit 275, enabling control for adjusting the states of charge (SOCs) to be executed based upon accurate state detection. The driver of the vehicle may wish to start driving immediately and, for this reason, it is desirable to immediately start the current supply to the inverter as explained above.

In the embodiment described in reference to FIG. 6, as the measurement values obtained prior to starting the current supply to the electrical load, i.e., the inverter, become held at the current value storage circuit 274, the digital comparator circuit 270 is allowed to execute the over-charge/over-discharge diagnosis and also diagnosis for current leakage or the like. This means that an abnormal state can be detected even before starting the DC power supply to the inverter. If an abnormal state exists, the abnormality can be detected through the diagnosis executed prior to the current supply start, allowing appropriate action such as refraining from supplying DC power to the inverter, to be taken. In addition, the measurement values obtained prior to the current supply start are transferred from the current value storage circuit 274 to the initial value storage circuit 275, which is used as a dedicated storage circuit for holding the preliminary measurement values. In short, the operation executed as described above is markedly advantageous in that better safety is assured and that the states of charge (SOCs) can be ascertained with better accuracy.

(Communication Commands)

Figure 7:
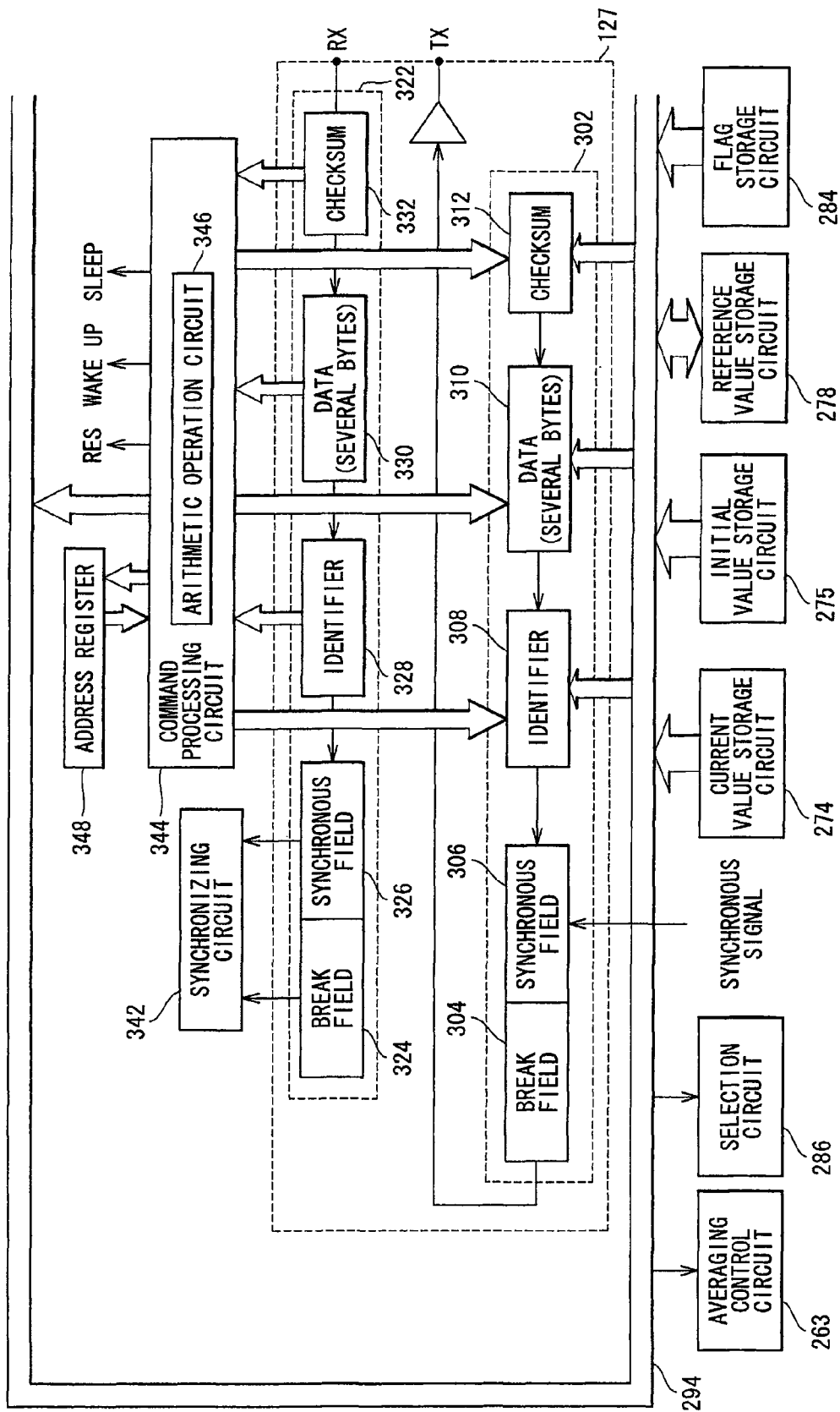
FIG. 7 shows a communication circuit, which is installed within each integrated circuit and is engaged in communication command exchange, as achieved in an embodiment.

The communication circuit 127 via which communication commands are transmitted/received is installed within the integrated circuit 3A shown in FIG. 2. FIG. 7 is a circuit diagram showing the circuit structure and the operation of the communication circuit 127. As explained earlier, the other integrated circuits assume structures identical to that of the integrated circuit 3A and execute operations identical to that executed in the integrated circuit 3A. Accordingly, the operation of the communication circuit 127 is described by referring to the circuit structure assumed in the integrated circuit 3A representing the other integrated circuits as well. A communication command transmitted from the battery controller 20 and received at a reception terminal RX of the communication circuit 127 is constituted with a total of five data segments each corresponding to an 8-bit unit and its basic structure includes five bytes. However, a communication command may sometimes be longer than five bytes, as explained later, and accordingly, the length of communication commands is not limited to five bytes. The communication command is input to a reception register 322 from the terminal RX and is held at the communication register 322. It is to be noted that the reception register 322 is a shift register at which signals input serially from the terminal RX are shifted in sequence in the order with which the signals are input to the reception register 322. The leading segment of the communication command is held as a break field segment 324 at the leading segment of the register and the subsequent segments of the communication command are held in sequence.

The communication command 292 held at the reception register 322 assumes the following structure. The leading eight bits constitute the break field 324 made up with a signal indicating a signal arrival and the second eight bits constitute a synchronous field 326 made up with a synchronizing signal. The third eight bits constitute an identifier 328 indicating a specific integrated circuit among the integrated circuits 3A, . . . , 3M, . . . and 3N, the target address, which indicates the location of the instruction target circuit and the contents of the command. The fourth eight bits are data 330 indicating the communication contents (control contents), which are needed in the execution of the instruction. This segment may contain data other than one-byte data. The fifth eight bits constitute a checksum 332 used to check whether or not there has been any error in the transmission/reception operation with which a failure to communicate the command accurately due to noise or the like can be detected. As described above, the communication commands originating from the battery controller 20 is constituted of five segments, i.e., the break field 324, the synchronous field 326, the identifier 328, the data 330 and the checksum 312. Assuming each segment is constituted with a single byte of data, the overall communication command is constituted with five bytes. While communication commands basically adopt this five-byte structure, the length of the data 330 may be other than one byte. In other words, the length may be increased as necessary.

The synchronous field 326 is used to synchronize a transmission clock on the transmission side and a reception clock on the reception side. A synchronous circuit 342 detects the timing with which the individual pulses of the synchronous field 326 are transmitted and synchronizes itself with the timing with which each pulse of the synchronous field 326 is transmitted. The reception register 322 receives at the subsequent signals with the synchronized timing. Through these measures, the optimal timing with which a received signal is compared with the threshold value used to judge the true value of the signal can be selected accurately so as to minimize the risk of erroneous transmission/reception.

As shown in FIG. 1, the communication command 292 is transmitted from the battery controller 20 to the terminal RX of the integrated circuit 3A, is transmitted from the terminal TX of the integrated circuit 3A to the terminal RX of the succeeding integrated circuit, . . . , is transmitted to the terminal RX of the succeeding integrated circuit 3M, is transmitted from the terminal TX of the integrated circuit 3M to the terminal RX of the succeeding integrated circuit, . . . , is transmitted to the terminal RX of the succeeding integrated circuit 3N and is transmitted from the terminal TX of the integrated circuit 3N to the terminal RX of the battery controller 20. In short, the communication command 292 is communicated through a transmission path 52 constituted by serially connecting the transmission/reception terminals of the individual integrated circuits in a loop.

While the integrated circuit 3A is described as a representative example of all the integrated circuits, and the other integrated circuits assume structures and execute operations identical to those of the integrated circuit 3A. The communication command 292 is transmitted to the terminal RX of the integrated circuit 3A and at each subsequent integrated circuit, the communication command 292 is transmitted from the terminal TX thereof to the next integrated circuit. During this operation, a command processing circuit 344 shown in FIG. 7 makes a decision as to whether or not the instruction target of the communication command 292 having been received is the subject integrated circuit. If the subject integrated circuit is judged to be the instruction target, processing is executed based upon the communication command. The procedure described above is executed at the individual integrated circuits in sequence as the communication command 292 is transmitted and received.

Accordingly, even when the communication command 292 held at the reception register 322 does not concern the integrated circuit 3A, the communication command 292 having been received must be passed on to the succeeding integrated circuit. The contents of the identifier 328 in the received communication command 292 are taken into the command processing circuit 344 and, based upon the identifier thus taken in, the command processing circuit makes a decision as to whether or not the subject integrated circuit 3A itself is the target of the communication command 292. If it is decided that the integrated circuit 3A is not the target of the communication command 292, the contents of the identifier 328 and the data 330 are directly transferred into portions of a transmission register 302 designated as an identifier 308 and data 310 respectively. In addition, a transmission signal is generated within the transmission register 302 by inputting the checksum 312 used to check for any erroneous transmission/reception operation and the transmission signal thus generated is transmitted from the terminal TX. As is the reception register 322, the transmission register 302 is constituted with a shift register.

If the target of the received communication command 292 is the subject integrated circuit itself, the instruction is executed based upon the communication command 292. The command execution is described below.

The target of the received communication command 292 may be all the integrated circuits including the subject integrated circuit. Such a communication command may be, for instance, an RES command, a wake-up command or a sleep command. Upon receiving the RES command, the command processing circuit 344 decodes the contents of the command and outputs an RES signal. As the RES signal is generated, the data held in the current value storage circuit 274, the initial value storage circuit 275 and the flag storage circuit 284 are all reset to the initial value "0." While the data at the reference value storage circuit 278 in FIG. 6 are not initialized to "0", they may also be reset to "0." However, if the contents of the data held at the reference value storage circuit 278 are reset to "0", new diagnosis reference values to be used in the subject integrated circuit while independently executing the measurement and the diagnosis, as shown in FIG. 4, following the RES signal generation, need to be set promptly at the reference value storage circuit 278. In order to avoid such a complication in the operational procedure, the reference value storage circuit 278 in the embodiment adopts a circuit structure in which the contents of the data held therein are not altered in response to the RES signal. Since the attribute of the data held at the reference value storage circuit 278 is such that the data values do not change frequently, the previous values may be directly utilized. If they need to be adjusted, they can be individually altered in response to another communication command 292. In response to the RES signal, the value held at the averaging control circuit 263 assumes a predetermined value, e.g., 16. Namely, unless it is adjusted in response to another communication command 292, the averaging circuit will calculate the average of 16 measurement values.

As the wake-up command is output from the command processing circuit 344, the startup circuit 254 in FIG. 4 is started up and the measurement/diagnosis operation starts. As a result, power consumption at the subject integrated circuit increases. If, on the other hand, a sleep signal is output from the command processing circuit 344, the operation of the startup circuit 254 in FIG. 4 stops and thus, the measurement/diagnosis operation also stops. Under these circumstances, the power consumption at the subject integrated circuit decreases markedly.

Next, the data write/modification executed in response to a communication command 292 is described in reference to FIG. 6. The identifier 328 in the communication command 292 indicates a specific integrated circuit to be selected. If the data 300 constitute a data write instruction for writing data into an address register 348 or the reference value storage circuit 278 or a data write instruction for writing data into the averaging control circuit 263 or the selection circuit 286, the command processing circuit 344 specifies the write target based upon the instruction contents and writes data 330 into the write target register.

The address register 348 holds the address of the subject integrated circuit and the address of the subject integrated circuit is determined based upon the contents of the data held at the address register. The contents of the data held at the address register 348 are set to 0 in response to the RES signal, thereby setting the address of the subject integrated circuit to "0." As the contents of the data held at the address register 348 are modified in response to a new instruction, the address of the subject integrated circuit is switched to that corresponding to the modified contents.

Based upon the communication command 292, the contents of the data held at the reference value storage circuit 278, the flag storage circuit 284, the averaging control circuit 263 and the selection circuit 286 in FIG. 6, as well as the contents of the data stored at the address register 348, can be modified. As a modification target circuit among these circuits is specified, the contents of the data 330 indicating a modified value are provided to the modification target circuit via a data bus 294, thereby modifying the contents of the data held at the target circuit. The circuit in FIG. 6 executes operation based upon the modified data.

The communication command 292 contains a transmission instruction for transmitting data held inside the integrated circuit. The transmission target data are specified based upon the instruction in the identifier 328. For instance, if an internal register in the current value storage circuit 274 or the reference value storage circuit 278 is specified, the contents of the data held at the specified register are transferred via the data bus 294 to the transmission register 302 where they are held in the circuit for the data 310. They are then transmitted as the requested data contents. Thus, the battery controller 20 in FIG. 1 is able to take in a measurement value from a specific integrated circuit or a flag indicating the state of the integrated circuit by issuing the communication command 292.

(Setting Addresses of the Integrated Circuits)

The address registers 348 in the individual integrated circuits 3A, . . . , 3M, . . . and 3N are each constituted with a highly reliable volatile memory and the integrated circuits assume a structure that allows a new address to be set whenever the contents of the volatile memory become lost or the contents of the data held in the volatile memory become unstable. For instance, when the cell controller 80 starts execution, the battery controller 20 may transmit a command for initializing the address registers 348 at the individual integrated circuits. In response to this command, the address registers 348 at the integrated circuits are initialized to, for instance, "0" and then a new address is set at each integrated circuit. The new address is set at each of the integrated circuits 3A, . . . , 3M, . . . and 3N as an address setting command originating from the battery controller 20 is transmitted to the individual integrated circuits 3A, . . . , 3M, . . . and 3N.

Since the addresses of the individual integrated circuits 3A, . . . , 3M, . . . and 3N can be set in response to a command, the integrated circuits do not need to include an address setting terminal or external wiring to be connected to the address setting terminal. In addition, since the addresses can be set through communication command processing, a higher level of control freedom is afforded.

Figure 8:
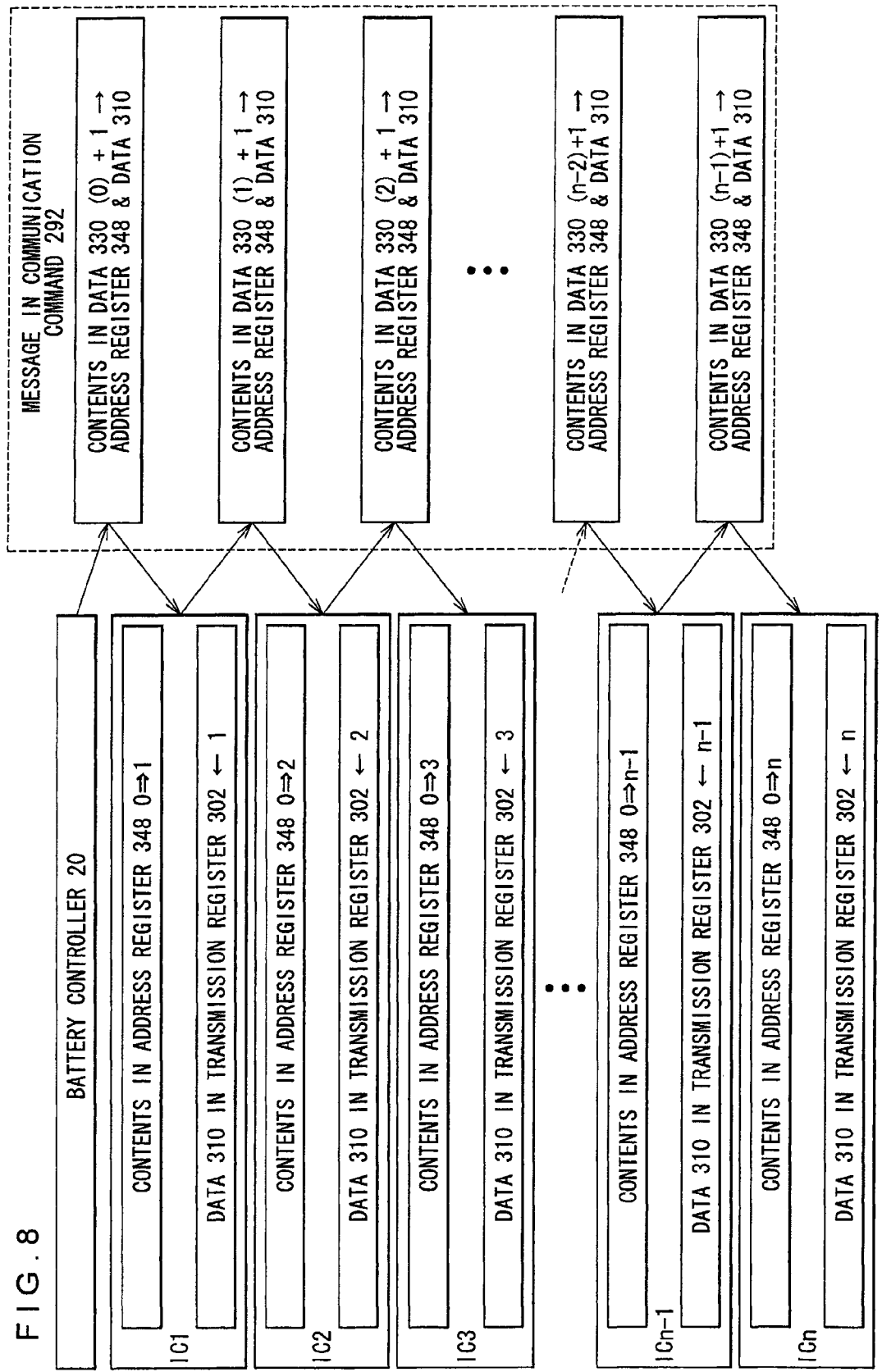
FIG. 8 presents an example of a procedure through which the address register may be set for each integrated circuit based upon a communication command.
Figure 9:
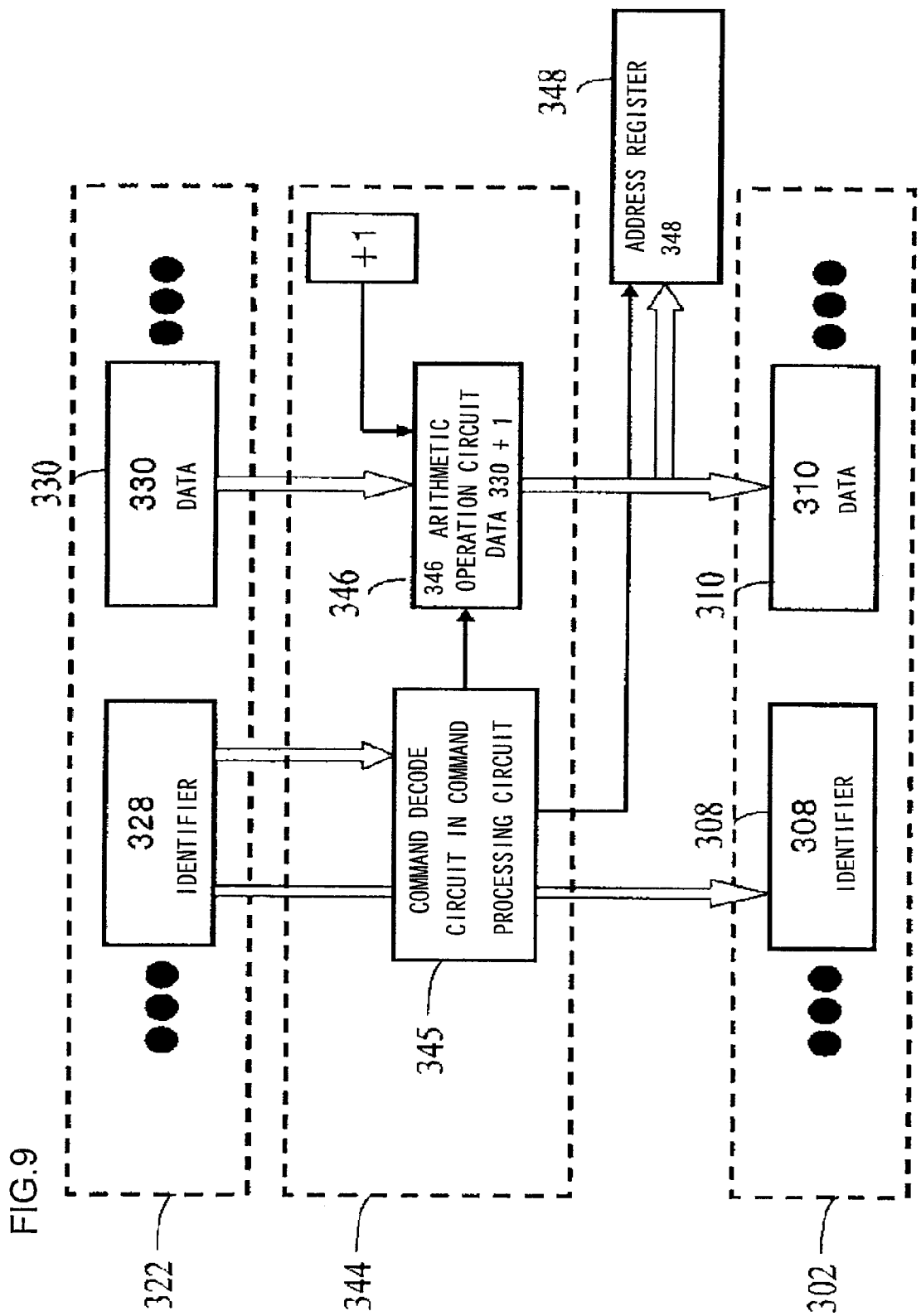
FIG. 9 illustrates the operation executed at the communication circuit in response to transmission of a communication command.

FIG. 8 presents an example of a procedure through which addresses may be set at the address registers 348 of the integrated circuits 3A, . . . , 3M, . . . and 3N in response to a communication command 292 issued from the battery controller 20. FIG. 9 illustrates the operation executed in the circuit shown in FIG. 7 based upon the communication command 292 transmitted as shown in FIG. 8. In FIG. 8, the integrated circuits 3A, . . . , 3M, . . . and 3N are indicated as integrated circuits IC1, IC2, IC3, . . . ICn−1 and ICn assuming a positional arrangement matching the order in which the communication command 292 is transmitted/received. Addresses 1, 2, 3, . . . n−1 and n are respectively set for IC1, IC2, IC3, . . . ICn−1 and ICn through the following method. The numeral assigned to a given integrated circuit IC matches the corresponding address number so as to simplify the explanation provided below. However, it is not necessary that they match.

FIG. 8 illustrates the flow of messages carried in the communication command 292 as it is passed on among the battery controller 20 and the individual integrated circuits IC. FIG. 8 also indicates the contents of the data held at the address registers 348 and the contents of the data 310 held at the transmission registers 302 within the individual integrated circuits IC. First, a communication command 292 for initializing the address registers 348 in all the integrated circuits is transmitted from, for instance, the cell controller 80, thereby initializing the address registers 348 in the integrated circuits to "0." FIG. 8 does not include an illustration of this process. Through this operation, the address registers 348 at the integrated circuits IC1, IC2, IC3, . . . and ICn−1 are made to hold the initial value, i.e., "0." Upon receiving the communication command 292 for initializing the address registers 348 in all the integrated circuits, as shown in FIG. 9, the integrated circuit IC1 holds the communication command 292 at the reception register 322. A command decode circuit 345 in the command processing circuit 344 takes in the contents of the identifier 328 and initializes the address register 348 based upon the initialization message. The contents of the identifier 328 are directly set at the identifier 308 at the transmission register 302 and are then transmitted to the succeeding integrated circuit IC2. The integrated circuits IC execute this operation in sequence upon receiving the communication command 292 for initializing the address registers 348 and, as a result, the address registers at all the integrated circuits IC become initialized. Ultimately, the command is sent back from the integrated circuit ICN to the battery controller 20 which is then able to verify that the address registers 348 in all the integrated circuits IC have been initialized.

Based upon the verification described above, a new address is subsequently set at each integrated circuit IC. More specifically, the battery controller 20 transmits a communication command 292 carrying a message "set the instruction execution target address to "0", set the value indicated by the data 330 to "0" and set a value obtained by adding "1" to the value of the data 330 for the address register 348 and the transmission data 310." This communication command 292 is input to the reception register 322 of the integrated circuit IC1 taking up the first position in the transmission path 52. The data segment corresponding to the identifier 328 in the communication command 292 is then taken into the command decode circuit 345. Since the address register 348 in the integrated circuit IC1 holds data indicating "0" at the time of the reception, (1) the value obtained by adding "1" to "0" indicated by the data 330 is set at the address register 348 and (2) the sum resulting from the addition is set as the data 310 at the transmission register 302.

Based upon the data decoded via the command decode circuit 345 in FIG. 9, an arithmetic operation circuit 346 takes in the value "0" indicated by the data 330 and then adds "1" to the value thus taken in. The result of the addition, i.e., "1", is set in the address register 348 and is also set as the data 310. This operation is now described in reference to FIG. 8. As the communication command 292 originating from the battery controller 20 is received at the integrated circuit IC1, the data at the address register 348 in the integrated circuit IC1 assume the value "1" and the data 310 also assume the value "1." The data 310 in the communication command 292, modified to indicate "1" in the integrated circuit IC1 are then transmitted to the integrated circuit IC2. The identifier 308 in the communication command 292 transmitted from the integrated circuit IC1 remains unchanged from that is the communication command initially transmitted from the battery controller 20 and the contents of the data 310 alone are modified.

As data indicating "0" are held at the address register 348 in the integrated circuit IC2, the arithmetic circuit 346 in the integrated circuit IC2 adds "1" to the value "1" indicated in the data 330 and sets the sum at the address register 348 and for the data 310 in the integrated circuit IC2, as shown in FIG. 9. Thus, the value indicated at the address register 348 in the integrated circuit IC2 is switched from "0" to "2." As illustrated in FIG. 8, the value indicated at the address register 348 in the integrated circuit IC2 is switched from "0" to "2" and the data 310 at the transmission register 302 are modified to indicate "2". The modified data 310 are then transmitted to the succeeding integrated circuit IC3. In a similar manner, the value indicated at the address register 348 in the integrated circuit IC3 is switched from "0" to "3" and the data 310 in the transmission register 302 in the integrated circuit IC3 are modified to indicate "3."

Subsequently, the operation described above is repeatedly executed in sequence and eventually the value indicated at the address register 348 in the integrated circuit ICn−1 is switched from "0" to "n−1" and the data 310 in the transmission register 302 in the integrated circuit ICn−1 are modified to indicate "n−1". The data indicating "n−1" are then transmitted to the succeeding integrated circuit ICn. The value held at the address register 348 of the integrated circuit ICn is switched from "0" to "n" and the data 310 at the transmission register 302 are modified to indicate "n." The communication command 292 is then returned from the integrated circuit ICn to the battery controller 20. Since the data 330 in the returned communication command 292 have been modified to indicate "n", the battery controller 20 is able to verify that the address setting operation has been executed correctly.

At the address registers 348 in the individual integrated circuits IC1, IC2, IC3, IC4, . . . , ICn−1 and ICn, 1, 2, 3, 4, . . . , n−1 and n are respectively set in sequence through this procedure.

The integrated circuits in the embodiment all have a function with which the address registers 348 at the individual integrated circuits are reset to the initial value (0), and thus, the address setting operation can be executed reliably.

(Another Embodiment of Address Setting)

Figure 10:
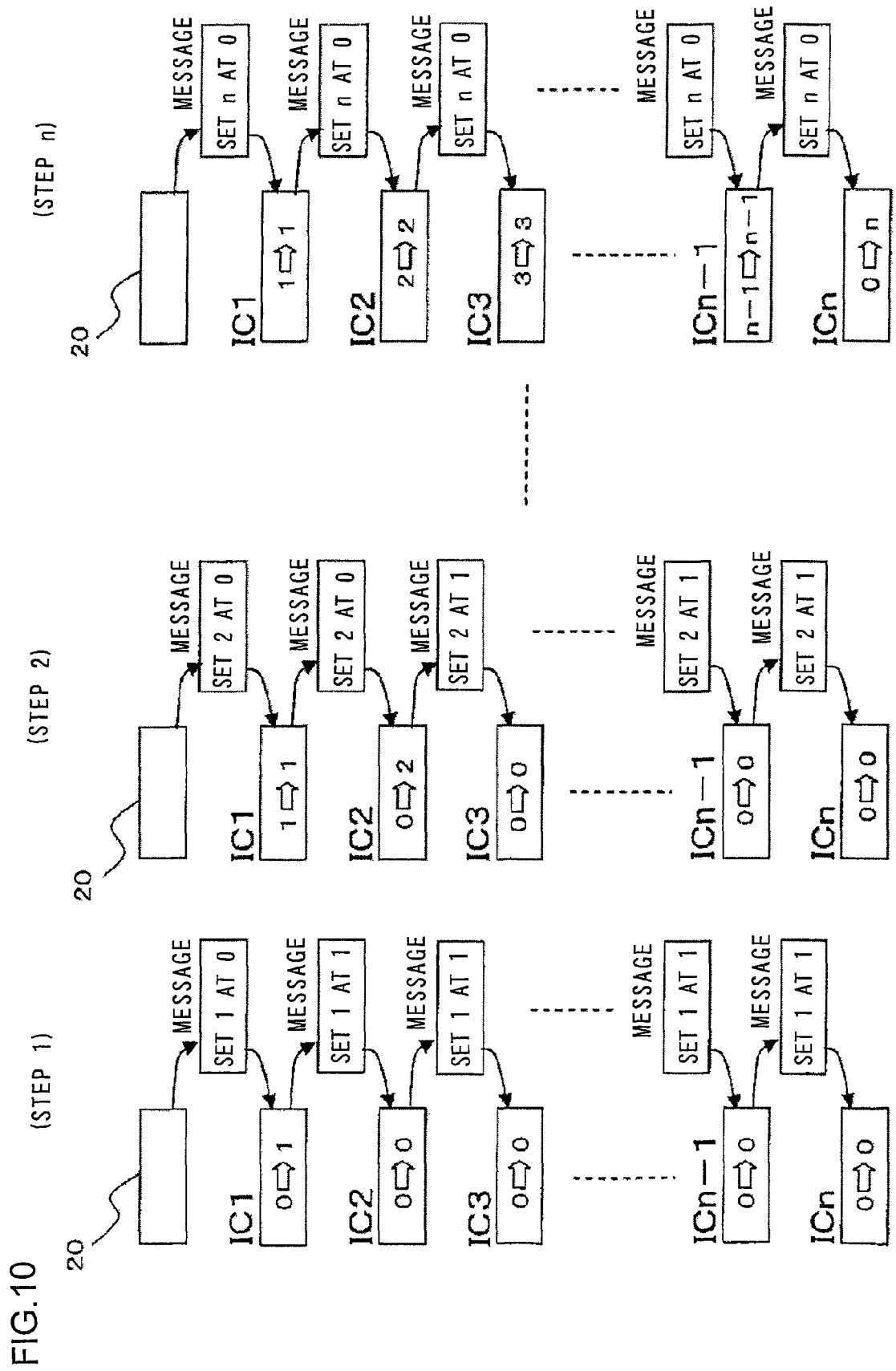
FIG. 10 illustrates the procedure through which addresses are sequentially set at the individual integrated circuits based upon the communication command.

In reference to FIG. 10, another embodiment that may be adopted when sequentially setting addresses by transmitting a communication command 292 from the battery controller 20 to the integrated circuits IC1, IC2, IC3, IC4, . . . , ICn−1 and ICn in FIG. 9 is explained.

First, as in the operation described in reference to FIGS. 8 and 9, a communication command 292 carrying a message "initialize the contents in the address registers 348 of all the integrated circuits to, for instance, '0'" is transmitted from the battery controller 20 so as to reset the contents of the data held in the address registers 348 of all the integrated circuits to "0." Next, in step 1 in FIG. 10, the battery controller 20 transmits a communication command 292 carrying a message "designate an integrated circuit with its address set at '0'" (initial value) as a target, change the contents of the data held in the address register 348 thereof to '1' and thus set the address of the target integrated circuit to which the transmitted communication command 292 is directed to '1.' "In this situation, the address of the target integrated circuit to which the transmitted communication command 292 is directed may be set to a value other than "1" as long as it is set to a value other than "0" (initial value).

As shown in FIG. 1, the integrated circuit that receives the communication command 292 first is the integrated circuit IC1 (3A) assuming the first position in the transmission path 52. At the communication circuit 127 of the integrated circuit IC1 structured as shown in FIG. 7, the communication command 292 is held in the reception register 322. Since the address register 348 in the integrated circuit IC1 already indicates "0" (initial value), the command processing circuit 344 judges based upon the identifier 328 that the integrated circuit IC1 is a target integrated circuit where the communication command 292 is to be executed as indicated in the message therein. As indicated in the message in the communication command 292, the command processing circuit 344 modifies the contents in the address registers 348 to "1." Then, the contents in the identifier 308 in the transmission register 302 are modified so as to switch the address of the target integrated circuit to execute the communication command 292 to "1." The modified communication command 292 is transmitted from the transmission terminal TX to the succeeding integrated circuit IC2.

The contents of the address of the data held in the address register 348 of the integrated circuit IC2 that receives the communication command 292 next indicate "0" (initial value) and accordingly, the command processing circuit 344 in the integrated circuit IC2 judges that the integrated circuit IC2 is not a target integrated circuit to execute the communication command. Thus, the received communication command 292 is directly set in the transmission register 302 and the unaltered communication command 292 is transmitted to the subsequent integrated circuit. At the integrated circuit IC3 and all subsequent integrated circuits IC, where the contents of the data held in the address registers 348 invariably indicate "0" (initial value), the subject integrated circuits are each judged not to be a target integrated circuit to execute the communication command. Consequently, the communication command 292 is returned to the battery controller 20 without any of the subsequent integrated circuits executing the communication command.

Upon verifying that the communication command 292 has been returned, the battery controller 20 transmits in step 2 in FIG. 10 a communication command 292 carrying a message "designate an integrated circuit with the address thereof indicating '0' (initial value), modify the contents in the address register 348 to '2' and set the address of the target integrated circuit to which the transmitted communication command 292 is directed to '2.'" In this situation, the address of the target integrated circuit to which the transmitted communication command 292 is directed may be set to a value other than "2" as long as a given address setting is not replicated. The contents of the data held in the address register 348 of the integrated circuit IC1 that receives the communication command 292 first indicate "1" and accordingly, the command processing circuit 344 in the integrated circuit IC1 judges that the integrated circuit IC1 is not a target integrated circuit to execute the communication command. Thus, the received communication command 292 is directly transmitted to the succeeding integrated circuit IC2.

The value indicated at the address register 348 in the integrated circuit IC2 that receives the communication command next is "0" and, accordingly, its command processing circuit 344 executes the communication command 292, sets "2" at the address register 348, modifies the address of the target to execute the communication command 292 to "2" and then transmits the communication command to the subsequent integrated circuit. Since the values held at the address registers 348 at the integrated circuits IC3 and all subsequent integrated circuits are invariably "0" and thus none of these integrated circuits is an execution target, the communication command 292 is returned to the battery controller 20 without any of the subsequent integrated circuits executing the communication command.

Subsequently, as the battery controller 20 transmits communication commands 292 in sequence, the contents of the address register 348 in the integrated circuit IC3 are modified from "0" to "3", the contents of the address register 348 in the integrated circuit IC4 are modified from "0" to "4" and so forth, until the contents in the address register 348 of the integrated circuit ICn are modified from "0" to "n."

(Adjustment of the States of Charge SOCs)

Figure 11:
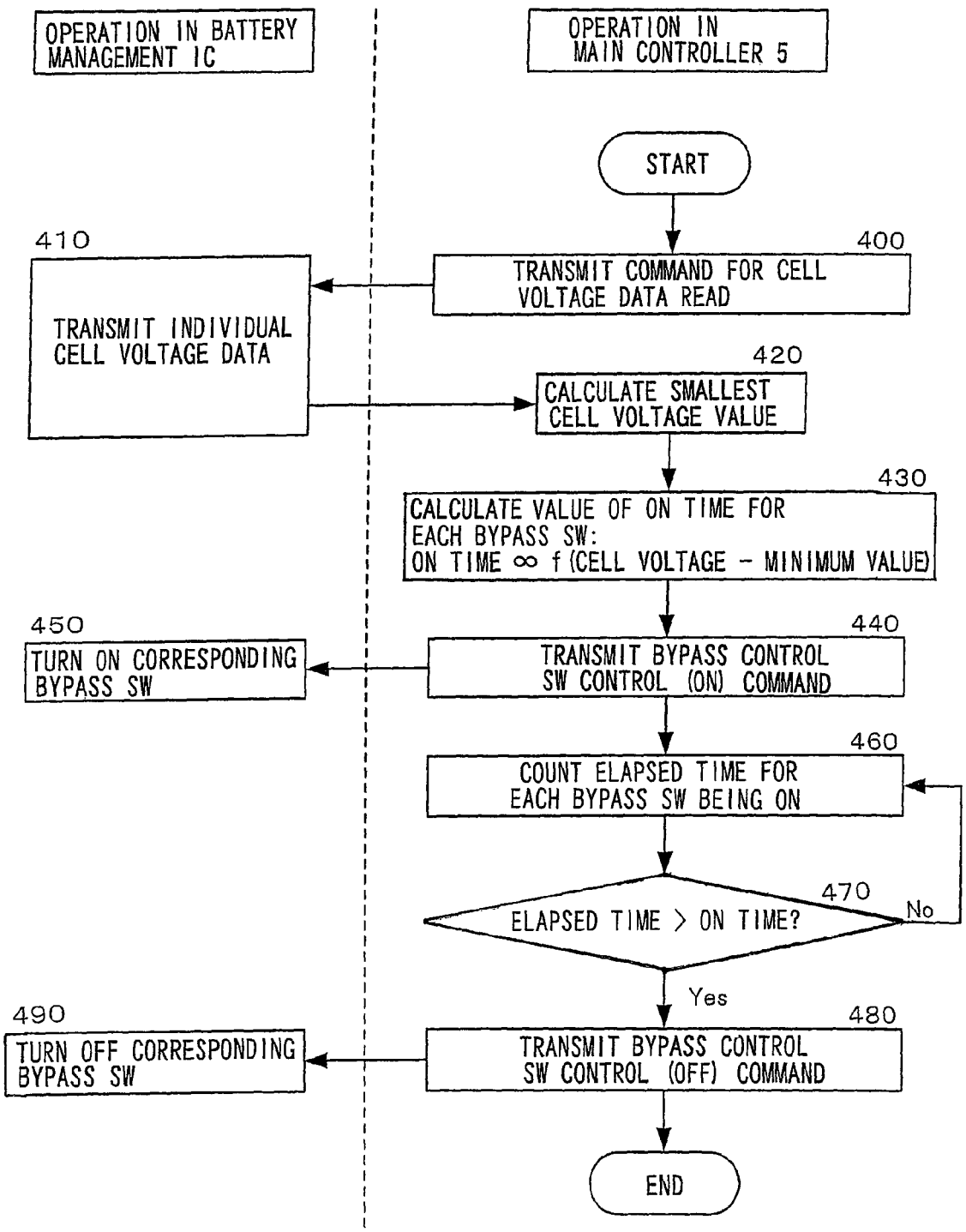
FIG. 11 presents a flowchart of an example of processing through which the state of charge at each battery cell is measured and any battery cell indicating a large charge quantity is discharged.

FIG. 11 presents a flowchart of the processing through which the states of charge SOCs at the battery cells in the battery module 9 are measured, battery cells charged to significant extents are selected, the required discharge time is determined through arithmetic operation for each of the selected battery cells and the battery cells are discharged accordingly. In the figure, the operation executed at each integrated circuit is indicated on the left side and the operation executed at the battery controller 20 is indicated on the right side.

In step 400 in FIG. 11, the battery controller 20 transmits a communication command 292 for the integrated circuit 3A designated as the command target, requesting that the voltages at the battery cells in the initial state be read. As the integrated circuit 3A receives the communication command 292, the command processing circuit 344 in FIG. 7 sets the contents held at the initial value storage circuit 275 as the data 310 in the transmission register 302 and the data thus set are transmitted to the next integrated circuit (step 410).

The battery controller 20 then designates the integrated circuit succeeding the integrated circuit 3A for the read of the voltages at the battery cells in the initial state. It further takes in the data from the integrated circuits 3M and 3N in sequence. Consequently, the voltage values at all the battery cells in the battery module 9 in the initial state are taken in from the initial value storage circuit 275 of the individual integrated circuits.

Next, in step 420, the battery controller 20 takes in the values of the voltages measured at all the battery cells in the battery module 9 and determines through arithmetic operation the state of charge SOC of each battery cell based upon the information thus taken in. The average of the values having been determined through the arithmetic operation is then calculated and, in step 430, the length of time over which the corresponding balancing switch among the balancing switches 129A~129D, needs to remain in a continuous state in order to adjust the SOC of any battery cell indicating a value greater than the average value is calculated. The length of time over which the balancing switch 129A, 129B, 129C or 129D is to remain in the continuous state may be determined through any of various methods other than that described above. Through any of these methods, the length of time over which the balancing switch 129A, 129B, 129C or 129D correlated to the battery cell with the SOC thereof indicating a large value is to remain in the continuous state can be determined.

Next, in step 440, the battery controller 20 transmits a communication command 292 containing information indicating the length of time the balancing switch is to remain in the continuous state to the corresponding integrated circuit.

In step 450, the integrated circuit, having received the information indicating the required length of time sets the balancing switch in the continuous state based upon the command.

In step 460, the length of time elapsing while the balancing switch remains in the continuous state is measured. In step 470, the length of time having elapsed in the continuous state is compared with the required length of time over which the particular balancing switch needs to remain in the continuous state and a decision is made as to whether or not the measured value indicating the elapsed time has become equal to the required length of time having been calculated. Once the measured value indicating the elapsed time becomes equal to the required length of time calculated for the particular balancing switch, the operation shifts into the next step 480.

In step 480, the battery controller 20 transmits a communication command 292 to the corresponding integrated circuit for opening the balancing switch having remained in the continuous state over a length of time matching the calculated length of power supply time. In response to this communication command 292, in step 490, the corresponding integrated circuit sets the target balancing switch specified in the communication command 292 in the open state by stopping the drive signal originating from the discharge control circuit 132. As a result, the discharge of the corresponding battery cell stops.

(Test Executed to Determine Whether or not the Individual Integrated Circuits and the Like are in an Abnormal State)

Figure 12:
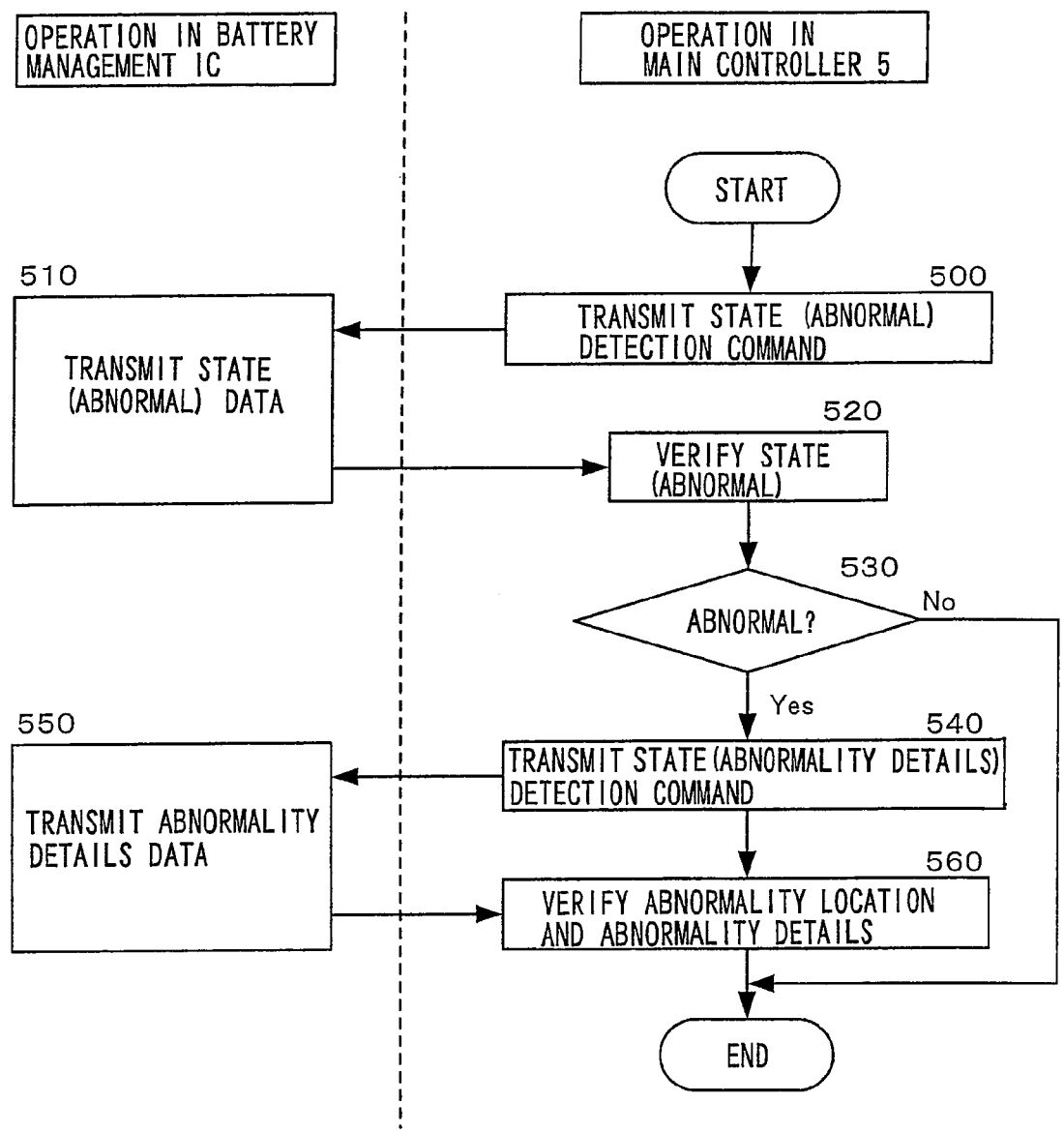
FIG. 12 presents a flowchart of an example of processing through which each integrated circuit or each battery cell is tested for abnormality.

FIG. 12 presents a flowchart of the processing executed to test whether or not the individual integrated circuits 3A, . . . , 3M, . . . and 3N or the individual battery cells are in an abnormal state. In the figure, the operation executed in each of the integrated circuits 3A, . . . , 3M, . . . and 3N is indicated on the left side and the operation executed at the main controller 20 is indicated on the right side.

In step 500, the battery controller 20 transmits a communication command for state (abnormality) detection to the integrated circuit 3A. Next, in step 510, the state (abnormality) detection communication command is transmitted from the integrated circuit 3A to be passed on to the integrated circuits . . . , 3M, . . . and 3N in sequence before it is ultimately returned to the battery controller 20.

In step 520, the battery controller 20 receives state (abnormality) information having been transmitted from the individual integrated circuits and verifies the states (abnormality) indicated in the received information. Next, in step 530, the battery controller 20 makes a decision as to whether or not an abnormality has occurred at any of the integrated circuits 3A, . . . , 3M, . . . and 3N or whether or not an abnormality has occurred at any of the battery cells BC1~BC4 in each group. If it is decided that no abnormality has occurred at any integrated circuit or the corresponding battery cells, the flow ends. However, if it is decided that an abnormality has occurred at any of the integrated circuits 3A, . . . , 3M, . . . and 3N, the operation shifts into step 540.

In step 540, the battery controller 20 transmits a communication command for state (abnormality details) detection to determine the particulars of the abnormality by specifying the address of the integrated circuit where the abnormality has occurred.

In step 550, the integrated circuit with the specified address transmits the measurement value attributed to the abnormal state (abnormality details) or the diagnosis results indicating the abnormal state. In step 560, the battery controller 20 verifies the integrated circuit where the abnormality has occurred and the cause of the abnormality. Once the cause of the abnormality is verified, the processing in FIG. 12 ends. Subsequently, based upon the cause of the abnormality, a decision is made as to whether or not to supply the DC power from the lithium batteries or whether or not to charge the lithium batteries with generated power. In the event of an abnormality, the power supply is stopped by setting the relay disposed between the DC power supply system and the electrical load such as the inverter in the open state.

(Vehicle Power Supply System)

Figure 13:
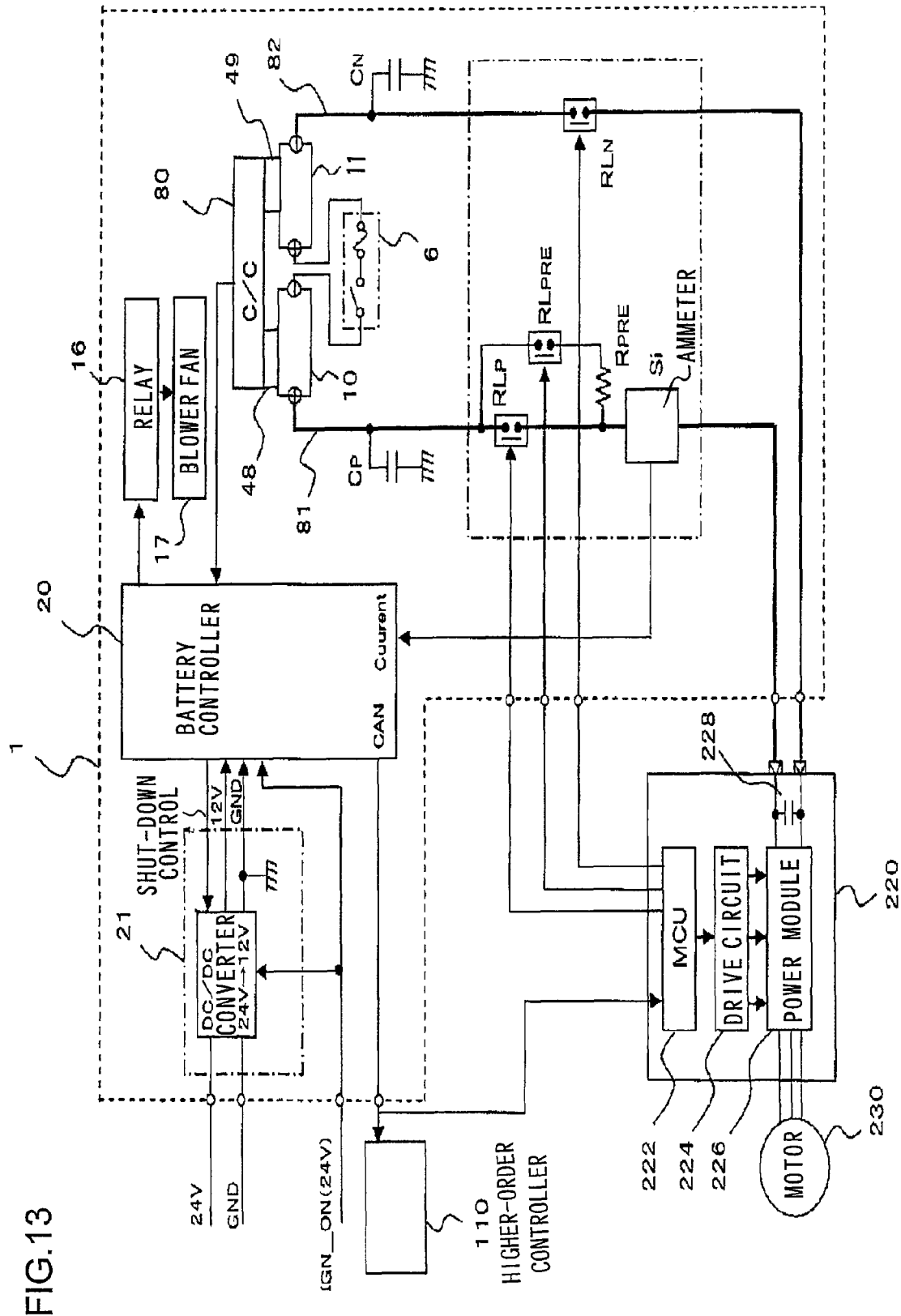
FIG. 13 is a circuit diagram presenting an application example in which a DC power supply system is adopted in a drive system for a vehicle rotating electrical machine.

FIG. 13 is a circuit diagram of the DC power supply system described above in reference to FIG. 1, adopted in a drive system for a vehicle rotating electrical machine. It is to be noted that the battery cells constituting the battery module 9 in FIG. 13 are divided into two blocks, a high potential-side block 10 and a low-potential-side block 11. The high potential-side block 10 and the low-potential-side block 11 are connected in series via an SD (service disconnect) switch 6, which is constituted by serially connecting a switch and a fuse and is installed for purposes of maintenance/inspection.

The positive pole of the high potential-side block 10 is connected to the positive pole of an inverter 220 via a positive pole high-rate cable 81 and a relay RLP. The negative pole of the low-potential-side block 11 is connected to the negative pole of the inverter 220 via a negative pole high-rate cable 82 and the relay RLN. The high potential-side block 10 and the low-potential-side block 11, connected in series via the SD switch 6 together constitute a high-rate battery with a nominal voltage of, for instance, 340 V and a capacity of 5.5 Ah. It is to be noted that the rated current of the fuse in the SD switch 6 may be, for instance, approximately 125 A. By adopting this structure, an even higher level of safety is assured.

As described earlier, the relay RLN is disposed between the negative pole of the low-potential-side block 11 and the inverter 220 and the relay RLP is disposed between the positive pole of the high potential-side block 10 and the inverter 220. A parallel circuit constituted with a resistor RPRE and a pre-charge relay RLPRE is connected in parallel to the relay RLP. A ammeter Si such as a Hall element or the like, which is installed in a junction box, is inserted between the positive pole-side main relay RLP and the inverter 220. It is to be noted that the output line of the ammeter SI is led out to the battery controller 20 so as to enable the inverter 220 to constantly monitor the quantity of current supplied from the lithium battery DC power source.

The rated current of the relays RLP and RLN may be approximately 80 A, whereas the rated current of the pre-charge relay RLPRE may be approximately 10 A. In addition, a resistor with a rated capacity of 60 W and assuming a resistance value of approximately 50Ω may be utilized as the resistor RPRE. The rated current of the ammeter Si may be approximately ±200 A.

The negative pole high-rate cable 82 and the positive pole high-rate cable 81 are connected to the inverter 220 that drives a motor 230 of a hybrid vehicle, via the relay RLP and the relay RLN respectively and also via an output plug. This structure assures a high level of safety.

The inverter 220 is constituted with a power module 226, an MCU 222, a drive circuit 224 via which the power module 226 is driven and a large capacity smoothing capacitor 228 with a capacity of approximately 700 µF~2000 µF. The power module 226 constitutes an inverter that converts the DC power supplied from the high-rate battery power source with a nominal voltage of 340 V to three-phase AC power to be used to drive the motor 230. A smoothing capacitor 228 constituted with a film capacitor rather than an electrolytic capacitor will provide better characteristics. The environment surrounding the vehicle is a factor that determines the condition under which the smoothing capacitor 228 installed in the vehicle operates. The smoothing capacitor 228 is likely to operate over a wide temperature range of, for instance, from a low temperature such as −20° C. or −30° C. to 100° C. When the temperature becomes lower than 0° C., the characteristics of an electrolytic capacitor will drastically deteriorate and its voltage noise removal performance will be negatively affected. Under such circumstances, the integrated circuits shown in FIGS. 1 and 2 may be subjected to very significant noise. The characteristics of a film capacitor, on the other hand, are not significantly compromised even at very low temperatures and thus, voltage noise applied to the integrated circuits can be effectively reduced with the film capacitor.

In response to an instruction issued from a higher-order controller 110, the MCU 222 charges the smoothing capacitor 228 by first switching the negative pole-side relay RLN from the open state to the closed state and then switching the pre-charge relay RLPRE from the open state to the closed state to drive the motor 230. Subsequently, it switches the positive pole-side relay RLP from the open state to the closed state thereby starting power supply from the high-rate batteries in a power supply system 1 to the inverter 220. It is to be noted that when braking the hybrid vehicle, the inverter 220 executes regenerative braking control by controlling the phase of the AC power generated at the power module 226 relative to the rotor of the motor 230 and engaging the motor 230 in operation as a generator, so as to charge the high-rate batteries with the power regenerated through generator operation. If the state of charge at the battery module 9 becomes lower than the reference level, the inverter 220 engages the motor 230 in operation as a power generator and charges the battery module 9. The three-phase AC power generated at the motor 230 is converted to DC power via the power module 226 and the DC power resulting from the conversion is then supplied to the battery module 9 constituted with the high-rate battery.

As described above, the inverter 220, which includes the power module 226, executes DC/AC power conversion. When the motor 230 is to be engaged in operation as a motor in response to an instruction issued by the higher-order controller 110, the drive circuit 224 is controlled so as to generate a rotating magnetic field along the advancing direction relative to the rotation of the rotor in the motor 230 in order to control the switching operation at the power module 226. In this situation, DC power is supplied from the battery module 9 to the power module 226. The drive circuit 224 may instead be controlled so as to generate a rotating magnetic field along the retarding direction relative to the rotation of the rotor in the motor 230 to control the switching operation at the power module 226. Under such circumstances, power is supplied from the motor 230 to the power module 226 and DC power from the power module 226 is then supplied to the battery module 9. As a result, the motor 230 functions as a power generator.

The power module 226 in the inverter 220 executes on/off operation at high speed to achieve DC/AC power conversion. At this time, a large electric current may be cut off at high-speed and, in such a case, a significant voltage fluctuation will occur due to the inductance of the DC circuit. The large capacity smoothing capacitor 228 is installed in the DC circuit in order to inhibit such a voltage fluctuation. The heat generated at the power module 226 poses a serious problem in the on vehicle inverter 220 and the speed with which the power module 226 is switched into the continuous state and the cut off state must be increased in order to inhibit heat generation. However, if the operation speed is raised, the extent to which the voltage jumps due to inductance also increases, which, in turn, generates more noise. For this reason, the smoothing capacitor 228 tends to assume a greater capacity.

At the start of operation of the inverter 220, the smoothing capacitor 228 holds substantially no electrical charge and, as the relay RLP is closed, a large initial current starts to flow in. Since the large initial current flows into the smoothing capacitor 228 from the high-rate battery, the negative pole-side main relay RLN and the positive pole-side main relay RLP may become fused and damaged. In order to prevent this, the MCU 222 first switches the negative pole-side relay RLN from the open state to the closed state, switches the pre-charge relay RLPRE from the open state to the closed state while holding the positive pole-side relay RLP in the open state and charges the smoothing capacitor 228 by regulating the maximum current via the resistor RPRE. Once the smoothing capacitor 228 is charged to a predetermined voltage, the initial state is cleared and the negative pole-side relay RLN and the positive pole-side relay RLP are set in the closed state so as to supply the DC power from the power supply system 1 to the power module 226 without engaging the pre-charge relay RLPRE or the resistor RPRE in operation. Under this control, the relay circuit is effectively protected and the maximum current that may flow through the lithium battery cells and the inverter 220 is regulated so as not to exceed a predetermined value, thereby assuring a high level of safety.

Since the occurrence of noise voltage can be inhibited by reducing the inductance in the DC-side circuit of the inverter 220, the smoothing capacitor 228 is disposed in close proximity to a DC-side terminal of the power module 226. In addition, the smoothing capacitor 228 itself assumes a structure that reduces the inductance. As the smoothing capacitor 228 structured as described above undergoes the initial charge, a large electrical current flows in momentarily and significant heat generated at this time may damage the smoothing capacitor. However, the extent of such damage can be lessened via the pre-charge relay RLPRE and the resistor RPRE. While the MCU 222 controls the inverter 220, the initial charge of the smoothing capacitor 228 is also executed under control of the MCU 222.

A capacitor CN is inserted between a connecting cable, which connects the negative pole of the high-rate battery in the power supply system 1 with the negative pole-side relay RLN, and the case ground (assuming a potential equal to that at the vehicle chassis). A capacitor CP is inserted between a connecting cable, which connects the positive pole of the high-rate battery with the positive pole-side relay RLP, and the case ground. The capacitors CN and CP are installed in order to prevent erroneous operation of the low-rate electrical circuit and destruction of the integrated circuit IC constituting the cell controller 80 due to a surge voltage, by eliminating noise generated via the inverter 220. While the inverter 220 includes a noise removal filter, the capacitors CN and CP are installed so as to even more effectively prevent erroneous operations of the battery controller 20 and the cell controller 80 and improve the noise withstanding reliability of the power supply system 1. It is to be noted that in FIG. 13, the high-rate electrical circuit in the power supply system 1 is indicated by the bold line. The high-rate electrical circuit is wired by using a flat copper wire with a large sectional area.

It is to be noted that a blower fan 17 in FIG. 13, which cools the battery module 9, is engaged in operation via a relay 16 that is turned on in response to a command from the battery controller 20.

(Operational Flow in the Vehicle Power Supply System)

Figure 14:
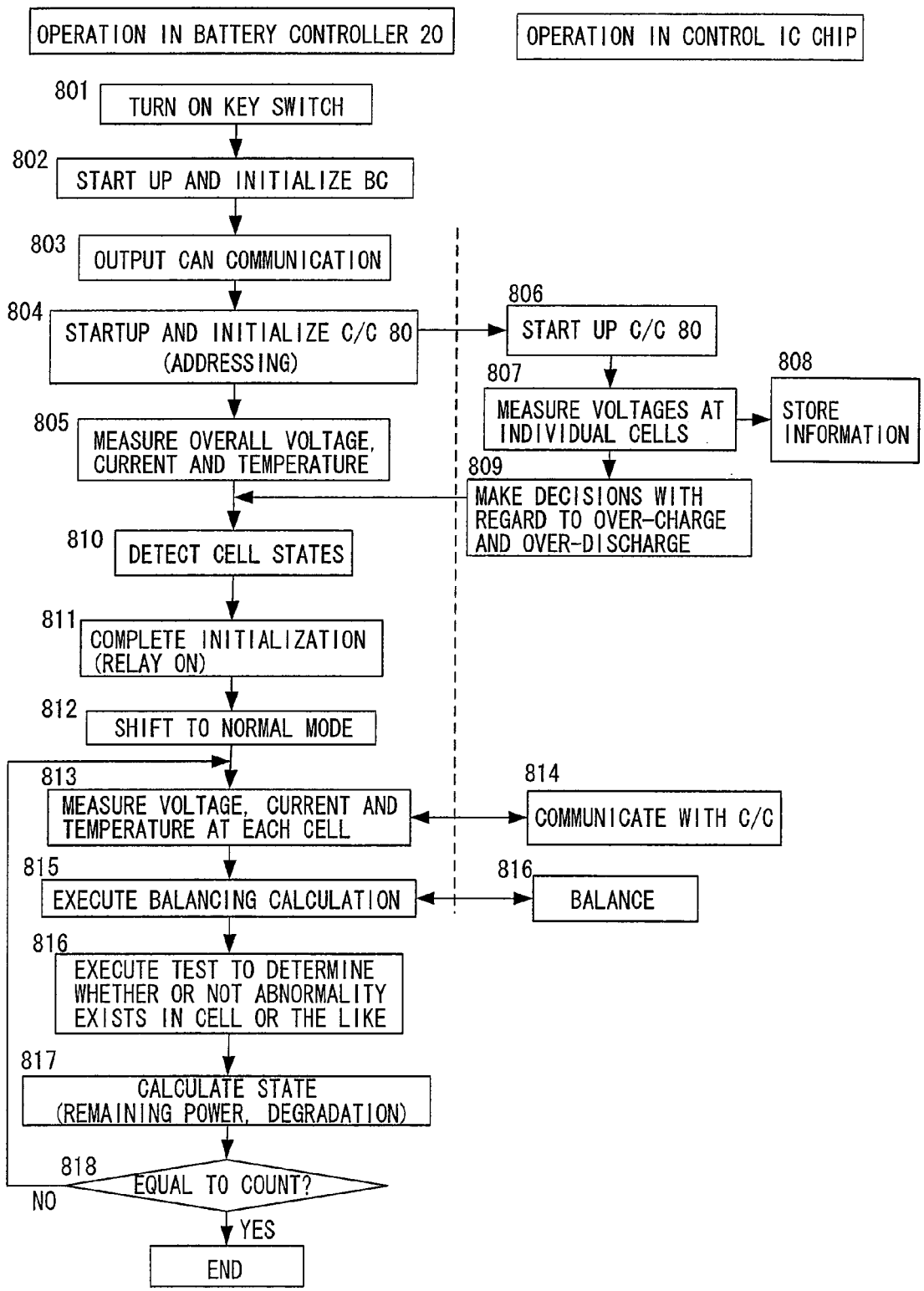
FIG. 14 presents a flowchart of an example of an operation that may be executed in the vehicle power supply system in FIG. 13.

FIG. 14 presents a flowchart of the operation executed in the vehicle power supply system shown in FIG. 13. The following is a step by step description of the operational flow.

In step 801, as the key switch in the vehicle is turned on to start the engine, a specific operation is performed to switch the vehicle in a stationary state to a traveling state or the integrated circuits shift from the sleep state to the wake-up state. Then in step 802, the battery controller 20 is started up and initialized.

Next, CAN communication is executed in step 803. As a result, a blank message is output to each controller so as to verify the state of communication among the individual control devices. In step 804, the battery controller 20 transmits a startup/initialization communication command 292 to the cell controller 80.

Upon receiving the communication command 292, the integrated circuits 3A, . . . , 3M, . . . and 3N each enter the wake-up state, the startup circuit 254 in FIG. 4 in each integrated circuit starts operation and the address registers 348 in the individual integrated circuits are initialized based upon the output from the command processing circuits 344 described in reference to FIG. 7. Subsequently, new addresses are set at the individual integrated circuits IC as has been explained in reference to FIGS. 8 and 10.

In step 805, the voltage and the current at the overall battery constituted with the individual battery cells all connected in series are respectively detected via the voltmeter Vd and the ammeter Si shown in FIG. 1 and the outputs are input to the battery controller 20. In addition, a temperature sensor (not shown) measures the temperature.

In addition, as the startup/initialization communication command 292 is received at the cell controller 80 in step 804 and each of the integrated circuits 3A, . . . , 3M, . . . and 3N receives the communication command 292, the first stage counter 256 and the second stage counter 258 at each integrated circuit described in reference to FIG. 4, start operation (step 806) and the measurement operation is executed repeatedly as indicated in the operation table 260 (step 807). As has been described in reference to FIGS. 4 and 6, the integrated circuits each measure the terminal voltages at the battery cells therein in step 807. The measurement values thus obtained are then stored into the current value storage circuit 274 and the initial value storage circuit 275 (step 808). Based upon the results of the battery cell voltage measurement executed in step 807, the integrated circuits each make a decision in step 809 with regard to whether or not any of the battery cells is over-charged or over-discharged. In the event of an abnormality, the diagnosis flag is set in the flag storage circuit 284 in FIG. 6 and thus, the battery controller 20, detecting the diagnosis flag, is able to detect the abnormality. Since the individual integrated circuits execute the battery cell voltage measurement and the battery cell abnormality diagnosis independently of one another, the states of all the battery cells can be diagnosed quickly even if the battery module 9 is constituted with numerous battery cells. Consequently, the states of all the battery cells are diagnosed before turning on the relays RLP and RLN, assuring a high level of safety.

Upon verifying that the state of each battery cell has been detected in step 810, the initialization is completed in step 811 and also, it is verified that no abnormal state exists if no diagnosis flag has been set in a flag storage circuit 284. Once it is verified that no abnormality has occurred, the relay RLN in FIG. 13 is closed, then the relay RLPRE is closed and finally the relay RLP is closed. As the relays are closed, the DC power supply from the battery module 9 to the inverter 220 starts.

The length of time to elapse between step 801 in which the key switch is turned on and the time point at which the power supply is enabled can be set to approximately 100 ms or less. Since the DC power supply is enabled quickly, as described above, the driver's desire to start the vehicle immediately is fully satisfied.

Furthermore, during this very short period of time, addresses are set at the various integrated circuits, the integrated circuits each measure the voltages at all the battery cells in the corresponding group, the measurement results are stored into the initial value storage circuit 275 shown in FIG. 6 and the abnormality diagnosis is completed.

The voltages at the battery cells are measured before the relays RLP, RLN and RLPRE are turned on, i.e., before the inverter 220 and the battery module 9 become electrically connected with each other. In other words, the voltages at the battery cells are measured before starting the power supply to the inverter 220 and thus, accurate detection of the states of charge SOCs is enabled based upon the terminal voltages at the battery cells measured prior to the current supply.

Subsequently, the operation enters a normal mode in step 812 and the voltages, the currents and the temperatures at the individual cells are measured in step 813. The measurement is executed through communication with the cell controller 80 in step 812. It is to be noted that the temperatures are measured based upon the outputs from temperature sensors (not shown).

Then, based upon the measurement values indicating the voltages and the currents at the individual battery cells measured prior to the current supply start, and also based upon the temperature measurement values as necessary, the required lengths of discharge time (balancing time) are calculated in step 815. Based upon the calculation results, information indicating the lengths of time over which the balancing switches 129A~129D in FIG. 2 are to remain in the continuous state is transmitted to each integrated circuit. In step 816, the integrated circuits each execute control under which the balancing switches remain closed based upon the required lengths of time over which they are to remain in the continuous state. This operation is executed through the flow shown in FIG. 11.

In step 817, a test is executed to determine whether or not an abnormality has occurred at any of the integrated circuits 3A~3N or at any of the battery cells. Next, in step 818, the state of each battery cell, indicating the remaining power available therein, the extent of degradation of the battery cell or the like is determined through arithmetic operation.

In step 818, a decision is made as to whether or not the length of time counted for each target balancing switch among the balancing switches 129A~129D has become equal to the corresponding required length of time over which the balancing switch is to remain in the continuous state, having been determined through the arithmetic operation. If the measured length of time is still not equal to the required length of time, the operation returns to step 813 to repeatedly calculate the required length of balancing time in step 816, execute the test in step 817 and determine the state of each battery cell through arithmetic operation in step 818.

Once it is decided in step 818 that the length of time measured for the target balancing switch 129A, 129B, 129C or 129D has become equal to the required length of time over which it is to remain in the continuous state, an instruction for stopping the discharge operation by setting the target balancing switch 129A, 129B, 129C or 129D having remained in the continuous state over the required length of time, is set in the open state is transmitted from the battery controller 20 to the corresponding integrated circuit. Since the discharge control, under which the target balancing switch is closed for discharge, is selectively executed only for battery cells indicating high SOC levels in the battery module 9, the balancing switches for battery cells with low SOC values remain in the open state throughout. As explained earlier, the state of charge SOC in each battery cell in the battery module 9 is determined through arithmetic operation, the required length of time over which the balancing switch corresponding to each battery cell is to remain in the continuous state is calculated and the required length of time thus calculated is held in a storage device at the battery controller 20. Since the required length of time over which each balancing switch is to remain in the continuous state is determined based upon the SOC of the corresponding battery cell, varying lengths of time are normally calculated for the individual balancing switches. It is naturally conceivable that there are battery cells that do not require the corresponding balancing switches to be set in the continuous state at all. For this reason, the length of time over which power is to be supplied to each battery cell is compared to the length of time having been counted in correspondence to the particular battery cell in step 818 and a command for stopping discharge of the battery cell having been supplied with power over the required length of time is transmitted to the integrated circuit controlling the discharge of the specific battery cell.

(Communication End Sequence)

Figure 15:
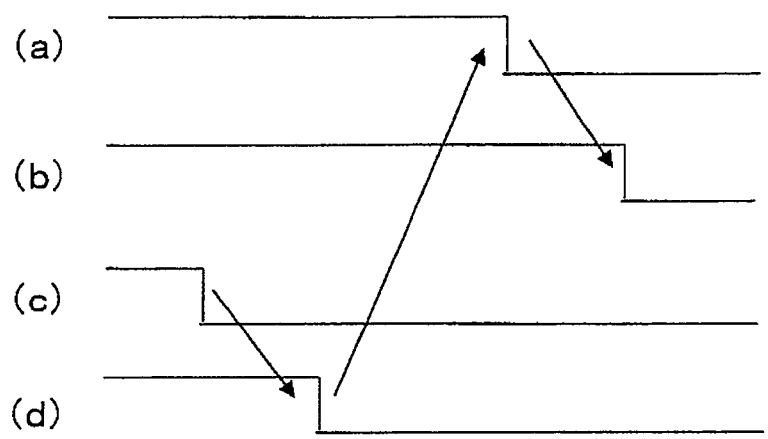
FIG. 15 presents an example of the sequence through which communication between the battery controller and the cell controller is terminated.

FIG. 15 illustrates the sequence through which the communication between the battery controller 20 and the cell controller 80 in the vehicle power supply system shown in FIGS. 1 and 13 may be terminated.

FIG. 15(a) indicates the timing with which the power supply via the power (Vc) terminal of the battery controller 20 is stopped. FIG. 15(b) indicates the timing with which the power supply at the photocouplers PH 1 and PH 2 in the entry-side interface INT(E) constituting an insulating circuit and the photocouplers PH 3 and PH 4 in the exit-side interface INT(O) constituting another insulating circuit stops. FIG. 15(c) indicates the timing with which transmission to and reception from the battery controller 20 via the TX terminals and the RX terminals stops. FIG. 15(d) indicates the timing with which output of a signal originating from the battery controller 20 and transmitted via the wake-up terminal stops.

As the figure clearly indicates, transmission to and reception from the battery controller 20 via the TX terminals and the RX terminals are first stopped. Then, if a signal from the battery controller 20 provided via the wake-up terminal is being used in the system, the transmission of the signal is stopped. Next, the power supply is stopped at the power (VC) terminal of the battery controller 20 and subsequently, the power supply to the photocouplers PH 1 and PH 2 in the entry-side interface INT(E) constituting an insulating circuit and the photocouplers PH 3 and PH 4 at the exit-side interface INT(o) constituting an insulating circuit is also stopped.

By stopping the operation at the individual units in this order, the integrated circuits can be set into the sleep state reliably.

Figure 16:
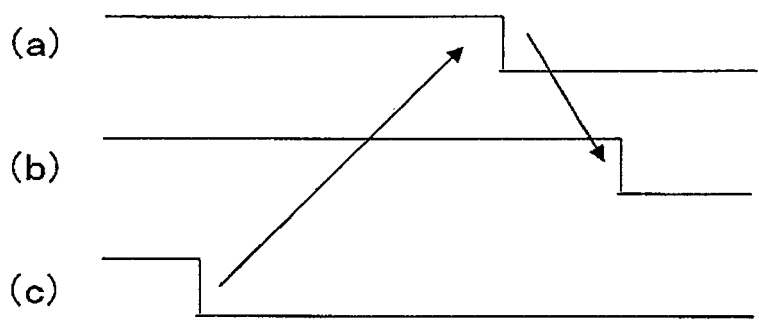
FIG. 16 presents another example of the sequence through which communication between the battery controller and the cell controller is terminated.

It is to be noted that FIG. 16 illustrates the operation in a system that does not utilize a signal provided through a wake-up terminal, unlike the system whose operation is illustrated in FIG. 15. Since a signal provided through the wake-up terminal is not utilized, the signal transmission does not need to be stopped, unlike in the system in the other system in which the signal transmission is stopped with the timing indicated in FIG. 15(d). The other aspects of the operational sequence are identical to those in FIG. 15.

(Structures of Individual Integrated Circuits and Battery Cells in the Corresponding Groups)

In the embodiment described earlier, all the battery cell groups are made up with equal numbers of battery cells with four battery cells connected to each of the integrated circuits 3A, . . . , 3M, . . . and 3N corresponding to specific battery cell groups. The integrated circuits 3A, 3M, . . . and 3N each obtain information indicating the voltages and the like from the four battery cells connected thereto and each control charge/discharge of the four battery cells therein. In other words, the integrated circuits 3A, . . . , 3M, . . . and 3N handle equal numbers of battery cells.

Figure 17:
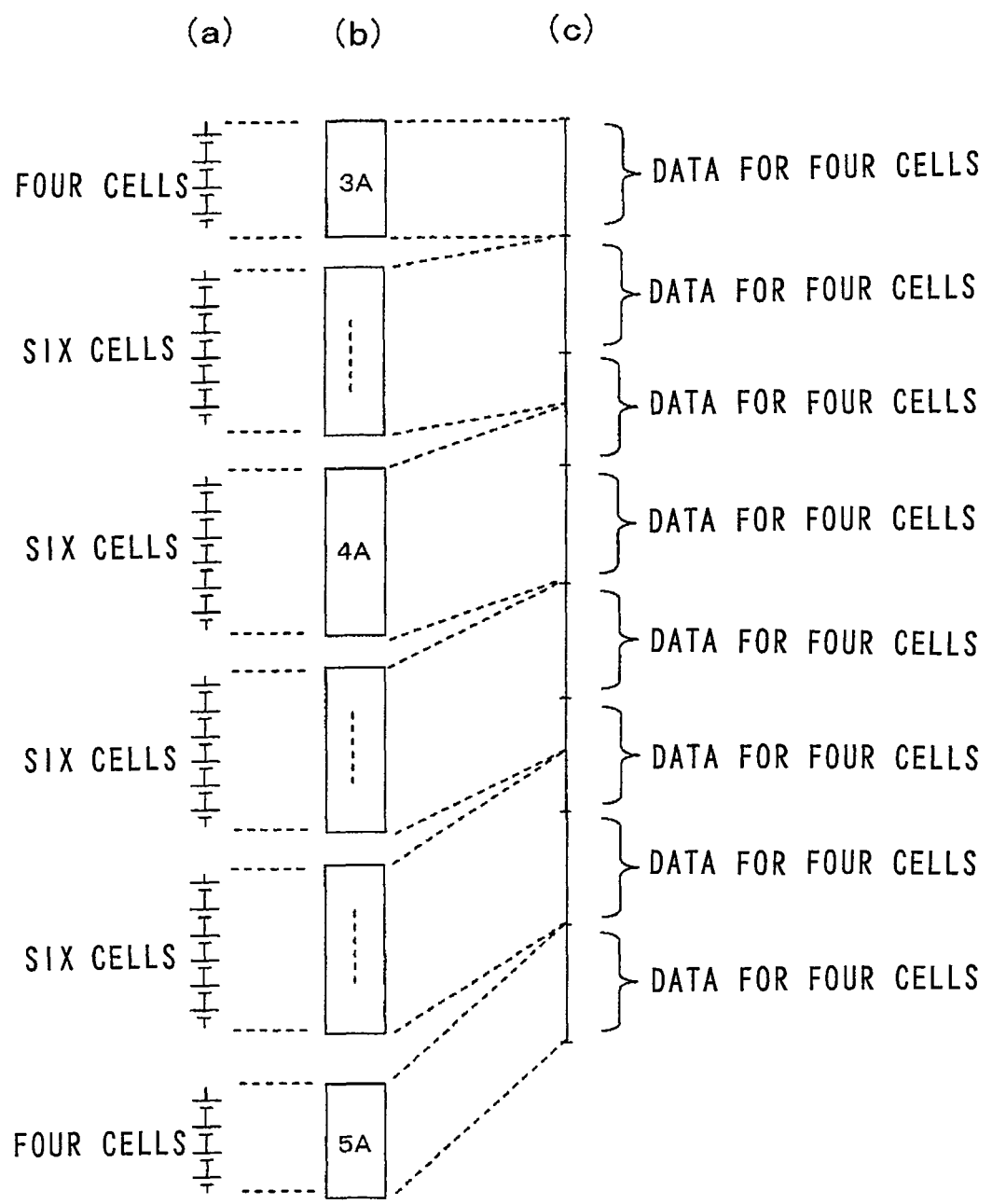
FIG. 17 shows an embodiment that includes battery groups made up with varying numbers of battery cells.

Alternatively, the various battery cell groups in the battery module 9 may be made up with different numbers of battery cells, as shown in FIG. 17. In such a case, the overall number of battery cells to constitute the battery module 9 can be selected freely without having to limit it to a multiple of the number of groups. FIG. 17(a) indicates the numbers of battery cells making up the individual groups and FIG. 17(b) indicates the integrated circuits corresponding to the specific battery cell groups. In this case, varying numbers of sets of data, indicating the battery cell terminal voltages, will be held at the current value storage circuits 274 and the initial value storage circuits 275 installed in the individual integrated circuits. While varying numbers of sets of data may be transmitted to the battery controller 20 in response to a request from the battery controller 20, the data may be sorted so that they are transmitted in batches made up with equal numbers of sets of data, as shown in FIG. 17(c). By transmitting and receiving such a fixed number of sets of data, as described above, the transmission reliability can be improved.

As indicated in FIG. 17(b), the battery cell groups corresponding to the integrated circuits 3A, . . . , 3M, . . . and 3N are made up with varying numbers of battery cells. As FIG. 17(a) indicates, the battery cell groups corresponding to the highest-stage integrated circuit 3A and the lowest-stage integrated circuit 3N each include four battery cells, fewer than the number of battery cells making up the other battery cell groups. Battery cell groups other than those corresponding to the highest-stage and lowest-stage integrated circuits in the battery module 9 each include a greater number of battery cells, e.g., 6, then the number of battery cells constituting the highest-stage and lowest-stage groups.

The integrated circuit 3A assuming the highest potential and the integrated circuit 3N assuming the lowest potential are connected to the battery controller 20 via insulating circuits constituted with the photocouplers PH 1 and PH 4, as explained earlier. It is desirable to set the voltage tolerance of the photocouplers PH 1 and PH 4 to a lower level from the viewpoint of safety and cost performance. By reducing the numbers of battery cells to constitute the battery cell groups corresponding to the integrated circuits connected with the photocouplers PH 1 and PH 4, the required photocoupler voltage tolerance level can be lowered. Namely, if six battery cells are connected to constitute each of the battery cell groups corresponding to the highest-order integrated circuit 3A and the lowest-order integrated circuit 3N, the required voltage tolerance of the photocouplers connected between the integrated circuits and the battery controller 20 will need to be greater than the highest terminal voltage among the terminal voltages at the six battery cells. In other words, when a battery cell group is made up with a greater number of battery cells, the required voltage tolerance rises.

The highest-order integrated circuit 3A and the lowest-order integrated circuit 3N in the embodiment each hold four sets of data indicating the terminal voltages at the four battery cells. Thus, they each exchange data related to the four battery cells through communication with the battery controller 20. In addition, the other integrated circuits including the integrated circuit 3M each hold data with data collected at the six battery cells, which need to be transmitted to the battery controller 20.

As indicated in FIG. 17(c), the data related to all the battery cells are transmitted/received in sequence in units of data corresponding to four battery cells. Namely, the first batch of data is constituted with the data related to the four battery cells connected to the integrated circuit 3A, the next batch of data is constituted with the data related to the four battery cells disposed on the highest-stage side among the data related to the six battery cells connected to the integrated circuit at the second stage, the next batch of data is constituted with the data related to the two battery cells disposed on the lower stage side among the data related to the six battery cells connected to the integrated circuit at the second stage and the data related to the two battery cells disposed on the highest-stage side among the data related to the six battery cells connected to the integrated circuit at the third stage, . . . , and the last batch of data is constituted with the data related to the four battery cells connected to the integrated circuits 3N at the last stage.

The volume of data that can be transmitted at a time through the communication between, for instance, the battery controller 20 and the higher-order controller 110 in the vehicle power supply system shown in FIG. 13 is limited (e.g., the upper limit to the data volume may be equivalent to the data volume corresponding to four battery cells). Accordingly, by adopting the structure shown in FIG. 17(c) for the battery module 9, signals can be transmitted/received in a volume never exceeding the upper limit, so as to assure highly reliable signal exchange.

In the embodiment described above, the uppermost-stage integrated circuit 3A and the lowermost-stage integrated circuit 3N are each connected with four battery cells and other integrated circuits are each connected with six battery cells. However, the present invention is not limited to this example and similar advantages can be achieved as long as fewer battery cells are connected to the uppermost-stage and lowermost-stage integrated circuits 3A and 3N, compared to the number of battery cells connected to the other integrated circuits. In addition, if either the uppermost-stage integrated circuit 3A or the lowermost-stage integrated circuit 3N is connected with a smaller number of battery cells than the other, the voltage tolerance level of the photocoupler corresponding to the integrated circuit connected with the smaller number of battery cells can be lowered.

Furthermore, in the embodiment described above, data are exchanged in sequence in batches each constituted with data related to four battery cells, even though the varying numbers of battery cells are connected to the individual integrated circuits. However, the battery cell data batches do not need to be prepared in the four-battery cell units and similar advantages can be achieved as long as battery cell data are exchanged in batches prepared in units each corresponding to a number of battery cells smaller than the largest number of battery cells among the varying numbers of battery cells connected to the individual integrated circuits.

(Battery Unit Structure)

Figure 18:
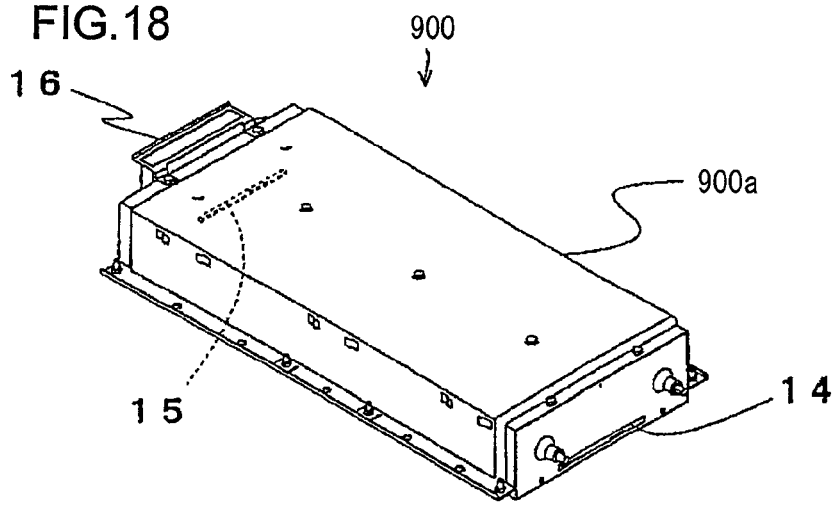
FIG. 18 is an external view of a battery module.
Figure 19:
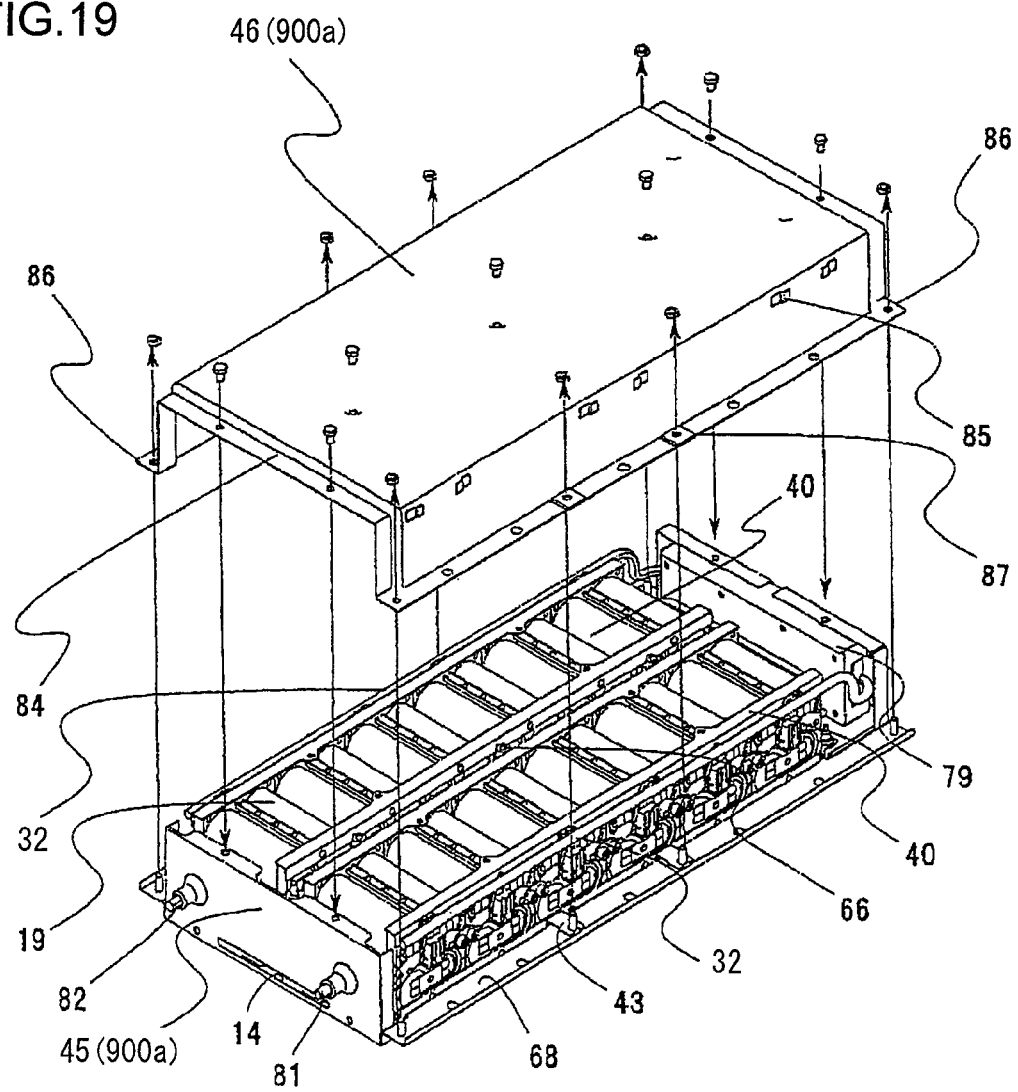
FIG. 19 shows the internal structure of a battery module.

FIGS. 18 and 19 present a specific structural example that may be adopted in the battery unit 900 constituted with the battery module 9 and the cell controller 80. The battery unit 900 includes a cuboid metal battery case 900a constituted with an upper lid 46 and a lower lid 45. The battery unit 900 also includes an output terminal via which DC power is supplied to a power-consuming device or received from a power-generating device such as the inverter 220. A plurality of battery cells are housed and fixed within the battery case 900a. While numerous wirings are laid out within the battery case 900a for purposes of voltage and temperature detection, these wirings are electrically protected against external noise with the metal battery case 900a enclosing the battery unit 900. In addition, as explained earlier, since the battery cells are protected via the battery case 900a and an outer container encasing the battery case, the power supply system safety is assured even in the event of a traffic accident.

The battery cells in the embodiment are lithium secondary batteries assuming a columnar shape, each made up with a positive pole active substance constituted of a lithium-manganese double oxide and a negative pole active substance constituted of amorphous carbon. The battery cells are each encased within a casing achieving a high level of thermal conductivity. While the nominal voltage and the capacity of such a battery cell constituted with a lithium secondary battery are respectively 3.6 V and 5.5 Ah, the terminal voltage at the battery cell fluctuates as the state of charge changes. The terminal voltage may become as low as 2.5 V as the SOC level at the battery cell decreases, whereas it may rise as high as 4.3 V as the SOC level at the battery cell increases.

Since the structure assumed in the battery cells in the embodiment facilitates connections of a detection harness 32, the high-rate cables 81 and 82 and the like, a high level of safety is maintained with even greater reliability.

Figure 20:
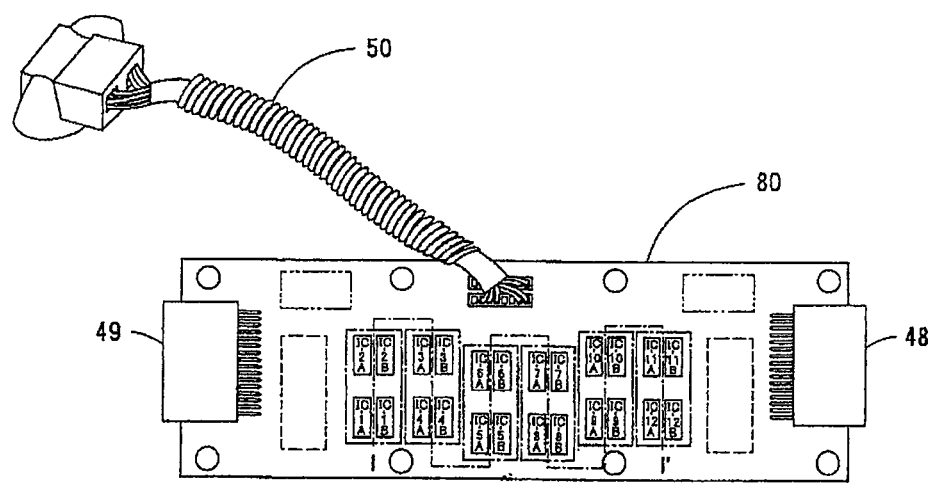
FIG. 20 is a plan view presenting an example of a cell controller built into a battery module.

As illustrated in FIGS. 18 and 19, two battery blocks 10 and 11 are fixed side-by-side at the lower lid 45. At one end of the lower lid, a cell controller box (C/C box) 79 with a built-in cell controller (hereafter referred to as a C/C) 80, to be described in reference to FIG. 20 is fixed via screws. As shown in FIG. 20, the C/C 80 is constituted with a single substrate assuming a laterally elongated shape with wirings printed on both sides thereof. The C/C 80 is fixed in the C/C box 79 in an upright orientation with screws threaded through round holes formed at four positions, i.e., at two positions on the upper side and two positions on the lower side. The substrate with TCs formed thereupon is disposed so as to face opposite the side surfaces of the battery cells constituting the battery assemblies. Such a structure allows the entire battery unit 900 to be fitted within a relatively small space. In addition, the individual battery assemblies and the C/C 80 can be wired relatively easily.

Connectors 48 and 49, disposed over a distance from each other at the two ends of the substrate constituting the C/C 80 on the left side and the right side, connect with the individual battery cells constituting the battery blocks 10 and 11 via the detection harness 32. A harness connector (not shown) mounted on one side of the detection harness 32 toward the substrate is connected to the connectors 48 and 49 at the C/C 80. Namely, as shown in FIG. 19, the detection harness 32 is installed in correspondence to each of the battery blocks 10 and 11. The C/C 80 is equipped with the two connectors 48 and 49 in correspondence to the two split battery blocks 10 and 11 housed within the battery case to constitute the battery module 9. Since the two battery assembly blocks 10 and 11 are connected via the connectors, the maintenance and the wiring operation are facilitated. One of the connectors 48 and 49 is used to connect with the serially connected battery cells on the high-voltage side, whereas the other connector 48 or 49 is used to connect with the serially connected battery cells on the low-voltage side. In other words, the connection between the serially connected battery cells and the C/C 80 is achieved over a plurality of blocks based upon the potentials of the serially connected battery cells so as to connect the battery cells with the C/C 80 via a plurality of connectors each corresponding to one of split blocks divided in correspondence to specific potential levels. Through these measures, the potential differential manifesting within the connection achieved via the connectors can be minimized. By adopting this structure, outstanding advantages with regard to voltage tolerance, prevention of current leakage and dielectric breakdown are achieved. In addition, when connecting or disconnecting the various connectors, all the connectors cannot be connected or disconnected at once, giving rise to a situation in which only some of the connectors are in the connected state during a connecting or disconnecting process. By adopting the structure described above, the difference among the voltages at the individual connectors can be reduced so as to minimize the adverse electrical effect that may be attributable to the state of partial connection occurring during the connecting or disconnecting process.

In addition, a plurality of ICs are formed at the substrate constituting the C/C 80, in correspondence to the serially connected battery cells housed in the battery unit 900. The number of battery cells to be handled via a single IC is determined based upon the processing capability of the IC. In the embodiment, a single IC is utilized in correspondence to four battery cells. However, a single IC may be used in correspondence to five or six battery cells instead. Alternatively, a single system may include a block where ICs are each used in correspondence to four battery cells and a block where ICs are each used in correspondence to six battery cells. The total number of serially connected battery cells does not need to be a multiple of the optimal number of battery cells that can be handled via a single IC. While the number of serially connected battery cells is a multiple of four in the embodiment, the quantity of serially connected battery cells may not always be a multiple of four and thus, the numbers of battery cells handled via the individual ICs may vary within the same system without problem.

Based upon the number of battery cells to be handled via each IC, the serially connected battery cells are divided into a plurality of groups, a specific IC is designated to each group and the IC thus designated to each of the plurality of groups measures the terminal voltages at the battery cells constituting the corresponding group. As described above, the numbers of battery cells constituting the individual groups may vary.

In addition, a communication harness 50, to be used to communicate with the battery controller 20, is led out from the substrate constituting the C/C 80. The communication harness 50 includes a connector disposed at the front end thereof. This connector is connected to a connector (not shown) at the battery controller 20. It is to be noted that while chip elements such as resistors, capacitors, photocouplers, transistors and diodes are mounted at the substrate constituting the C/C 80, FIG. 20 does not include an illustration of these elements, for purposes of simplification. The connectors 48 and 49 are disposed in correspondence to the two battery assembly blocks at the substrate constituting the C/C 80, and the communication harness 50 provided as a member independent of the connectors, is also disposed at the substrate so as to enable communication with the battery controller 20. Since the connectors 48 and 49, and the communication harness 50 are disposed independently of each other, maintenance and wiring work is facilitated. In addition, as explained earlier one of the connectors 48 and 49 is used to connect the serially connected high-voltage side battery cells with the substrate constituting the C/C 80 and the other connector 48 or 49 is used to connect the serially connected low-voltage side battery cells with the substrate constituting the C/C 80. As a result, the voltage difference manifesting over the ranges managed via the individual connectors can be reduced. While the state of partial connection, in which only a partial connection exists momentarily when the connectors are being connected or disconnected, the adverse effect of such partial connection can be reduced by reducing the voltage difference manifesting over the ranges managed via the individual connectors.

The battery assembly blocks 10 and 11 fixed side-by-side at the lower lid 49 are connected in series via the block connector bus bar (not shown). Grommets are fixed on round holes formed at the front surface of the lower lid base. The positive pole high-rate cable 81 and the negative pole high-rate cable 82 are led out therethrough (FIG. 19).

(Diagnosis for Individual Battery Cell)

The measurement of the voltages at the individual battery cells and the over-charge/over-discharge diagnosis operation, executed as the internal processing at each of the integrated circuits 3A, . . . , 3M, . . . and 3N in FIG. 1, are now described. At the stages STGCV1~STGCV6 indicated in row 260Y1 in the operation table 260 presented in FIG. 4, the terminal voltages at the individual battery cells are taken in and diagnosis is executed. As explained earlier, during the measurement phase of the stage STGCV1, the selection circuit 120 in FIG. 6 selects VCC(V1) and VC2(V2). Through this operation, the terminal voltage at the battery cell BC1 in FIG. 2 is selected and the selected terminal voltage is input to the voltage detection circuit 122A via the differential amplifier 262 having a potential shift function. The measurement value thus input is converted to a digital value at the voltage detection circuit 122A and the averaging circuit 264 calculates the average value by using a predetermined number of measurement values indicating most recent measurement results, including the current measurement results. The average value thus calculated is held at a register CELL1 in the current value storage circuit 274.

Based upon the measurement value held at the register BC1 in the current value storage circuit 274, diagnosis for the battery cell BC1 is executed to determine whether or not the battery cell BC1 is in an over-charged state or an over-discharged state during the measurement phase of the stage STGCV1 in FIG. 4. Before starting this diagnosis, the reference values to be used in the diagnosis are transmitted from the battery controller 20 to each integrated circuit where the over-charge diagnosis reference OC is held at a register in the reference value storage circuit 278 and the over-discharge diagnosis reference OD is also held at a register in the reference value storage circuit 278. In addition, even when the reference values cannot be transmitted from the battery controller 20 in response to a communication command 292 or when erroneous values become held in the reference value storage circuit 278 due to noise or the like, an over-charge reference value OCFFO that cannot be overwritten with a communication command 292, is held in advance so as to enable detection of an abnormal state attributable to an overcharge.

(Overcharge Diagnosis)

Following the terminal voltage measurement at the stage STGCV1, the terminal voltage value having been obtained through the measurement is compared with the over-charge decision-making value OC by the digital comparator circuit 270. Namely, the measurement value held at the register BC1, among the plurality of measurement values held at the registers BC1~BC6, the VDD values held at the VDD register and the reference power value (PSBG) in the current value storage circuit 274, is selected with a selection signal generated via the decoder 257 and the decoder 259 based upon the outputs from the first stage counter 256 and the second stage counter 258 shown in FIG. 4. The selected measurement value is then input to the digital comparator circuit 270. Likewise, the over-charge diagnosis reference value OC among the plurality of reference values held in the reference value storage circuit 278 is selected with a selection signal generated via the decoder 257 and the decoder 259 and the digital comparator circuit 270 compares the measurement value corresponding to the battery cell BC1 held at the register BC1 with the over-charge diagnosis reference value OC. If the measurement value obtained at the battery cell BC1 is greater than the over-charge diagnosis reference value OC, the digital comparator circuit 270 outputs comparison results indicating an abnormality. A digital multiplexer 282 selects a storage location at which the output from the digital comparator circuit 270 is to be stored by using a selection signal generated via the decoder 257 and the decoder 259. If the diagnosis results for the battery cell BC1 indicate an abnormality, the diagnosis results indicating the abnormality are held in a register diagnosis flag and a register OC flag in the flag storage circuit 284. Namely, the diagnosis flag and the OC flag are set. The abnormality flag is output from the terminal FFO of the integrated circuit and is transmitted to the battery controller 20.

Next, in order to assure better reliability, the digital comparator circuit 270 compares the measurement value corresponding to the battery cell BC1 with the over-charge diagnosis reference value OCFFO. If the measurement value obtained in correspondence to the battery cell BC1 is greater than the over-charge diagnosis reference value OCFFO, it is judged that an over-charge abnormality has occurred and the abnormality diagnosis results are held at the register diagnosis flag and a register OC flag in the flags to rage circuit 284. The abnormality flag set at the flag storage circuit 284 is then transmitted to the battery controller 20, as in the situation described earlier. The over-charge diagnosis reference value OCFFO is a reference value that cannot be overwritten by the battery controller 20. Thus, since the over-charge diagnosis reference value OCFFO remains unchanged even in the event of an abnormality occurring in the program or the operation of the battery controller 20, a highly reliable judgment is assured. While the over-charge diagnosis reference value OC, which can be adjusted by the battery controller 20, enables fine tuning of the decision-making process, the over-charge diagnosis reference value OCFFO is highly reliable data that are sustained unaltered regardless of the conditions of the battery controller 20 or the transmission path, as described above. Consequently, highly reliable diagnosis is assured through the use of the two different types of data.

(Over-Discharge Diagnosis)

During the measurement phase at the stage STGCV1, an over-discharge diagnosis is next executed for the battery cell BC1. The digital comparator circuit 270 compares the measurement value indicating the terminal voltage at the battery cell BC1, which is stored at the register BC1 in the current value storage circuit 274, with the reference value OD held in the reference value storage circuit 278. If the measurement value obtained at the battery cell BC1 is less than the reference value OD in the reference value storage circuit 278, the digital comparator circuit 270 judges that an abnormality has occurred and outputs an abnormality signal. The digital multiplexer 282 selects the diagnosis flag and the OD flag in the flag storage circuit 284 by using a selection signal generated based upon the outputs from the decoders 257 and 259 and the abnormality signal thus output from the digital comparator circuit 270 is set at the register diagnosis flag and the register OD flag.

If the diagnosis flag is set through any of the diagnosis steps described above, the flag is output from the one-bit output terminal FFO via an OR circuit 288 and is transmitted to the battery controller 20.

The functions of the selection circuit 286 can be altered with a communication command 292 issued from the battery controller 20 and thus, the specific details of the flag to be output through the terminal FFO can be selectively adjusted. For instance, an over-charge abnormality alone may be specified as the condition for setting the diagnosis flag in the flag storage circuit 284. In such a case, an over-discharge abnormality diagnosis output from the digital comparator circuit 270 is not set in the register diagnosis flag and instead, the OD flag alone is set. The OD flag may then be output or not depending upon the specific condition setting selected via the selection circuit 286. Since the condition setting can be modified from the battery controller 20, a higher level of versatility in the control is afforded.

Following the stage STGCV1 in row 260Y1 in the operation table 260 in FIG. 4, the operation enters the stage STGCV2. The selection circuit 120 shown in FIG. 6 selects VC2 (V2) and VC3 (V3), thereby selecting the terminal voltage at the battery cell BC2 in FIG. 2. Through an operation similar to that having been executed at the stage STGCV1 as described earlier, the terminal voltage measured at the battery cell BC2 is digitized via the analog/digital converter 122A, the averaging circuit 264 calculates the average of the predetermined number of measurement values indicating the most recent measurement results including the current measurement results and the average value thus calculated is held at the register BC2 in the current value storage circuit 274. As are the positions at which other measurement values are to be held, the position at which the measurement results are to be held is selected based upon the outputs from the decoder 257 and the decoder 259 shown in FIG. 4.

Then, as in the operation executed at the stage STGCV1, the measurement value corresponding to the battery cell BC2 is selected from the current value storage circuit 274 and the over-charge diagnosis reference value OC at the reference value storage circuit 278 is selected based upon the outputs from the decoders 257 and 259 shown in FIG. 4. The diagnosis is then executed as the digital comparator circuit 270 compares the measurement value with the over-charge diagnosis reference value. The details of the diagnosis and the specific operational procedure of the diagnosis are identical to those corresponding to the stage STGCV1.

Subsequently, the measurement and the diagnosis are executed at the succeeding stages STGCV3~STGCV6 in sequence via the circuit shown in FIG. 6, in much the same way as at the stages STGCV1 and STGCV2.

(SOC Adjustment and Terminal Voltage Measurement)

As explained earlier, the state of charge SOC of each of the battery cells constituting the battery module 9 is adjusted through control whereby the power held in any battery cell with a significant charge is discharged via a discharge resistor by controlling the balancing switches 129A~129F. The open/close control executed on the balancing switches 129A~129F may adversely affect the terminal voltage detection at the various battery cells. Namely, as the balancing switches 129 in the circuit shown in FIG. 2 closes, a discharge current will flow via the corresponding resistors R1~R4, lowering the accuracy with which the terminal voltages at the battery cells BC1~BC4 are measured.

The open/close control for the balancing switches 129A~129F must be executed based upon the states of all the battery cells in the battery module 9. Accordingly, it is desirable to execute the open/close control through processing executed at the battery controller 20 shown in FIG. 1. In other words, it is desirable to engage the individual integrated circuits 3A~3N in the control of the balancing switches 129A~129F in response to a command issued by the battery controller 20. At the same time, it is desirable that the integrated circuits 3A~3N each individually measure the terminal voltages at the battery cells in the corresponding group and that they each promptly transmit the terminal voltage measurement values having been obtained through the measurement and held therein in response to a measurement value transmission instruction issued from the battery controller 20. This means that the control for the balancing switches 129A~129F and the control on the battery cell terminal voltage measurement, executed via different circuits, must be coordinated so as to ensure that the two types of control are executed in an integrated manner.

Figure 21:
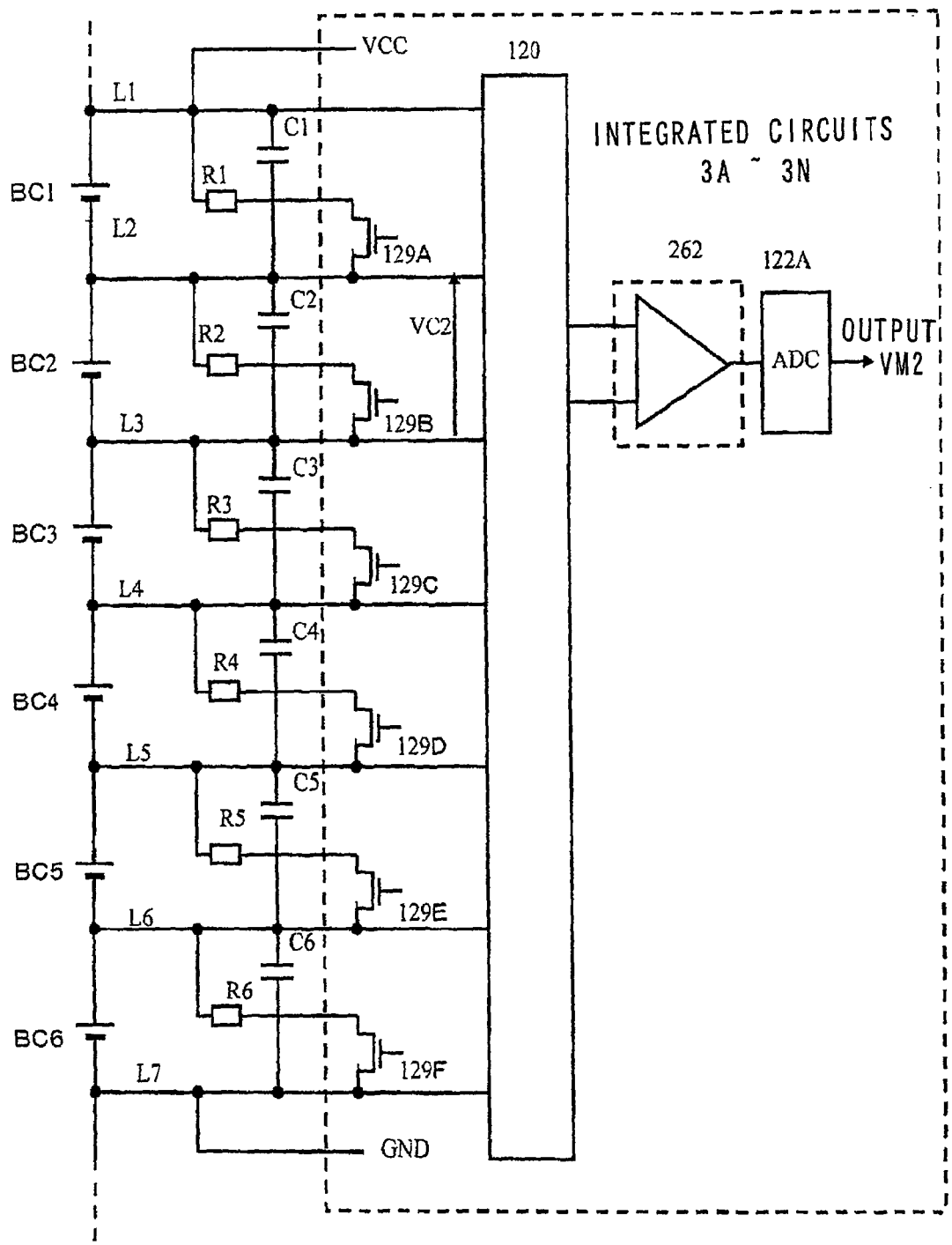
FIG. 21 presents an example of a circuit structure that may be adopted to enable both balancing switch control and individual battery cell terminal voltage measurement.
Figure 22:
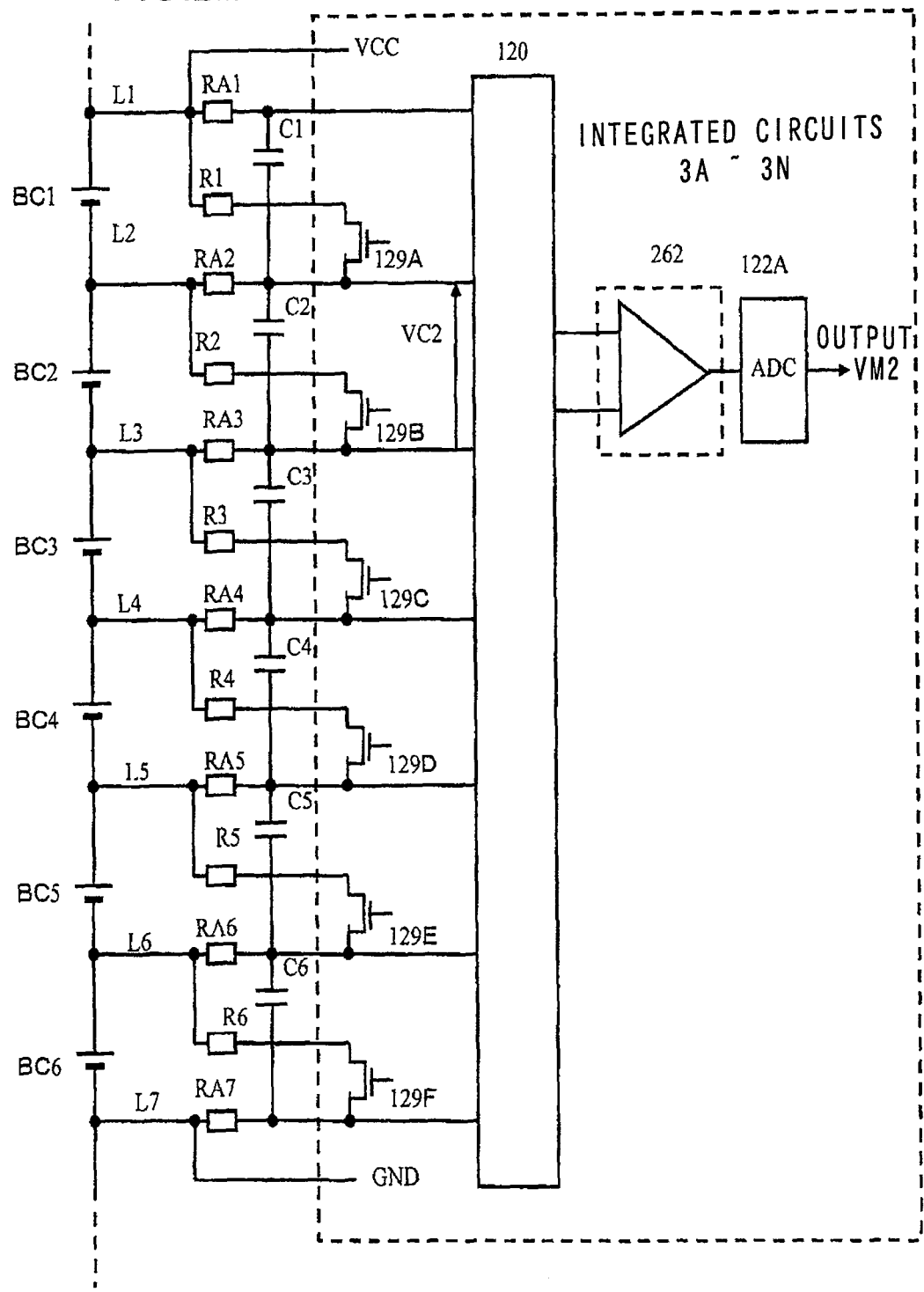
FIG. 22 presents another example of a circuit structure that may be adopted to enable both balancing switch control and individual battery cell terminal voltage measurement.
Figure 23:
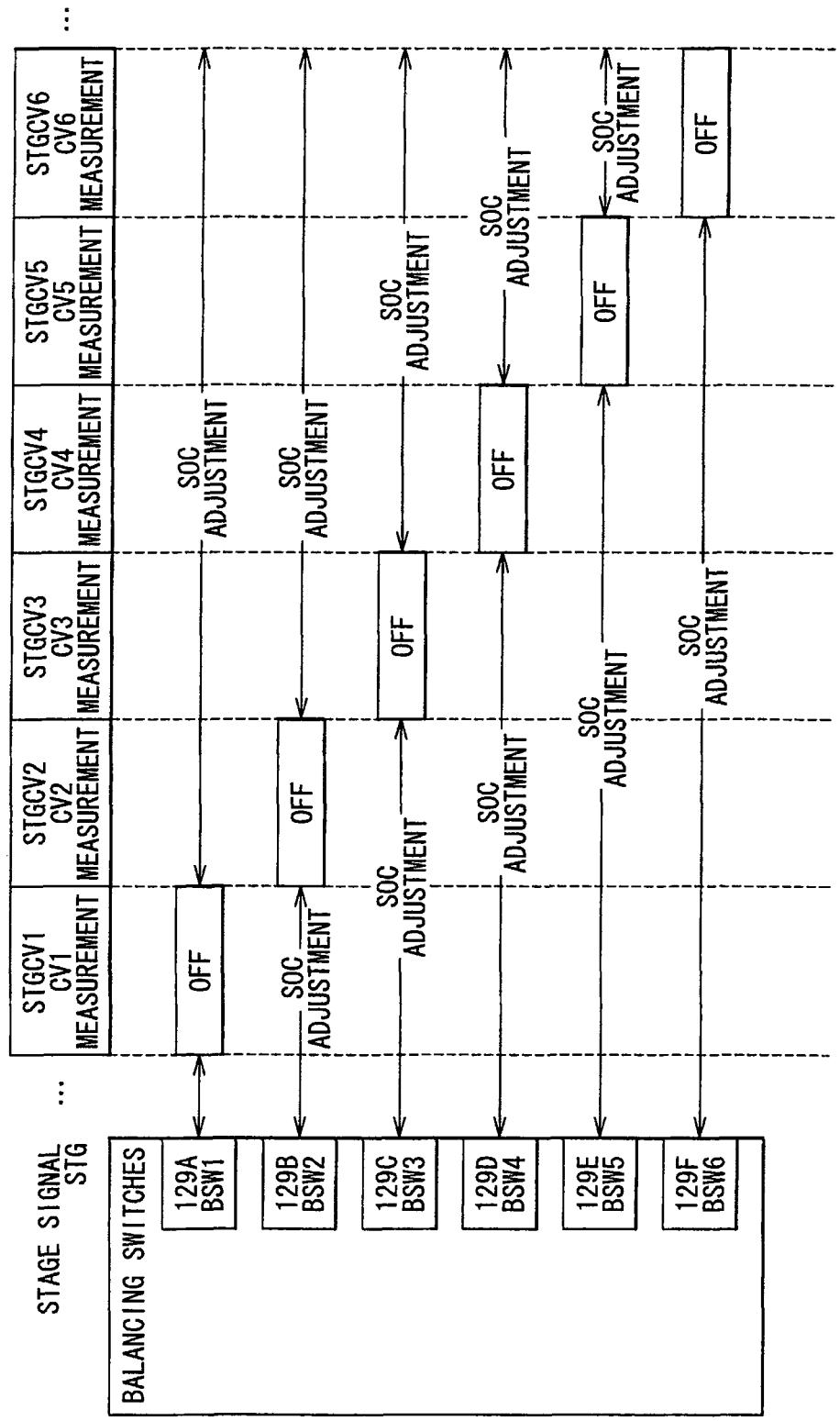
FIG. 23 is an operation diagram illustrating the relationship between the measurement control and the discharge control executed for SOC adjustment, observed in the circuit shown in FIG. 21.
Figure 24:
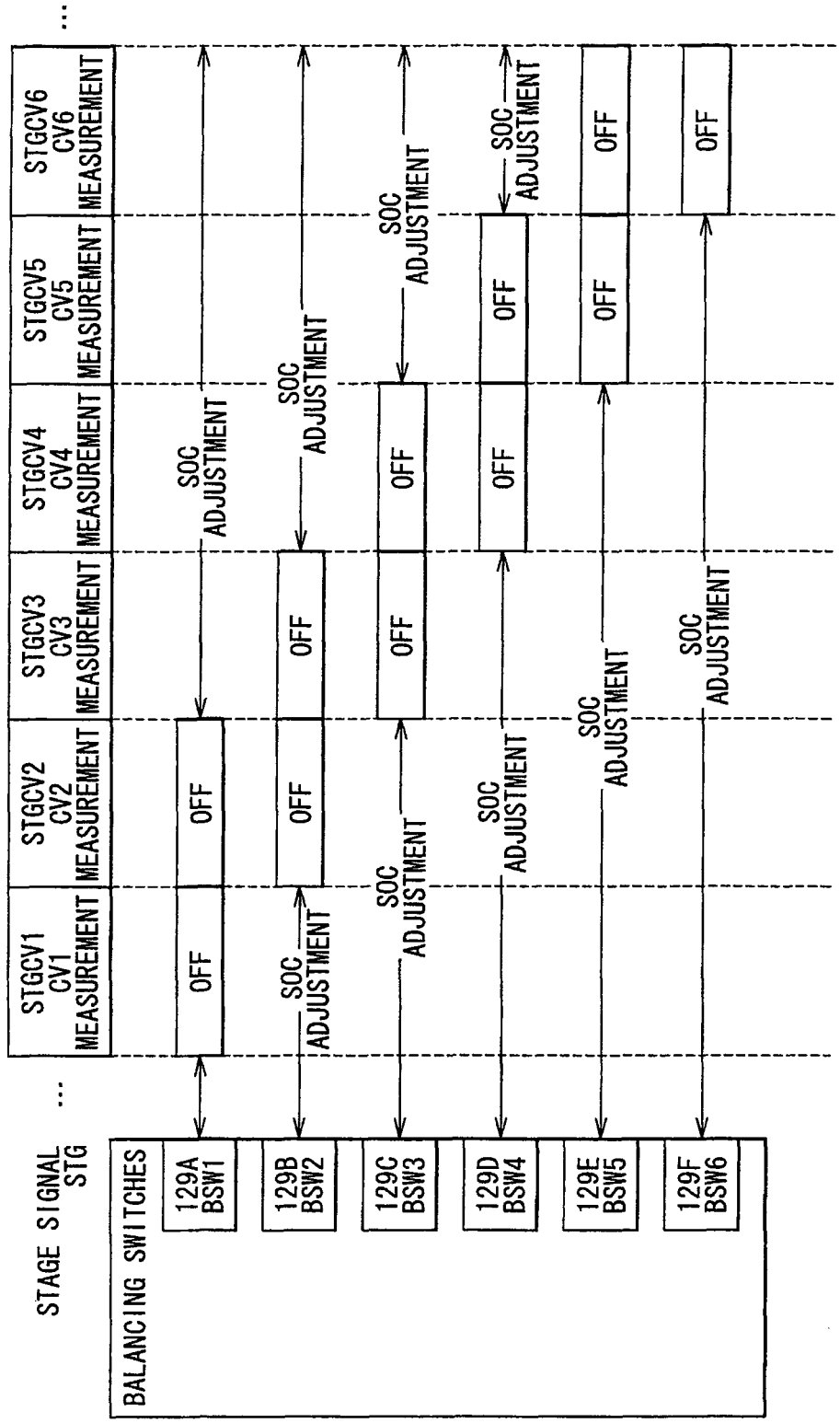
FIG. 24 is an operation diagram illustrating the relationship between the measurement control and the discharge control executed for SOC adjustment, observed in the circuit shown in FIG. 22.
Figure 25:
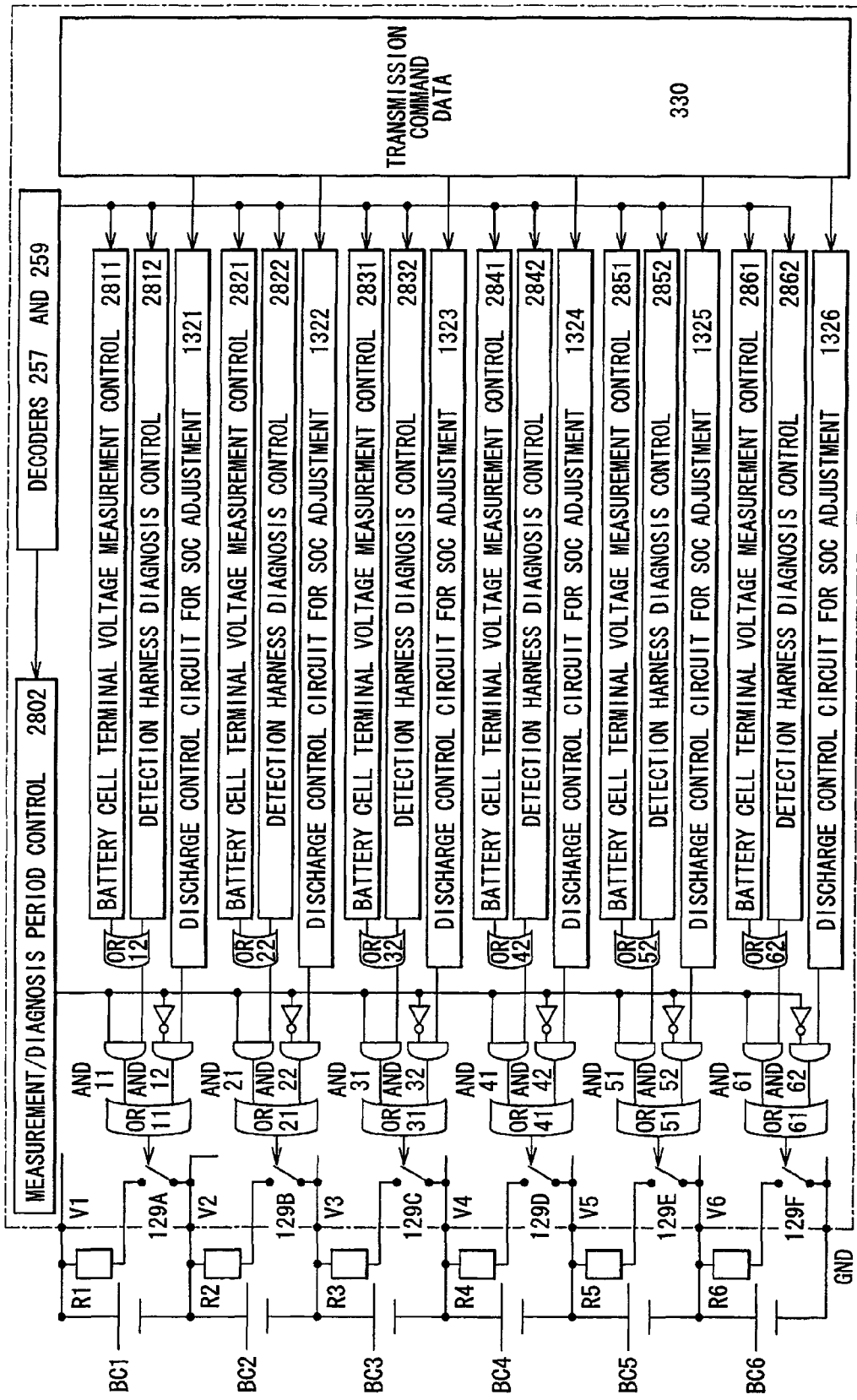
FIG. 25 presents an example of a circuit that may be used to execute the control shown in FIG. 23 or FIG. 24.

In reference to FIGS. 21 through 25, specific structures that may be adopted to execute the two types of control in an optimal manner are explained. Since it is desirable to effectively eliminate the adverse effect of noise in actual products with capacitors C1~C6 installed in addition to the discharge resistors R1~R4 shown in FIGS. 1 and 2, the structures shown in FIGS. 21 and 22 each include noise removal capacitors added to the circuit structure shown in FIG. 1 or FIG. 2. It is to be noted that while four battery cells constitute each battery cell group in the structures illustrated in FIGS. 1 and 2, the structures illustrated in FIGS. 21 and 22 include six battery cells constituting a battery cell group. It is also to be noted that the resistors and the capacitors are installed in the cell controller indicated by the dotted line 80, together with the integrated circuit also indicated by the dotted line and that they are connected with the respective battery cells BC1~BC6 in the battery block via the communication harness 50 shown in FIG. 20. FIG. 22 shows a circuit designed to further reduce the adverse effect of noise by utilizing the discharge resistors R1~R6 shown in FIG. 21. FIGS. 23 and 24 each illustrate the measurement control operation and the discharge control operation executed to adjust the states of charge (SOCs). FIG. 23 illustrates the operation executed at the circuit shown in FIG. 21, whereas FIG. 24 illustrates the operation executed at the circuit shown in FIG. 22. In addition, FIG. 25 shows a circuit that may be used to enable the control shown in FIG. 23 or FIG. 24.

In the circuit shown in FIG. 21, the terminal voltage at the battery cell BC1 is measured at the stage STGCV1 and then the terminal voltage at the battery cell BC2 is measured at the succeeding stage STGCV2. Subsequently, the terminal voltages at the battery cells BC3~BC6 are measured in sequence. By repeatedly measuring the terminal voltages in this manner, the levels of the terminal voltages at the battery cells can be monitored at all times.

For instance, assuming that the balancing switch 129B is in the closed state in order to adjust the SOC, a discharge current is flowing via the balancing switch 129B and the resistor R2 and, as the discharge current affects the internal resistance and wiring resistance at the battery cell BC2, the voltage VC2 input to the selection circuit 120 assumes a value lower than that of the terminal voltage measured when the balancing switch 129B is in the open state. In other words, the lower terminal voltage value input to the selection circuit 120 when the balancing switch 129B is in the closed state is bound to reduce the measurement accuracy.

In order to maintain the measurement accuracy at an acceptable level, the terminal voltage at the battery cell BC1 is measured with the balancing switch 129A set in the open state by temporarily stopping the control for the SOC of the battery cell BC1 at the stage STGCV1, during which the terminal voltage at the battery cell BC1 is measured, as shown in FIG. 23. At the stage STGCV2 during which the terminal voltage at the next battery cell BC2 is measured, the terminal voltage at the battery cell BC2 is measured with the balancing switch 129B set in the open state by temporarily stopping the SOC control for the battery cell BC2. Subsequently, the terminal voltages at the succeeding battery cells are measured in sequence with the corresponding balancing switches 129C~129F (BSW3~BSW6 in FIG. 23) set in the open state.

The control for the SOC adjustment may be stopped during the measurement phases at the stages STGCV1~STGCV6. Alternatively, the control for the SOC adjustment may be stopped only briefly while the terminal voltage is actually being measured during each of the stages STGCV1~STGCV6.

Next, the circuit shown in FIG. 22 is described. Significant noise is present in the power lines through which power is supplied from the serially connected battery cells BC1~BC6 to the inverter. In order to reduce the adverse effect of this noise, the circuit shown in FIG. 22 includes resistors RA1~RA7 inserted between the battery cell terminals and the input end of the selection circuit 120. The resistors RA1~RA7, together with the capacitors C1~C7 remove noise, thereby protecting the integrated circuit from the noise.

As the balancing switch 129A in the circuit shown in FIG. 22 is closed in order to adjust the SOC, the discharge current for the battery cell BC1 flows through the resistor R1, the balancing switch 129A and the resistor RA2. The discharge current flowing through the resistor RA2 while the balancing switch 129A is in the closed state is bound to affect the measurement of the terminal voltage at the battery cell BC2 as well as the measurement of the terminal voltage at the battery cell BC1. For this reason, the terminal voltage at the battery cell BC2 must be measured by opening both the balancing switch 129A and the balancing switch 129B. Likewise, the terminal voltage at the battery cell BC3 must be measured by opening both the balancing switch 129B and the balancing switch 129C and the terminal voltages at all the succeeding battery cells have to be measured by opening two balancing switches.

FIG. 24 shows how the balancing switches 129 in the circuit shown in FIG. 22 may be forcibly set in the open state for battery cell terminal voltage measurement. At the stage STGCV2 during which the terminal voltage at the battery cell CB2 in FIG. 22 is measured, the SOC adjustment control via the balancing switches 129A and 129B is stopped, and the balancing switches 129A and 129B are sustained in the open state. At this time, the SOC adjustment control via the balancing switches 129A and 129B may be stopped over the entire period of the stage STGCV2 or the SOC adjustment control via the balancing switches 129A and 129B may be only briefly stopped while the voltage is actually being measured during the stage STGCV2. This principle is similar to that having been explained in reference to FIG. 23.

FIG. 24 also shows that at the stage STGCV3 during which the terminal voltage at the battery cell B3 in FIG. 22 is measured, the SOC adjustment control via the balancing switches 129B and 129C is stopped, and the balancing switches 129B and 129C are sustained in the open state while the measurement of the terminal voltage is underway. At this time, the SOC adjustment control via the balancing switches 129B and 129C may be stopped over the entire period of the stage STGCV3 or the SOC adjustment control via the balancing switches 129B and 129C may be only briefly stopped while the voltage is actually being measured during the stage STGCV3, as described above.

At the stages STGCV4 and STGCV5, the balancing switches 129C and 129D and the balancing switches 129D and 129E are respectively sustained in the open state while measuring the terminal voltages at the battery cells BC4 and BC5. At the stage STGCV6, the terminal voltage at the battery cell BC6 is measured. While the terminal voltage at the battery cell BC6 is being measured, the balancing switch 129F is sustained in the open state.

It is to be noted that the balancing switches 129A~129F are each controlled for purposes of the SOC adjustment during the period of time indicated by ↔ in FIGS. 23 and 24. In addition, during the period of time marked as "OFF", the control of the corresponding balancing switch among the balancing switches 129A~129F, executed for purposes of SOC adjustment is halted with the balancing switch forcibly set in the open state. By forcibly opening the corresponding balancing switches 129 so as to give priority to the battery cell terminal voltage measurement over the SOC adjustment control executed via the battery control 20 as described above, the battery cell terminal voltages can be measured with better accuracy.

Next, in reference to the circuit diagram presented in FIG. 25, the operation executed to open the balancing switches 129 is described. First, the control value to be used in the SOC adjustment is calculated in step 815 in FIG. 14 and the calculation results indicating the control value are transmitted to the individual integrated circuits 3A, . . . , 3M, . . . and 3N as a communication command 292. The communication circuit 127 shown in FIG. 2 or FIG. 7 of each of the integrated circuits 3A, . . . , 3M, . . . and 3N receives the transmitted control value and the balancing switches 129A~129F are controlled based upon the control value thus received.

Data 330 in FIG. 25 correspond to the data 330 in the reception register 322 shown in FIG. 7 and the contents of the data 330 are input to discharge control circuits 1321~1326. The control signal input to the discharge control circuits indicates either "1" or "0". The control signal indicating "1" is an instruction for control under which the corresponding battery cell is discharged by closing the balancing switch 129, whereas the control signal indicating "0" is an instruction for control under which the balancing switch 129 remains open and thus the battery cell is not discharged. Such a control signal is held at each of the discharge control circuit 1321~1326 and the balancing switches 129A~129F are individually controlled based upon the data held at the respective discharge control circuits.

The data held at the discharge control circuits 1321~1326 are provided to AND gates 12~62 and are used to drive the balancing switches 129A~129F via OR gates 11~61. If control for a specific balancing switch among the balancing switches 129A~129F is to be given priority over the SOC adjustment control, the signal indicating the data held at the corresponding discharge control circuit among the discharge control circuits 1321~1326 is cut off at the corresponding AND gate among the AND gates 12~62. During this cutoff period, which is to be described in reference to FIGS. 29 and 30, the terminal voltage at the corresponding battery cell is measured based upon the outputs from the decoder 257 and the decoder 259 and a control-off signal is transmitted from a circuit 2802 to the specific AND gate among the AND gates 12~62 based upon the outputs from the decoders 257 and 259.

While the SOC adjustment control for a given battery cell is halted with a specific AND gate among the AND gates 12~62 set in the open state, the corresponding AND gate among AND gates 11~61 is closed and the corresponding balancing switch among the balancing switches 129A~129F is driven based upon the output from the corresponding OR gate among OR gates 12~62. In other words, while a given AND gate among the AND gates 12~62 is in the open state and the corresponding AND gate among the AND gates 11~61 is in the closed state, a control signal to be used to control the balancing switch among the balancing switches 129A~129F can be output from the corresponding measurement control circuit among measurement control circuits 2811~2861 so as to assure optimal measurement. In addition, when executing abnormality diagnosis for the detection harness 32, which is to be detailed later, the diagnosis control circuits 2812~2862 output a control signal to control the respectively balancing switches 129A~129F.

As described above, the integrated circuits 3A, . . . , 3M, . . . and 3N each include a dedicated circuit via which a specific balancing switch among the balancing switches 129A~129F is controlled while the SOC adjustment control is halted to give priority to the measurement operation. As a result, accurate measurement and diagnosis are enabled.

(Diagnosis for the ADC, the Differential Amplifier 262 and the Reference Voltage)

At the stage STG "reference power" in row 260Y1 in the operation table 260 presented in FIG. 4, a diagnosis for the internal reference voltage, the analog circuit and the voltage detection circuit 122A is executed. A source voltage to be used to engage the analog circuit and the digital circuit shown in FIG. 6 in operation is generated at a power source circuit 121 (see FIG. 2) within the integrated circuit. If the source voltage is generated based upon an absolute reference power level, a precise source voltage can be obtained with relative ease. However, if the absolute reference voltage changes, the source voltage, too, may change.

At the stage STG "reference power", the diagnosis for the reference power and the diagnosis for the analog circuit and the voltage detection circuit 122A are executed with a high level of efficiency. The operation executed at the stage STG "reference power" is described below in more specific terms.

The selection circuit 120 included in the circuit structure shown in FIG. 6 selects the reference power and the GND. The voltage representing the difference between the potentials at the GND and the reference power thus selected is input to the differential amplifier 262, where the scale is adjusted in correspondence to the potential shift. The voltage value is then input to the analog/digital converter 122A. At the analog/digital converter 122A, the input signal is converted to a digital value and the digital signal is held as data reference power at a reference power register in the current value storage circuit 274 based upon the outputs from the decoders 257 and 259.

As long as the relevant circuit operates in the normal state, the voltage at the reference power assumes a known value. Accordingly, a lower limit value for the reference power assuming a slightly lower value than the known voltage value of the reference power and an upper limit value for the reference power, assuming a slightly larger value than the known voltage value of the reference power, are respectively held in a lower limit value save area and an upper limit value save area designated in advance at a register in the reference value storage circuit 278. Under normal circumstances, the voltage at the reference power assumes a value between the lower limit value and the upper limit value for the reference power. Even when the voltage at the reference power is within the normal range, the output from the analog/digital converter 122A will indicate a value outside the normal range unless the analog circuit operates in the normal states, e.g., unless the differential amplifier 262 operates in the normal state. In addition, an abnormality occurring at the analog/digital converter 122A will also result in the output from the analog/digital converter 122A indicating a value outside the normal range.

Accordingly, a diagnosis is executed by engaging the digital comparator circuit 270 in comparison operation in order to determine if the "reference power" value held in the current value storage circuit 274 is between the reference power lower limit value and the reference power upper limit value held in the reference value storage circuit 278.

Based upon the outputs from the decoders 257 and 259, the digital multiplexer 272 selects the measurement value "reference power" and transmits the selected measurement value to the digital comparator circuit 270. In addition, based upon the outputs from the decoders 257 and 259, the digital multiplexer 272 selects the reference power lower limit value and transmits the selected value to the digital comparator circuit 270. The digital comparator circuit 270 judges that an abnormality has occurred if the measurement value "reference power" is smaller than the reference power lower limit value and, accordingly, an abnormality flag is set at the abnormality flag holding register selected by the digital multiplexer 282 based upon the outputs from the decoders 257 and 259, i.e., at the register diagnosis flag in the flag storage circuit 284 in the embodiment. If, on the other hand, the measurement value "reference power" is greater than the reference power lower limit value, the current state is judged to be normal and, accordingly, no abnormality flag is set in the flag storage circuit 284.

In addition, during the stage STG "reference power" the digital multiplexer 272 selects the measurement value "reference power" based upon the outputs from the decoders 257 and 259 and transmits the selected measurement value to the digital comparator circuit 270. In addition, based upon the outputs from the decoders 257 and 259, the digital multiplexer 272 selects the reference power upper limit value and transmits the selected value to the digital comparator circuit 270. The digital comparator circuit 270 judges that an abnormality has occurred if the measurement value "reference power" is larger than the reference power upper limit value and, accordingly, an abnormality flag is set at the abnormality flag holding register selected by the digital multiplexer 282 based upon the outputs from the decoders 257 and 259, i.e., at the register diagnosis flag in the flag storage circuit 284 in the embodiment. If, on the other hand, the measurement value "reference power" is smaller than the reference power upper limit value, the current state is judged to be normal and, accordingly, no abnormality flag is set in the flag storage circuit 284. During the stage STGPSBG, the diagnosis is executed as described above to determine whether or not the differential amplifier 262, which is an analogue amplifier, and the analog/digital converter 122A are operating in the normal state, so as to assure a high level of reliability.

(Diagnosis for the Digital Comparator Circuit)

At the stage STGCal in the operation table 260 in FIG. 4, a diagnosis for the digital comparator circuit is executed. The diagnosis operation is described below. Based upon the outputs from the decoders 257 and 259, the digital multiplexer 272 selects an addition calculation value 280. The addition calculation value 280 is a value obtained by adding a predetermined value to a reference value, e.g., the reference value OC, held in the reference value storage circuit 278. The digital multiplexer 276 selects one of the reference values held in the reference value storage circuit 270 such as the reference value OC and inputs the selected reference value to the digital comparator circuit 270 where it is used as a comparison reference. In addition, the addition calculation value 280 obtained by adding a predetermined value, e.g., "1", to the selected reference value OC is input to the digital comparator circuit 270 via the digital multiplexer 272. If the digital comparator circuit 270 judges that the addition calculation value 280 is greater than the reference value OC, the digital comparator circuit 270 can be assumed to be operating in the normal state.

Next, the digital multiplexer 272 selects a subtraction calculation value 281 based upon the outputs from the decoders 257 and 259. The subtraction calculation value 281 is a value obtained by subtracting a predetermined value such as "1" from a reference value, e.g., the reference value OC, held in the reference value storage circuit 278. The digital multiplexer 276 selects one of the reference values held in the reference value storage circuit 270 such as the reference value OC and inputs the selected reference value to the digital comparator circuit 270 where it is used as a comparison reference. In addition, the subtraction calculation value 281 obtained by subtracting a predetermined value, e.g., "1", from the selected reference value OC is input to the digital comparator circuit 270 via the digital multiplexer 272. If the digital comparator circuit 270 judges that the subtraction calculation value 281 is smaller than the reference value OC, the digital comparator circuit 270 can be assumed to be operating in the normal state.

As described above, the reference value OC held in the reference value storage circuit 278 is compared with the sum obtained by adding predetermined value to the reference value OC and with the difference obtained by subtracting a predetermined value from the reference value OC, so as to determine whether or not the comparator is operating in the normal state.

The addition calculation value 280 and the subtraction calculation value 281 are used in order to create conditions under which known relationships to the comparison reference exist and obtain verifiable comparison results. For this reason, instead of the values obtained by adding/subtracting a predetermined value to/from the comparison reference, values obtained by shifting the data toward the higher-order side and the lower-order side may be utilized. The values obtained through such data shift are equivalent to values obtained by multiplying the comparison reference by a predetermined value 4 and subtracting a predetermined value 4 from the comparison reference and thus, known relationships to the comparison reference can also be created with these values.

Figure 26:
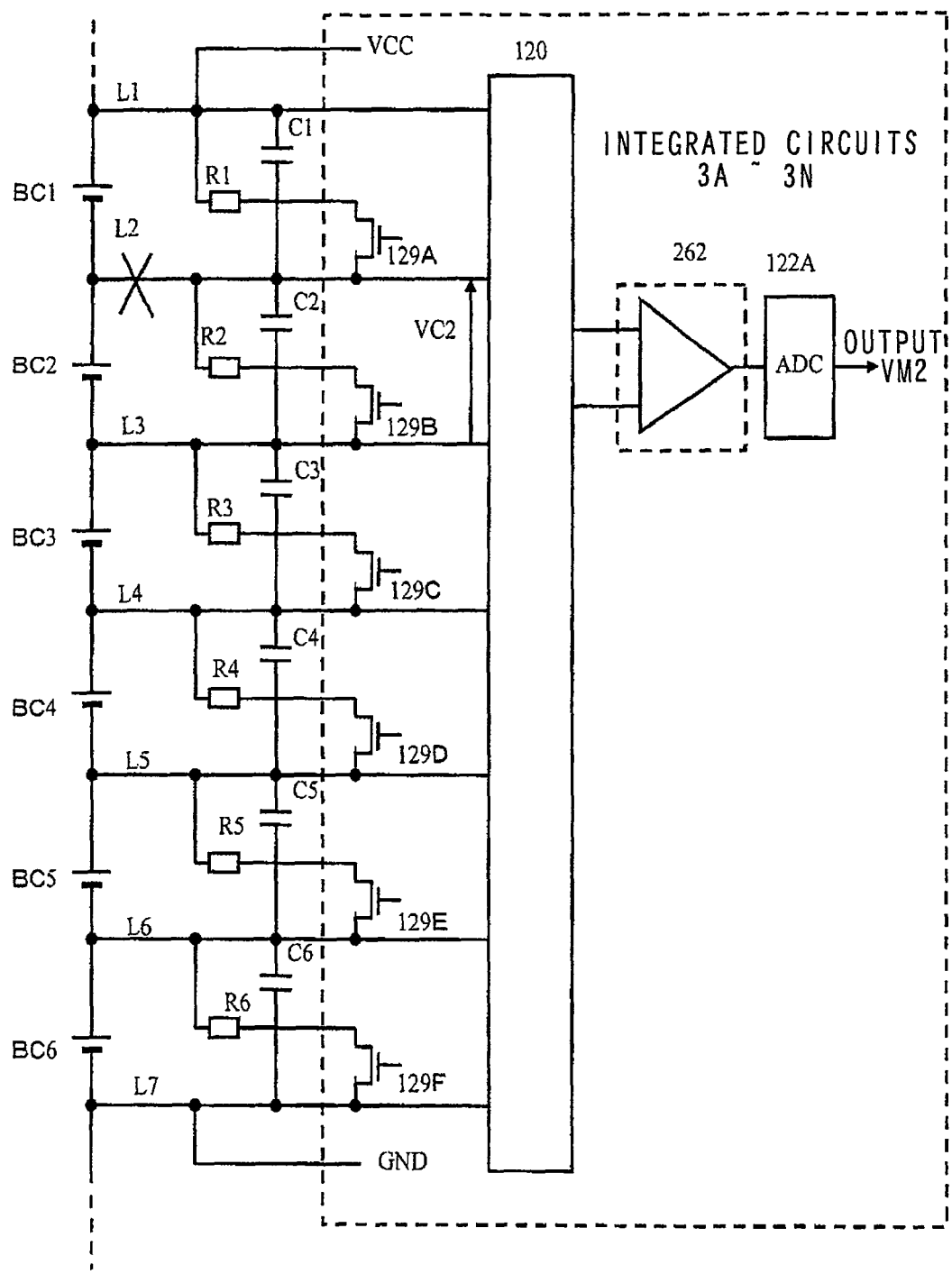
FIG. 26 presents an example of a diagnosis executed to detect an abnormality occurring at the detection harness.
Figure 27:
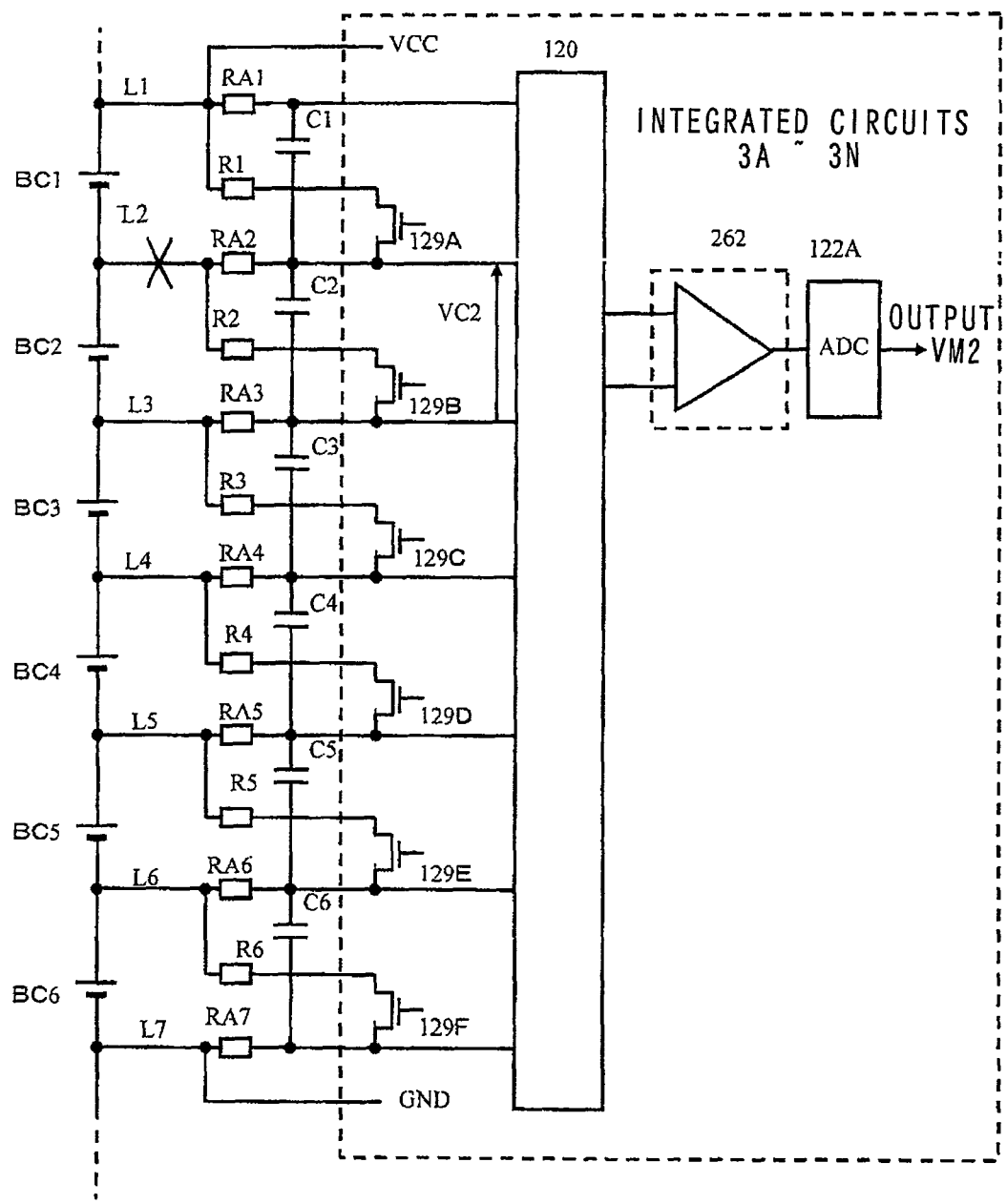
FIG. 27 presents another example of a diagnosis executed to detect an abnormality occurring at the detection harness.

In reference to FIGS. 26 and 27, the diagnosis executed to determine whether or not an abnormality has occurred at the detection harness 32 connecting the positive poles and the negative poles of the battery cells BC to the cell controller 80 is described. It is to be noted that while the circuits in FIGS. 26 and 27 are similar to those shown in FIGS. 1 and 2, they further include noise removal capacitors C1~C6. In addition, while each battery cell group is made up with four battery cells in the circuit structures illustrated in FIGS. 1 and 2, the circuits shown in FIGS. 26 and 27 include six battery cells constituting a battery cell group. FIG. 26 illustrates a circuit in which a disconnection has occurred in a harness segment L2 constituting the detection harness 32 in FIG. 1 or FIG. 2. FIG. 27 shows a circuit in which a disconnection has occurred in the harness segment L2 constituting the detection harness 32 included in the circuit shown in FIG. 22. Such a disconnection may occur due to poor contact at a connection area where a given battery cell in FIG. 19 and the detection harness 32 are connected with each other or a poor connection at the connector 48 or 49, where the cell controller 80 is connected with individual harness segments, as shown in FIG. 20. Although not common, a disconnection may also occur at the detection harness 32 itself.

It is essential that any potential abnormality at each battery cell be sensed in order to preempt the abnormality. If an abnormality actually occurs in the electrical connection between the battery cell and the corresponding integrated circuit, the potential abnormality that may occur at the battery cell described above can no longer be sensed. Now, in reference to FIG. 28, a method that may be adopted to detect an abnormality occurring in the electrical connection between the battery cell and the integrated circuit, as shown in FIG. 26 or 27, is described. It is to be noted that the basic operation executed in the circuit shown in FIG. 26 or 27 has already been described. In addition, while an explanation is given below by assuming that a disconnection has occurred in the harness segment L2 in the detection harness 32, an abnormality can be detected in a similar manner regardless of which harness segment among the harness segments L1~L7 becomes disconnected.

Figure 28:
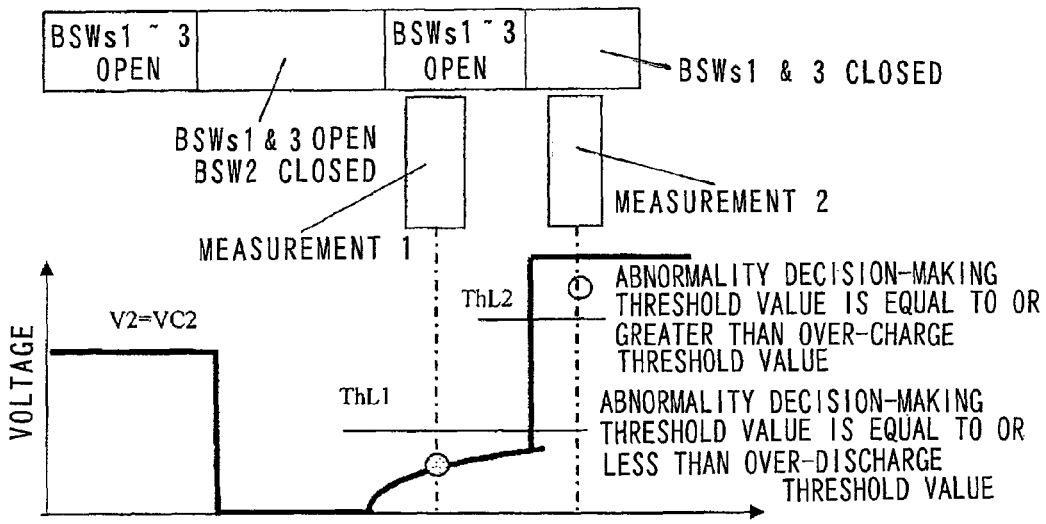
FIG. 28 illustrates a method that may be adopted to detect an abnormality in the electrical connection between the battery cells and the individual integrated circuits in the structure shown in FIG. 26 or FIG. 27.

If the harness segment L2 in the detection harness 32 becomes disconnected while the balancing switches 129A~129C are in the open state, the voltage VC2 input to the selection circuit 120 may indicate a normal value close to the terminal voltage V2 at the battery cell due to the various electrostatic capacitances including that at the capacitor C2, as shown in FIG. 28. Thus, the abnormality cannot be sensed simply based upon the voltage VC2.

Accordingly, the balancing switch 129B through which the discharge current flows via the diagnosis target harness segment L2 in the detection harness 32 is closed. As the balancing switch 129B is set in the closed state, the electrical charge having accumulated in the electrostatic capacitance including the capacitor C2 present between the circuits corresponding to the harness segments L2 and L3 in the detection harness 32 is released, causing a sudden decrease in the voltage VC2 input to the selection circuit 120. If no disconnection has occurred, the electrical current is supplied from the battery cell BC2 and thus, the voltage VC2 input to the input circuit 120 hardly changes.

The terminal voltage at the battery cell BC2 is measured (measurement 1) at the terminal voltage measurement stage for the battery cell BC2 having been described in reference to FIGS. 23 and 24. As explained earlier, the balancing switch 129B remains in the open state during this measurement phase. Since the electrical charge flowing into the electrostatic capacitance including the capacitor C2 present between the circuits of the harness segments L2 and L3 in the detection harness 32 is then accumulated at the electrostatic capacitance, the voltage VC2 input to the input circuit 120 slightly increases. However, the voltage VC2 measured through the measurement 1 is much lower than the normal voltage. The voltage VC2 thus measured is held at the register BC2 in the current value storage circuit 274 shown in FIG. 5.

In the diagnosis for the battery cell BC2 executed in succession following the measurement, diagnosis results indicating an abnormality are obtained via the digital comparator 270 based upon the measurement value read out from the current value storage circuit 274, which indicates an abnormal value equal to or less than the over-discharge threshold value OD in the reference value storage circuit 278. The abnormality diagnosis results are set at the register diagnosis flag in the flag storage circuit 284. The voltage VC2 assumes a value less than the over-discharge threshold value OD in the event of a disconnection. Accordingly, a disconnection threshold value, even smaller than the over-discharge threshold value OD, is set and the digital comparator 270 is engaged in comparison of the measurement value held at the register BC2 in the current value storage circuit 274 with the disconnection threshold value. As a result, the decision with regard to whether or not a disconnection has occurred can be made with ease. By using the value held at the register OCFFO in the reference value storage circuit 278 in FIG. 6 as the disconnection threshold value, the sensing operation for disconnection can be executed at all times.

As shown in FIG. 28, as the balancing switch 129B (BSW2) is set in the open state and then the balancing switches 129A (BSW1) and 129C (BSW3) are set in the closed state, the voltages from the serially connected battery cells BC1 and BC2 are both applied to the capacitor C2, significantly raising the terminal voltage at the capacitor C2. Accordingly, immediately after the measurement 1, the balancing switches 129A (BSW1) and 129C (BSW3) are both closed and the terminal voltage at the battery cell BC2 is measured again (measurement 2). The voltage VC2 measured at this time is bound to indicate a very high value, far exceeding the over-charge threshold value, thereby enabling disconnection detection with ease.

As described above, the measurement results obtained through the measurement 2 are held at the register BC2 in the current value storage circuit 274 shown in FIG. 6. The measurement value held at the register BC2 in the current value storage circuit 274 may be compared at the digital comparator 270 with the disconnection detection threshold value in order to detect a disconnection, or a disconnection diagnosis may instead be executed through software processing executed at the battery controller 20.

Figure 29:
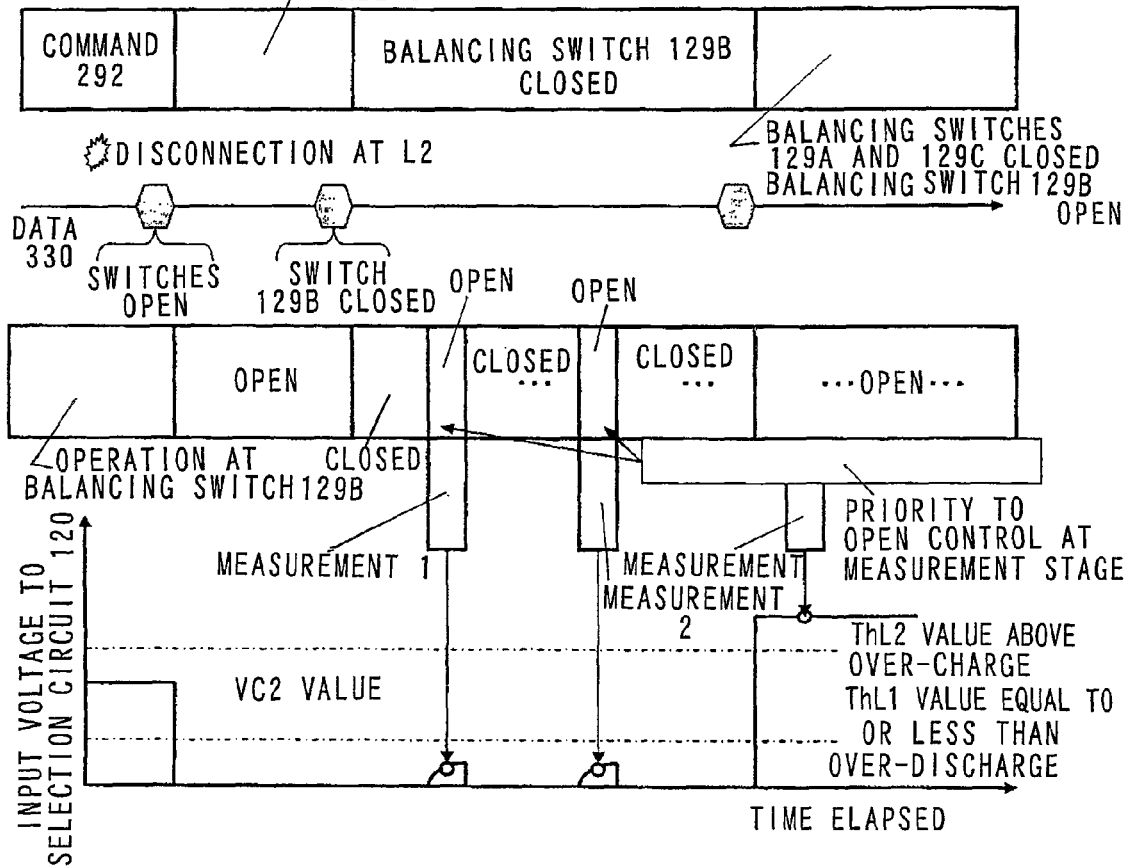
FIG. 29 shows a signal OFF period set via the discharge control circuit to give priority to the balancing switch control.

FIG. 29 illustrates a method for executing the diagnosis in response to a communication command 292 issued from the battery controller 20. The method is described by assuming that a disconnection has occurred at the harness segment L2 in the detection harness 32. A disconnection diagnosis communication command 292 is transmitted with predetermined timing. The communication command 292 indicates a specific diagnosis target integrated circuit and also contains an instruction "open all balancing switches 129." Namely, the data 330 in the communication command 292 indicate "0", i.e., "open." In response to the instruction, the instruction target integrated circuit opens the balancing switches 129.

Next, a close instructions is transmitted to the balancing switch 129B, thereby closing the balancing switch 129B in order to discharge the battery cell connected with the diagnosis target detection harness 32 with predetermined timing. If the harness segment L2 is disconnected, the input signal VC2 provided to the selection circuit 120 will indicate a value close to 0. Subsequently, before an instruction is output from the battery controller 20, the balancing switch 129B enters the open state and the terminal voltage at the battery cell BC2 is measured during the measurement stage, in which the voltage at the battery cell BC2 is measured based upon a stage signal generated in the integrated circuit. If the harness segment L2 is disconnected, the input signal VC2 provided to the selection circuit 120 will indicate a very low voltage, which is then held at the register BC2 in the current value storage circuit 274 shown in FIG. 6.

Since the integrated circuit independently measures the battery cell terminal voltages over short intervals, the balancing switch 129B reenters the open state quickly and the terminal voltage at the battery cell BC2 is measured. If the harness segment L2 is disconnected, the measurement results will indicate a very low value which is then held at the register BC2 in the current value storage circuit 274.

In response to a diagnosis result intake instruction issued from the battery controller 20, the integrated circuit transmits the measurement results held at the register BC2 in the current value storage circuit 274. The battery controller 20, having received the measurement results indicating a value lower than the over-discharge level is able to detect the disconnection. Namely, the measurement results transmitted from the integrated circuit are compared with a threshold value ThL1 in FIG. 29 and if the measurement results indicate a value lower than the threshold value ThL1, the battery controller 20 judges that a disconnectionhas occurred and proceeds to execute preliminary operation before actually cutting off the connection between the DC power source constituted with lithium batteries and the inverter. As soon as the preliminary processing is completed, it opens the relays RLP and RLN.

In order to assure even more reliability, the battery controller 20 transmits an instruction for closing the balancing switches 129A and 129C and opening the balancing switch 129B. In the event of a disconnection, the input voltage VC2 provided to the selection circuit 120 increases greatly if the balancing switches 129 disposed on the two sides of the diagnosis target battery cell. Thus, a voltage value greater than the over-charge threshold value will be measured. The measurement results are then held at the register BC2 in the current value storage circuit 274.

In response to a diagnosis result intake instruction issued from the battery controller 20, the integrated circuit transmits the measurement value to the battery controller 20. The battery controller 20 receives the measurement results, compares the received measurement results with a disconnection detection threshold value ThL2, which is greater than the over-charge threshold value and if the measurement results indicate a value greater than the threshold value ThL2, the battery controller 20 judges that a disconnection has occurred. While accurate disconnection detection is enabled simply by comparing the results obtained through the measurement 1 or the measurement 2 with the threshold value ThL1 or through comparison of the average of the measurement values obtained through the measurement 1 and the measurement 2 with the threshold value ThL1, the accuracy of the disconnection detection is further enhanced by also comparing the measurement results with the threshold value ThL2, as described above.

By adopting the embodiment described above, highly accurate disconnection detection is enabled.

In addition, highly efficient disconnection detection is enabled by using the measurement values obtained through regular battery cell terminal voltage measurement operation.

Furthermore, since the diagnosis is executed by using the existing balancing switches 129 used to control the SOCs, without having to install additional special circuits, the simplicity of the circuit structure is maintained.

Figure 30:
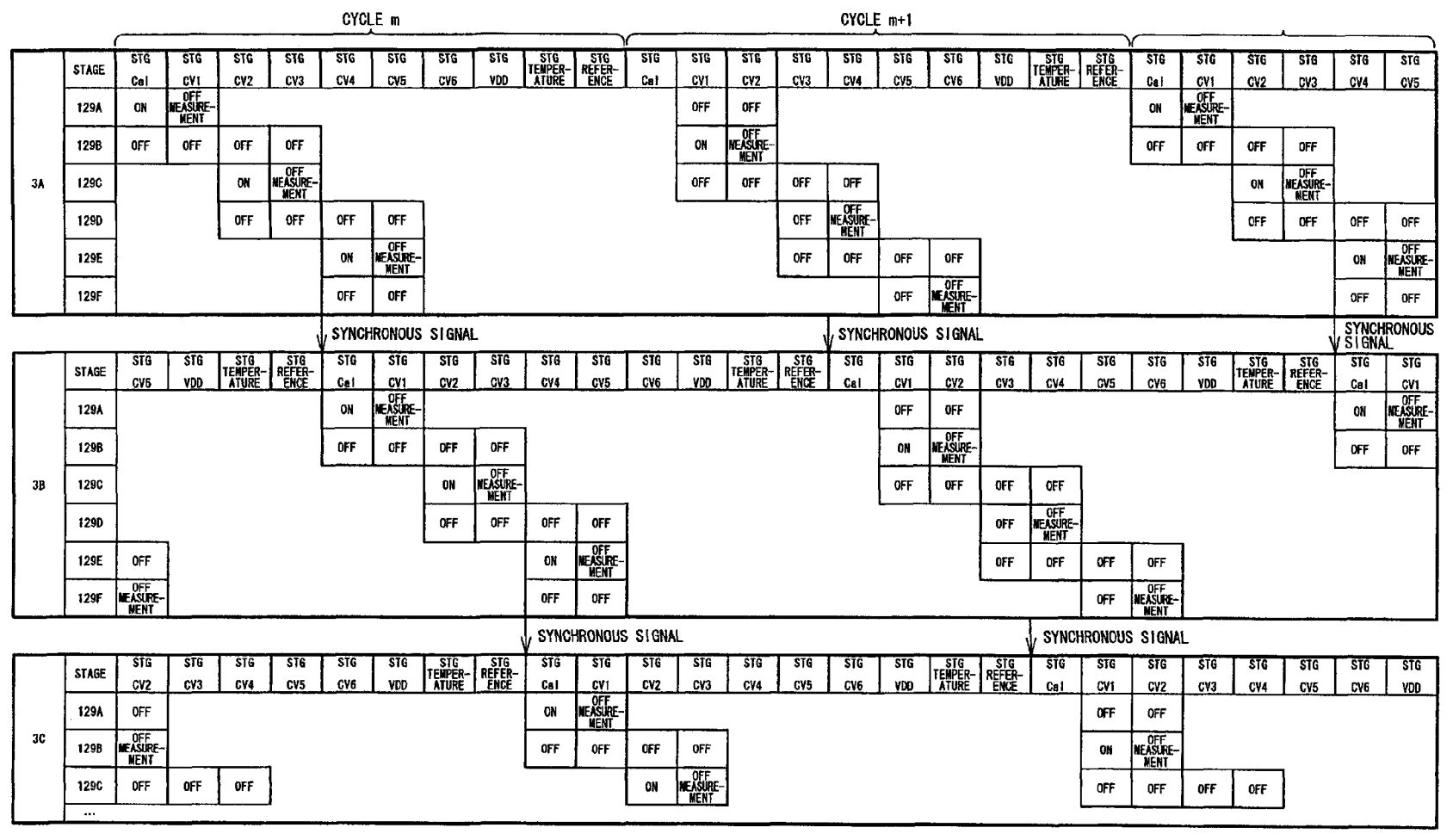
Figure 31:
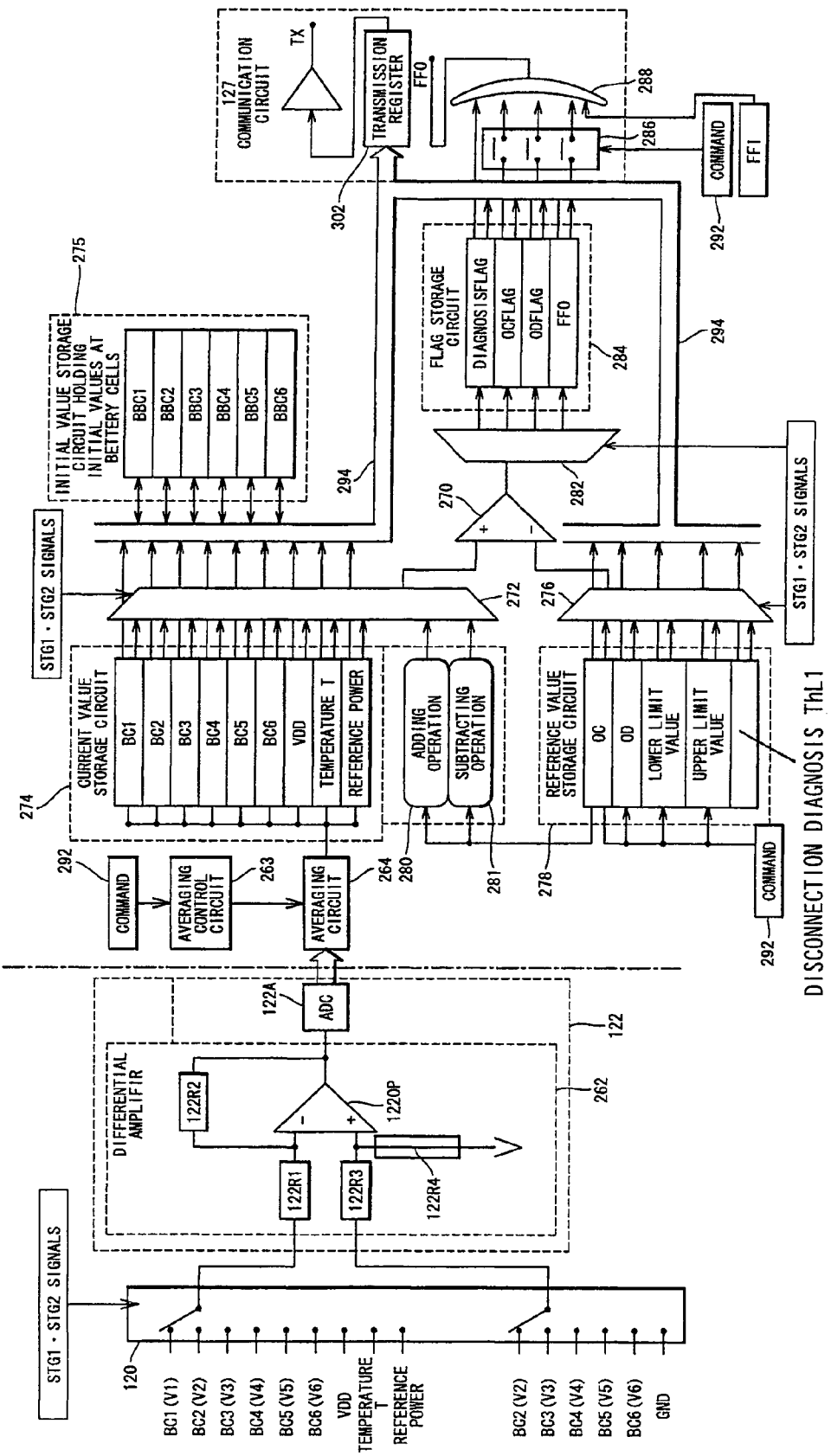
FIG. 31 presents another example of the diagnosis target circuit and the circuit engaged in the diagnosis.
Figure 32:
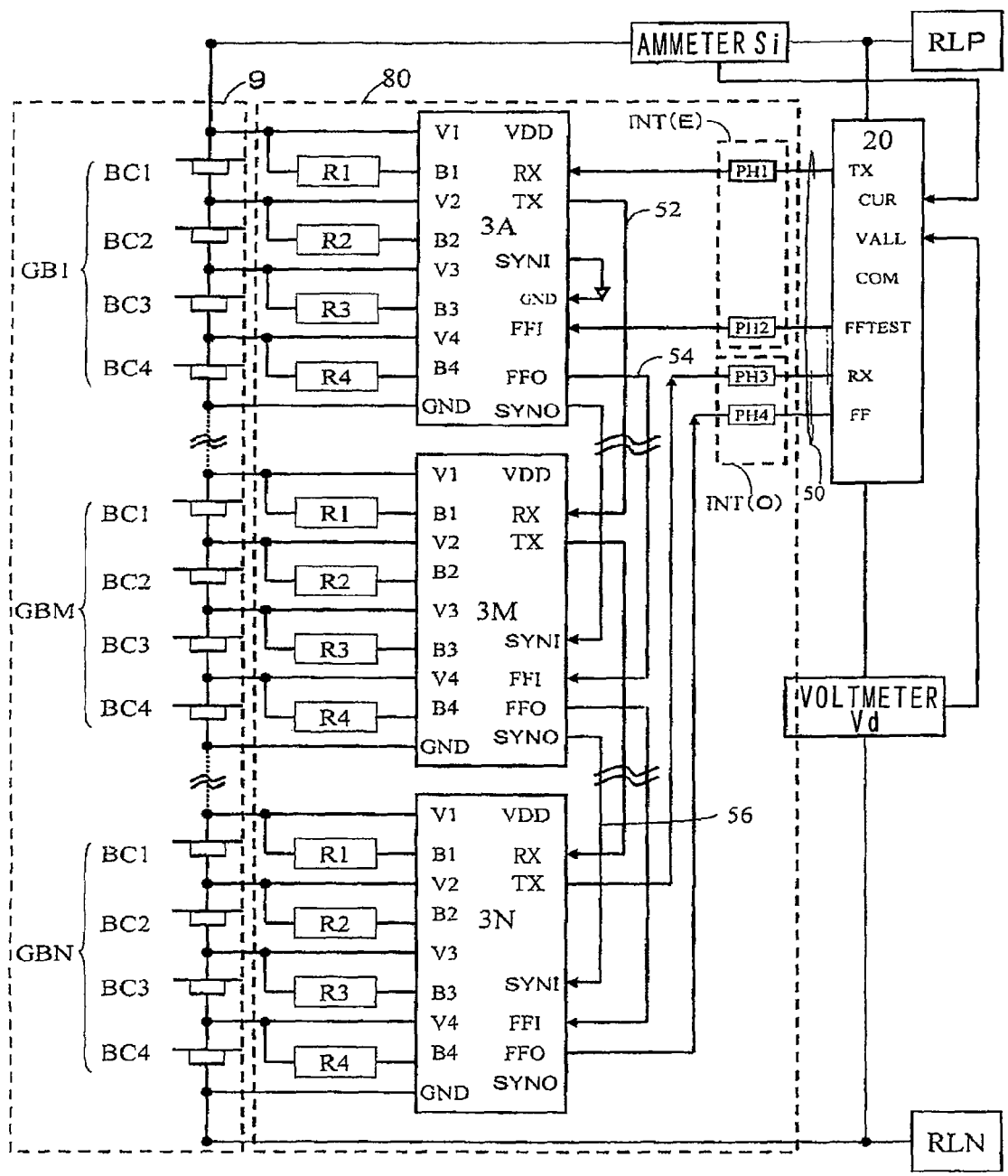
FIG. 32 is a diagram showing the structures adopted in the battery module and the cell controller in the vehicle power supply system achieved in another embodiment of the present invention.

Next, in reference to FIGS. 30–32, a method that may be adopted to enable each integrated circuit to automatically execute a disconnection diagnosis is described. The disconnection diagnosis can be automatically executed by measuring battery cell terminal voltage based upon the stage signal, as shown in FIG. 4. FIG. 30 indicates a specific measurement/diagnosis schedule, whereas FIG. 32 shows a specific circuit structure.

In the upper row in FIG. 30, the measurement and the disconnection diagnosis executed in the integrated circuit 3A in cycle m and cycle m+1 in response to stage signals are indicated. The measurement and the disconnection diagnosis executed in the integrated circuit 3B succeeding the integrated circuit 3A are indicated in the middle row, whereas the measurement and the disconnection diagnosis executed in the integrated circuit 3C succeeding the integrated circuit 3B are indicated in the lower row. The integrated circuits 3B and 3C individually start the stage processing shown in FIG. 4, in response to a synchronous signal provided from the integrated circuit 3A and a synchronous signal provided from the integrated circuit 3B respectively. It is to be noted that during a period marked "ON" in FIG. 30, control for sustaining the corresponding balancing switch 129 in the closed state is underway. During a period marked "OFF", control under for sustaining the balancing switch 129 in the open state is underway. "measurement" indicates a period during which control for the battery cell terminal voltage measurement and the disconnection diagnosis is underway. During any period of time that is not marked as "ON", "OFF" or "measurement", the SOC adjustment control is underway.

At the stage STGCal, the balancing switch 129A is set in the closed state in the integrated circuit 3A. If the detection harness 32 is disconnected, the voltage input to the selection circuit 120 will assume a very small value, with the balancing switch 129A set in the closed state, as has been explained in reference to FIG. 28. As a result, the analog/digital converter 122A in FIG. 31 detects the terminal voltage at the battery cell BC1, measured at the stage STGCV1, indicating an excessively small value. Consequently, the measurement results held at the register BC1 in the current value storage circuit 274 will indicate an extremely small value. It is to be noted that control is executed to sustain the balancing switch 129B, too, in the open state, in order to improve the measurement accuracy in the stage STGCV1.

In the disconnection diagnosis executed following the measurement, the digital comparator 270 compares the measurement value held at the register BC1 in the current value storage circuit 274 with the disconnection diagnosis threshold value ThL1 held in the reference value storage circuit 278. If the measurement value held at the register BC1 is less than the disconnection diagnosis threshold value ThL1, it is judged that an abnormality attributable to a disconnection has occurred and accordingly, the diagnosis flag in the flag storage circuit 284 is set to "1." As has already been explained in reference to FIG. 6, the diagnosis flag setting selected at this time is immediately reported to the battery controller 20. It is to be noted that the basic operation executed in the circuit shown in FIG. 31 is similar to that having been described in reference to FIG. 6 and the like.

Unless an abnormality such as a disconnection exists, the terminal voltage at the battery cell BC1 measured at the stage STGCV1 indicates a normal value and, accordingly, no abnormality is detected through the diagnosis executed via the digital comparator 270. In cycle m in FIG. 30, the terminal voltage measurement and the diagnosis are executed only for the odd-numbered battery cells. Following the terminal voltage measurement and the diagnosis for the battery cell BC1, the terminal voltage measurement and the disconnection diagnosis are executed for the battery cell BC3. At the stage STGCV2, the balancing switch 129C corresponding to the battery cell BC3 is first closed and then the balancing switch 129C is set back into the open state at the stage STGCV3 to measure the terminal voltage at the battery cell BC3. The digital comparator 270 shown in FIG. 31 executes the disconnection diagnosis as has been explained earlier. In order to improve the accuracy with which the terminal voltage at the battery cell BC3 is detected and the disconnection diagnosis for the battery cell BC3 is executed at the stage STGCV3, the balancing switches 129B and 129D disposed on the two sides of the balancing switch 129C are sustained in the open state as has been explained in reference to FIG. 30.

Likewise, the balancing switches 129D and 129F are sustained in the open state at the stage STGCV5, in order to measure the terminal voltage at the battery cell BC3 and execute the disconnection diagnosis for the battery cell BC3. The measurement and the diagnosis are executed for the odd-numbered battery cells BC1, BC3 and BC5 as described above. The measurement and the diagnosis for the even-numbered battery cells BC2, BC4 and BC6 are executed in a similar manner in the next cycle m+1. In short, in the operation executed as indicated in the schedule presented in FIG. 30, the measurement and the diagnosis for the odd-numbered battery cells and the even-numbered battery cells are executed in different stage cycles.

When executing the measurement and the diagnosis for the battery cell BC1 at the stage STGCV1 in the integrated circuit 3B, the balancing switch 129F in the preceding integrated circuit 3A must be sustained in the open state. Accordingly, a synchronous signal is transmitted from the integrated circuit 3A to the integrated circuit 3B which then generates a stage signal in synchronization with the synchronous signal from the integrated circuit 3A. In the embodiment, the integrated circuit 3B, having received the synchronous signal from the integrated circuit 3A, starts generating the first stage signal STGCal.

One of the two adjacent integrated circuits transmits a synchronous signal to the other integrated circuit over a predetermined cycle and the other integrated circuit, having received the synchronous signal, starts generating a specific stage signal. As a result, while the measurement for the battery cell in the preceding integrated circuit, i.e., the measurement for the battery cell BC6 corresponding to the integrated circuit 3A, is underway, the balancing switch 129A corresponding to the battery cell BC1 in the succeeding integrated circuit 3B is sustained in the open state. In addition, while the measurement for the battery cell BC1 in the succeeding integrated circuit 3B is underway, the balancing switch 129F corresponding to the battery cell BC6 in the preceding integrated circuit 3A is sustained in the open state.

FIG. 30 indicates that an operation similar to that described above is executed in the integrated circuits 3B and 3C and a synchronous signal is transmitted from the integrated circuit 3B to the integrated circuit 3C as the integrated circuit 3B executes the operation at a specific stage. This structure assures that accurate measurement and accurate diagnosis are executed by sustaining the balancing switches 129, corresponding to the battery cells on the two sides of the measurement target battery cell, connected in series with the measurement target battery cell, in the open state.

While the circuit shown in FIG. 32 is similar to the circuit shown in FIG. 1, it further includes a transmission path 56 through which a synchronous signal is transmitted. Otherwise, the circuit structure adopted therein and the operation executed therein are similar to those described in reference to FIG. 1. As shown in FIG. 32, a synchronous signal is transmitted from a synchronous signal output end SYNO of the integrated circuit 3A to a synchronous signal input end SYNI of the integrated circuit 3B. Likewise, a synchronous signal is transmitted from a synchronous signal output end SYNO of the integrated circuit 3M–1 to a synchronous signal input end SYNI of the integrated circuit 3M and so forth. Finally a synchronous signal is transmitted from the synchronous signal output end SYNO of the integrated circuit 3N–1 to a synchronous signal input end SYNI of the integrated circuit 3N.

While the synchronous signal is transmitted from an integrated circuit assuming a higher potential to the next integrated circuit assuming a lower potential in the circuits shown in FIGS. 30 and 32, this is simply an example and the synchronous signal may instead be transmitted from an integrated circuit with a lower potential to the next integrated circuit with a higher potential, as long as stage signals are generated in synchronization with each other within the integrated circuits disposed next to each other.

The disconnection diagnosis can be executed with ease via the balancing switches 129 as described above.

The embodiments described above may be adopted by themselves or in combination. The advantages of the individual embodiments may be realized independently of one another or synergistically through combination thereof. In addition, the present invention may be embodied in any way other than those described in reference to the embodiments, as long as the features characterizing the present invention remain intact.

What is claimed is:

1. A vehicle power supply system, comprising:
   a battery module that is constituted with a plurality of serially connected battery cell groups each including a plurality of serially connected battery cells;
   a plurality of battery cell control devices each disposed in correspondence to the plurality of battery cell groups; and
   a signal transmission path through which signals that are input to or output from the plurality of battery cell control devices are transmitted, wherein:
   each of the plurality of battery cell control devices comprises a voltage measurement circuit, an abnormality diagnosis circuit, a timing control circuit and a communication circuit, wherein each of the battery cell control devices is programmed to control the:
   voltage measurement circuit to measure terminal voltages at the individual battery cells in the corresponding battery cell group;
   abnormality diagnosis circuit to diagnose an abnormality of the voltage measurement circuit;
   timing control circuit to output a signal for instructing measurement phase during which the terminal voltage is measured, and, in synchronization with output of the measurement phase instruction signal, to output a signal for instructing diagnosis phase during which an abnormality diagnosis of the voltage measurement circuit is executed by the abnormality diagnosis circuit;
   communication circuit to output a signal indicating the terminal voltage measured by the voltage measurement circuit and a signal based upon a diagnosis result by the abnormality diagnosis circuit, to the signal transmission path, and wherein:
   based on the outputs of the timing control circuit, the abnormality diagnosis circuit diagnoses an abnormality of the voltage measurement circuit in synchronization with the terminal voltage measurement.

2. A vehicle power supply system according to claim 1, wherein:
   the voltage measurement circuit is controlled such that:
   a selection circuit selects a terminal voltage of measurement target from the terminal voltages at the individual battery cells; and
   a conversion circuit converts an analog value of the terminal voltage having been selected by the selection circuit to a digital value, and wherein:
   the abnormality diagnosis circuit diagnoses a selection operation by the selection circuit in synchronization with the terminal voltage measurement based upon the diagnosis phase instruction signal.

3. A vehicle power supply system according to claim 2, wherein:
   the timing control circuit is controlled such that the timing control circuit outputs the signal for instructing the measurement phase for each of the battery cells, and, in synchronization with output of the measurement phase instruction signal, outputs a signal for instructing diagnosis phase for diagnosis of selection operation by the selection circuit.

4. A vehicle power supply system according to claim 2, wherein:
   the signal transmission path comprises at least a first signal transmission path and a second signal transmission path independently;
   the signal indicating the terminal voltage is transmitted through the first signal transmission path; and
   the signal based upon the diagnosis result of the selection circuit is transmitted through the second signal transmission path.

5. A vehicle power supply system according to claim 4, wherein:
   the signal based upon the diagnosis result transmitted through the second signal transmission path is a one-bit signal.

6. A vehicle power supply system according to claim 1, wherein:
   each of the plurality of battery cell control devices comprises a comparator circuit, a diagnosis result output circuit, and a comparison value generating circuit and a communication circuit, wherein each of the plurality of battery cell control devices is programmed to control the:

comparator circuit to compare a terminal voltage value output from the voltage measurement circuit with voltage threshold values used for diagnosis of over-charge/over-discharge of the battery cells;

diagnosis result output circuit to output a signal indicating diagnosis result corresponding to the over-charge/over-discharge if a diagnosis result based upon a comparison result by the comparator circuit indicates the over-charge/over-discharge;

comparison value generating circuit to generate a comparison value which is used for an abnormality diagnosis of the voltage measurement circuit and which is in a known magnitude relationship to a predetermined input value that is input to the comparator circuit; and communication circuit to output a signal indicating the terminal voltage measured by the voltage measurement circuit and an abnormality signal based upon the diagnosis result signal of the diagnosis result output circuit to the signal transmission path, and wherein:

each of the plurality of battery cell control devices is further programmed to compare an input value that is input to the comparator circuit with the comparison value via the comparator circuit, and, if the comparison result is different from the known magnitude relationship, judge that an abnormality has occurred in the voltage measurement circuit and output the diagnosis result signal corresponding to the abnormality of the voltage measurement circuit from the diagnosis result output circuit.

7. A vehicle power supply system according to claim 6, comprising a voltage generating circuit that generates a voltage, wherein:

the vehicle power supply system measures a voltage generated by the voltage generating circuit via the voltage measurement circuit, inputs a measurement value of the generated voltage to the comparator circuit as the input value, and, if the comparison result with the comparison value generated corresponding to the generated voltage is different from the known magnitude relationship, judges that an abnormality has occurred at the voltage measurement circuit and outputs the diagnosis result signal corresponding to the abnormality at the voltage measurement circuit from the diagnosis result output circuit.

8. A vehicle power supply system according to claim 7, wherein:

the signal transmission path comprises at least a first signal transmission path and a second signal transmission path independently;

the signal indicating the terminal voltage is transmitted through the first signal transmission path; and the signal based upon the diagnosis result of the voltage measurement circuit is transmitted through the second signal transmission path.

9. A vehicle power supply system according to claim 8, wherein:

the signal based upon the diagnosis result transmitted through the second signal transmission path is a one-bit signal.

10. A vehicle power supply system according to claim 7, wherein:

a diagnosis of the voltage measurement circuit via the comparator circuit includes a diagnosis of the voltage generating circuit.

11. A vehicle power supply system according to claim 6, wherein:

the vehicle power supply system uses one of the voltage threshold values for diagnosis of the over-charge/over-discharge as the input value, uses a value that is obtained by increasing or decreasing the one of the voltage threshold values as the comparison value, inputs both values to the comparator circuit for comparison, and, if the comparison result is different from the known magnitude relationship, judges that an abnormality has occurred at the comparator circuit and outputs the diagnosis result signal corresponding to the abnormality at the comparator circuit from the diagnosis result output circuit.

12. A vehicle power supply system according to claim 11, wherein:

the signal transmission path comprises at least a first signal transmission path and a second signal transmission path independently;

the signal indicating the terminal voltage is transmitted through the first signal transmission path; and the signal based upon the diagnosis result of the comparator circuit is transmitted through the second signal transmission path.

13. A vehicle power supply system according to claim 12, wherein:

the signal based upon the diagnosis result transmitted through the second signal transmission path is a one-bit signal.

14. A vehicle power supply system according to claim 11, comprising a voltage generating circuit that generates a voltage, wherein:

the vehicle power supply system measures a voltage generated by the voltage generating circuit via the voltage measurement circuit, and inputs a measurement value of the generated voltage to the comparator circuit as the input value, and, if the comparison result with the comparison value generated corresponding to the generated voltage is different from the known magnitude relationship, judges that an abnormality has occurred at the voltage measurement circuit and outputs the diagnosis result signal corresponding to the abnormality at the voltage measurement circuit from the diagnosis result output circuit.

15. A vehicle power supply system according to claim 14, wherein:

a diagnosis of the voltage measurement circuit via the comparator circuit includes a diagnosis of the voltage generating circuit.

16. A vehicle power supply system according to claim 1, wherein:

the battery module is a lithium battery module that is constituted with a plurality of serially connected lithium battery groups each including a plurality of serially connected lithium battery cells;

the plurality of battery cell control devices are a plurality of integrated circuits each disposed in correspondence to the plurality of lithium battery groups; and the signal transmission path is a signal transmission path through which signals that are input to or output from the plurality of integrated circuits are transmitted, further wherein:

each of the plurality of integrated circuits comprises a voltage measurement circuit, a digital comparator circuit, a communication circuit, a voltage generating circuit and a digital generating circuit, wherein each of the plurality of integrated circuits is programmed to control the:

voltage measurement circuit including a selection circuit to select a terminal voltage of measurement target from terminal voltages at individual lithium battery cells in a corresponding lithium battery group and an analog/digital converter that converts the terminal voltage having been output from the selection circuit from an analog value to a digital value;

digital comparator circuit to compare the digital value indicating the terminal voltage that has been output from the analog/digital converter with voltage threshold values used for diagnosis of over-charge/over-discharge;

communication circuit to transmit an abnormality signal indicating an abnormality of the voltage measurement circuit through the signal transmission path based upon a comparison result by the digital comparator circuit;

voltage generating circuit to generate a predetermined voltage; and digital generating circuit to generate a digital value which is in a known magnitude relationship to the predetermined voltage, and wherein:

each of the plurality of integrated circuits is further programmed to select the predetermined voltage generated by the voltage generating circuit via the selection circuit, convert the predetermined voltage from an analog value to a digital value via the analog/digital converter, compare the digital value that has been output from the analog/digital converter with the digital value that has been output from the digital generating circuit via the digital comparator circuit, and, if the comparison result is different from the known magnitude relationship, transmit the abnormality signal from the communication circuit to the signal transmission path.

17. A vehicle power supply system according to claim 16, wherein:

a diagnosis of the voltage measurement circuit via the digital comparator circuit includes a diagnosis of the voltage generating circuit.

18. A vehicle power supply system according to claim 16, wherein:

each of the plurality of integrated circuits is further programmed to compare one of the voltage threshold values used for the diagnosis of over-charge/over-discharge as the input value and a comparison value that is obtained by increasing or decreasing the one of the voltage threshold values and that is in a known magnitude relationship, and, if the comparison result is different from the known magnitude relationship where the one of the voltage threshold values is increased or decreased, transmits the abnormality signal indicating an abnormality of the digital comparator circuit from the communication circuit to the signal transmission path.

19. A vehicle power supply system according to claim 1, wherein:

the battery module is a lithium battery module that is constituted with a plurality of serially connected lithium battery groups each including a plurality of serially connected lithium battery cells;

the plurality of battery cell control devices are a plurality of integrated circuits each of which is disposed in correspondence to the plurality of lithium battery groups and in each of which a plurality of circuits are integrated including a voltage measurement circuit provided with a selection circuit and an analog/digital converter, a communication circuit, a diagnosis circuit, and a voltage generating circuit; and the signal transmission path is a signal transmission path through which signals that are input to or output from the plurality of integrated circuits are transmitted, and further wherein:

each of the plurality of integrated circuits is programmed to select via the selection circuit a terminal voltage from terminal voltages input from individual lithium battery cells in a corresponding lithium battery group, convert an analog value of the selected terminal voltage to a digital value via the analog/digital converter, and transmit the converted digital value of the terminal voltage from the communication circuit to the signal transmission path; and each of the plurality of integrated circuits is further programmed to select via the selection circuit a predetermined voltage output from the voltage generating circuit, convert an analog value of the selected predetermined voltage to a digital value via the analog/digital converter, diagnose whether or not an abnormality has occurred in the voltage measurement circuit via the diagnosis circuit based upon the converted digital value of the predetermined voltage, and, if the diagnosis result indicates an abnormal state, transmit a signal indicating an abnormality of the voltage measurement circuit from the communication circuit to the signal transmission path.

20. A vehicle power supply system according to claim 19, wherein:

the integrated circuits each comprise a stage circuit that controls a timing of circuit operations;

the selection circuit operates based upon an output from the stage circuit; and the diagnosis circuit operates at a predetermined cycle based upon an output from the stage circuit.

21. A vehicle power supply system according to claim 19, wherein:

a diagnosis of the voltage measurement circuit includes a diagnosis of the voltage generating circuit.

22. A vehicle power supply system according to claim 19, wherein:

each of the plurality of integrated circuits further includes a digital comparator circuit that compares the digital value indicating the terminal voltage with voltage threshold values used for diagnosis of over-charge/over-discharge; and, each of the plurality of integrated circuits is further programmed to compare one of the voltage threshold values used for the diagnosis of over-charge/over-discharge as the input value and a comparison value that is obtained by increasing or decreasing the one of the voltage threshold values and that is in a known magnitude relationship, and, based on this comparison result, diagnoses presence or absence of abnormality in the digital comparator circuit via the diagnosis circuit, and, if an abnormality is present, transmits a signal indicating an abnormality of the digital comparator circuit from the communication circuit to the signal transmission path.

23. A vehicle power supply system according to claim 1, comprising wherein:

the battery module is a lithium battery module that is constituted with a plurality of serially connected lithium battery groups each including a plurality of serially connected lithium battery cells;

the plurality of battery cell control devices are a plurality of integrated circuits each of which is disposed in correspondence to the plurality of lithium battery groups and in each of which a plurality of circuits are integrated including a voltage measurement circuit provided with a selection circuit and an analog/digital converter, a serial communication circuit, a one-bit communication circuit, a diagnosis circuit, and a voltage generating circuit; and the signal transmission path is a plurality of signal transmission paths through which signals that are input to or output from the plurality of integrated circuits are transmitted, and wherein:

each of the plurality of integrated circuits is programmed to select via the selection circuit a terminal voltage from terminal voltages input from individual lithium battery cells in a corresponding lithium battery group, convert an analog value of the selected terminal voltage to a digital value via the analog/digital converter, and transmit the converted digital value of the terminal voltage from the serial communication circuit to one of the signal transmission paths; and each of the plurality of integrated circuits is further programmed to select via the selection circuit a predetermined voltage output from the voltage generating circuit, converts an analog value of the selected predetermined voltage to a digital value via the analog/digital converter, diagnose whether or not an abnormality has occurred in the voltage measurement circuit via the diagnosis circuit based upon the converted digital value of the predetermined voltage, and, if the diagnosis result indicates an abnormal state, transmit a one-bit signal indicating an abnormality of the voltage measurement circuit from the one-bit communication circuit to another one of the signal transmission paths.

24. A vehicle power supply system according to claim 22, wherein:

the integrated circuits each comprise a stage circuit that controls a timing of circuit operations;

the selection circuit operates based upon an output from the stage circuit; and the diagnosis circuit operates at a predetermined cycle based upon an output from the stage circuit.

25. A vehicle power supply system according to claim 23, wherein:

a diagnosis of the voltage measurement circuit includes a diagnosis of the voltage generating circuit.

26. A vehicle power supply system according to claim 23, wherein:

each of the plurality of integrated circuits further includes a digital comparator circuit that compares the digital value indicating the terminal voltage with voltage threshold values used for diagnosis of over-charge/over-discharge; and, each of the plurality of integrated circuits is further programmed to compare one of the voltage threshold values used for the diagnosis of over-charge/over-discharge as the input value and a comparison value that is obtained by increasing or decreasing the one of the voltage threshold values and that is in a known magnitude relationship, and, based on this comparison result, diagnoses presence or absence of abnormality in the digital comparator circuit via the diagnosis circuit, and, if an abnormality is present, transmits a signal indicating an abnormality of the digital comparator circuit from the one-bit communication circuit to another one of the signal transmission path.

27. A vehicle power supply system according to claim 1, wherein:

the battery module is a lithium battery module that is constituted with a plurality of serially connected lithium battery groups each including a plurality of serially connected lithium battery cells;

the plurality of battery cell control devices are a plurality of integrated circuits each disposed in correspondence to the plurality of lithium battery groups; and the signal transmission path is a plurality of signal transmission paths through which signals that are input to or output from the plurality of integrated circuits are transmitted, wherein:

each of the plurality of integrated circuits comprises a voltage measurement circuit, a digital comparator circuit, a communication circuit, a voltage generating circuit and a digital generating circuit, wherein each of the plurality of integrated circuits is programmed to control the:

voltage measurement circuit provided with a selection circuit to select a terminal voltage of measurement target from terminal voltages at individual lithium battery cells in a corresponding lithium battery group and an analog/digital converter that converts the terminal voltage having been output from the selection circuit from an analog value to a digital value;

digital comparator circuit to compare the digital value indicating the terminal voltage that has been output from the analog/digital converter with voltage threshold values used for diagnosis of over-charge/over-discharge;

communication circuit to transmit the digital value of the terminal voltage and an abnormality signal indicating an abnormality of the voltage measurement circuit;

voltage generating circuit to generate a predetermined voltage; and digital generating circuit to generate a digital value which is in a known magnitude relationship to the predetermined voltage, and wherein:

the communication circuit includes a serial transmission terminal and a one-bit signal transmission terminal;

the serial transmission terminals are serially connected by electrically connecting a transmission side of a serial transmission terminal at one of the serially connected integrated circuits to a reception side of a serial transmission terminal at another one of the serially connected integrated circuits through one of the signal transmission paths;

the one-bit signal transmission terminals are serially connected by electrically connecting a transmission side of a one-bit signal transmission terminal at one of the serially connected integrated circuits to a reception side of a one-bit signal transmission terminal at another one of the serially connected integrated circuits through another one of the signal transmission paths;

each of the plurality of integrated circuits is programmed to select a predetermined voltage generated by the voltage generating circuit via the selection circuit, convert an analog value of the predetermined voltage to a digital value via the analog/digital converter, compare the digital value that has been output from the analog/digital converter with the digital value that has been output from the digital generating circuit via the digital comparator circuit, and, if the comparison result is different from the known magnitude relationship, transmit the abnormality signal from the communication circuit to another one of the signal transmission paths via the one-bit signal transmission terminal; and the abnormality signal transmitted from one of the plurality of integrated circuits is transmitted to another integrated circuit via the signal transmission path and input to the integrated circuit via a reception side of a one-bit signal transmission terminal of the integrated circuit.

28. A vehicle power supply system according to claim 27, wherein:
a diagnosis of the voltage measurement circuit via the digital comparator circuit includes a diagnosis of the voltage generating circuit.

29. A vehicle power supply system according to claim 24, wherein:
each of the plurality of integrated circuits is further programmed to compare one of the voltage threshold values used for the diagnosis of over-charge/over-discharge as the input value and a comparison value that is obtained by increasing or decreasing the one of the voltage threshold values and that is in a known magnitude relationship, and, if the comparison result is different from the known magnitude relationship where the one of the voltage threshold values is increased or decreased, transmits the abnormality signal indicating an abnormality of the digital comparator circuit from the one-bit communication circuit to another one of the signal transmission path.

30. A vehicle power supply system comprising:
a battery module that is constituted with a plurality of serially connected battery cell groups each including a plurality of serially connected battery cells;
a plurality of battery cell control devices each disposed in correspondence to the plurality of battery cell groups; and
a signal transmission path through which signals that are input to or output from the plurality of battery cell control devices are transmitted, wherein:
each of the plurality of battery cell control devices comprises a voltage measurement circuit, a comparator circuit, a diagnosis result output circuit, a comparison value generating circuit, a communication circuit and a timing control circuit, wherein each of the plurality of battery cell control devices is programmed to control the:
voltage measurement circuit to measure terminal voltages at the individual battery cells in the corresponding battery cell group;
comparator circuit to compare a terminal voltage value output from the voltage measurement circuit with voltage threshold values used for diagnosis of over-charge/over-discharge of the battery cells;
diagnosis result output circuit to output a diagnosis result signal corresponding to the over-charge/over-discharge if a diagnosis result based upon a comparison result by the comparator circuit indicates the over-charge/over-discharge;
comparison value generating circuit to generate a comparison value which is used for an abnormality diagnosis in the battery cell control device and which is in a known magnitude relationship to a predetermined input value that is input to the comparator circuit;
communication circuit to output a signal indicating the terminal voltage measured by the voltage measurement circuit and an abnormality signal based upon the diagnosis result signal to the signal transmission path; and
timing control circuit to output a signal for instructing measurement phase during which the terminal voltage is measured, and, in synchronization with output of the measurement phase instruction signal, to output a signal for instructing diagnosis phase during which an abnormality diagnosis is executed in the battery cell control device, and wherein:
each of the plurality of battery cell control devices is further programmed to execute a first diagnosis for diagnosing an abnormality in the voltage measurement circuit in synchronization with the terminal voltage measurement based upon the diagnosis phase instruction signal and a second diagnosis for diagnosing an abnormality in the battery cell control device based upon whether or not a comparison result of an input value that is input to the comparator circuit with the comparison value via the comparator circuit is different from the known magnitude relationship, and, if there is an abnormality, to output the diagnosis result signal corresponding to the abnormality of the voltage measurement circuit from the diagnosis result output circuit and to output the abnormality signal based upon the output diagnosis result signal from the communication circuit to the signal transmission path.

31. A vehicle power supply system according to claim 30, wherein:
the voltage measurement circuit is controlled such that:
a selection circuit selects a terminal voltage of measurement target from the terminal voltages at the individual battery cells, and
a conversion circuit converts an analog value of the terminal voltage having been selected by the selection circuit to a digital value, and wherein:
the first diagnosis, which is a diagnosis for a selection operation by the selection circuit, is executed in synchronization with the terminal voltage measurement based upon the diagnosis phase instruction signal.

32. A vehicle power supply system according to claim 31, wherein:
the timing control circuit is controlled such that the timing control circuit outputs the signal for instructing the measurement phase for each of the battery cells, and, in synchronization with output of the measurement phase instruction signal, outputs a signal for instructing diagnosis phase for diagnosis of selection operation by the selection circuit.

33. A vehicle power supply system according to claim 31, wherein:
a diagnosis of the voltage measurement circuit by the comparator circuit includes a diagnosis of the voltage generating circuit.

34. A vehicle power supply system according to claim 30, wherein:
the signal transmission path comprises at least a first signal transmission path and a second signal transmission path independently;
the signal indicating the terminal voltage is transmitted through the first signal transmission path; and
the signal based upon results of the first diagnosis and the second diagnosis is transmitted through the second signal transmission path.

35. A vehicle power supply system according to claim 34, wherein:
the signal based upon the diagnosis result transmitted through the second signal transmission path is a one-bit signal.

36. A vehicle power supply system according to claim 30, wherein:
each of the plurality of battery cell control devices is further programmed to execute a third diagnosis based on the measurement phase instruction signal, and, to input one of the voltage threshold values used for the diagnosis of over-charge/over-discharge as the input value and a value that is obtained by increasing or decreasing the one of the voltage threshold values as the comparison value in the known magnitude relationship to the input value into the comparator circuit, and compares the one of the voltage threshold values with the value obtained by increasing or decreasing the one of the voltage threshold values, and, if the comparison result is different from the known magnitude relationship, judges that an abnormality has occurred at the comparator circuit and outputs the diagnosis result signal corresponding to the abnormality at the comparator circuit from the diagnosis result output circuit.

* * * * *